US012029050B2

(12) United States Patent
Or-Bach et al.

(10) Patent No.: US 12,029,050 B2
(45) Date of Patent: Jul. 2, 2024

(54) 3D SEMICONDUCTOR DEVICE, STRUCTURE AND METHODS WITH CONNECTIVITY STRUCTURES

(71) Applicant: Monolithic 3D Inc., Klamath Falls, OR (US)

(72) Inventors: Zvi Or-Bach, Haifa (IL); Jin-Woo Han, San Jose, CA (US); Brian Cronquist, Klamath Falls, OR (US); Eli Lusky, Ramat-Gan (IL)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

(21) Appl. No.: 18/389,769

(22) Filed: Dec. 19, 2023

(65) Prior Publication Data

US 2024/0121968 A1    Apr. 11, 2024

Related U.S. Application Data

(63) Continuation-in-part of application No. 17/947,752, filed on Sep. 19, 2022, now Pat. No. 11,908,839, (Continued)

(51) Int. Cl.
*H10B 80/00* (2023.01)
*H01L 23/00* (2006.01)
*H01L 25/00* (2006.01)
*H01L 25/065* (2023.01)
*H01L 25/18* (2023.01)

(52) U.S. Cl.
CPC ............. *H10B 80/00* (2023.02); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); (Continued)

(58) Field of Classification Search
CPC ......... H10B 80/00; H01L 24/08; H01L 24/80; H01L 25/0657; H01L 25/18; H01L 25/50; H01L 2224/08145; H01L 2224/80895; H01L 2224/80896; H01L 2924/1431; H01L 2924/1434
USPC ......................................................... 257/774
See application file for complete search history.

(56) References Cited

U.S. PATENT DOCUMENTS 11,587,872 B2 *    2/2023    Liaw .................... H10B 10/125

* cited by examiner

*Primary Examiner* — Tu-Tu V Ho
(74) *Attorney, Agent, or Firm* — PatentPC/PowerPatent; Bao Tran

(57) ABSTRACT

A 3D semiconductor device including: a first level including a single crystal layer, and a memory control circuit which includes at least one temperature sensor circuit and first transistors; a first metal layer overlaying the first single crystal layer; a second metal layer overlaying the first metal layer; a third metal layer overlaying the second metal layer; second transistors—which may include a metal gate—disposed atop the third metal layer; third transistors disposed atop the second transistors; a fourth metal layer disposed atop the third transistors; a memory array including wordlines and at least four memory mini arrays (each mini array includes at least four rows by four columns of memory cells), each memory cell includes at least one second transistor or at least one third transistor; and a connection path from fourth metal to third metal, the path includes a via disposed through the memory array.

20 Claims, 26 Drawing Sheets

Related U.S. Application Data which is a continuation-in-part of application No. 16/649,660, filed as application No. PCT/US2018/052332 on Sep. 23, 2018, now Pat. No. 11,502,095.

(60) Provisional application No. 62/733,005, filed on Sep. 18, 2018, provisional application No. 62/726,969, filed on Sep. 4, 2018, provisional application No. 62/713,345, filed on Aug. 1, 2018, provisional application No. 62/696,803, filed on Jul. 11, 2018, provisional application No. 62/689,058, filed on Jun. 23, 2018, provisional application No. 62/681,249, filed on Jun. 6, 2018, provisional application No. 62/651,722, filed on Apr. 3, 2018, provisional application No. 62/645,794, filed on Mar. 20, 2018, provisional application No. 62/562,457, filed on Sep. 24, 2017.

(52) U.S. Cl.
CPC ............ *H01L 2224/80896* (2013.01); *H01L 2924/1431* (2013.01); *H01L 2924/1434* (2013.01)

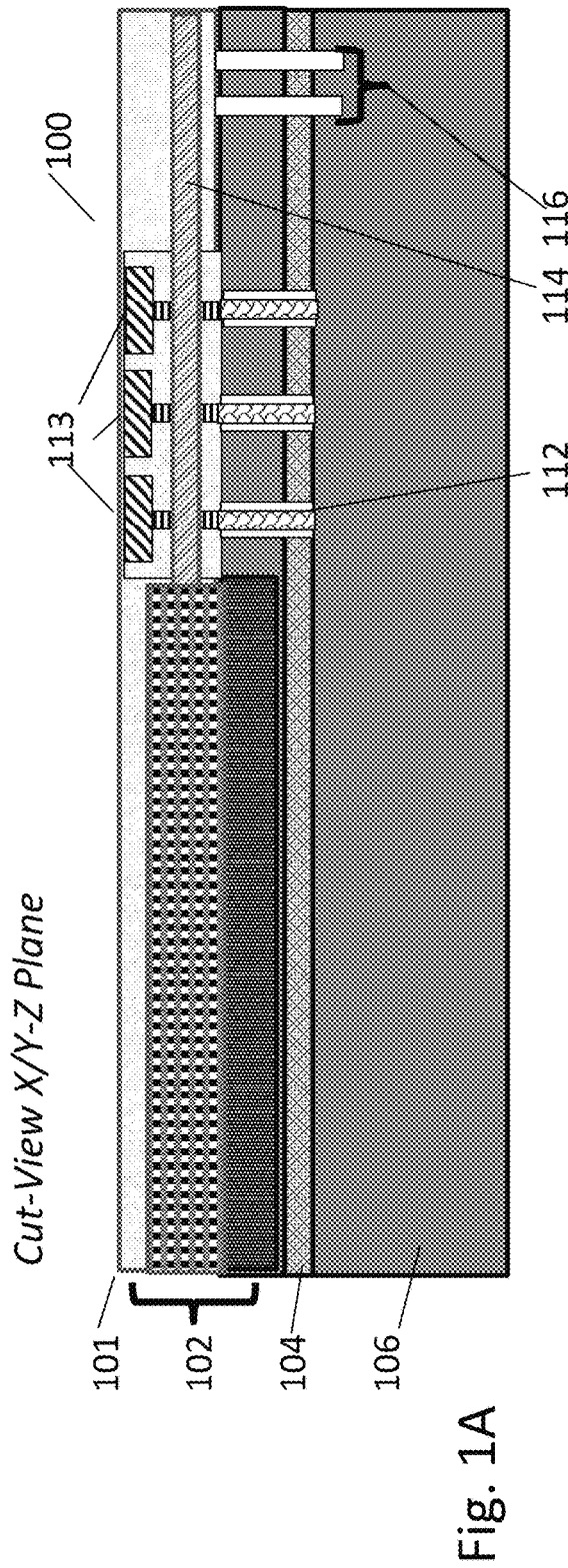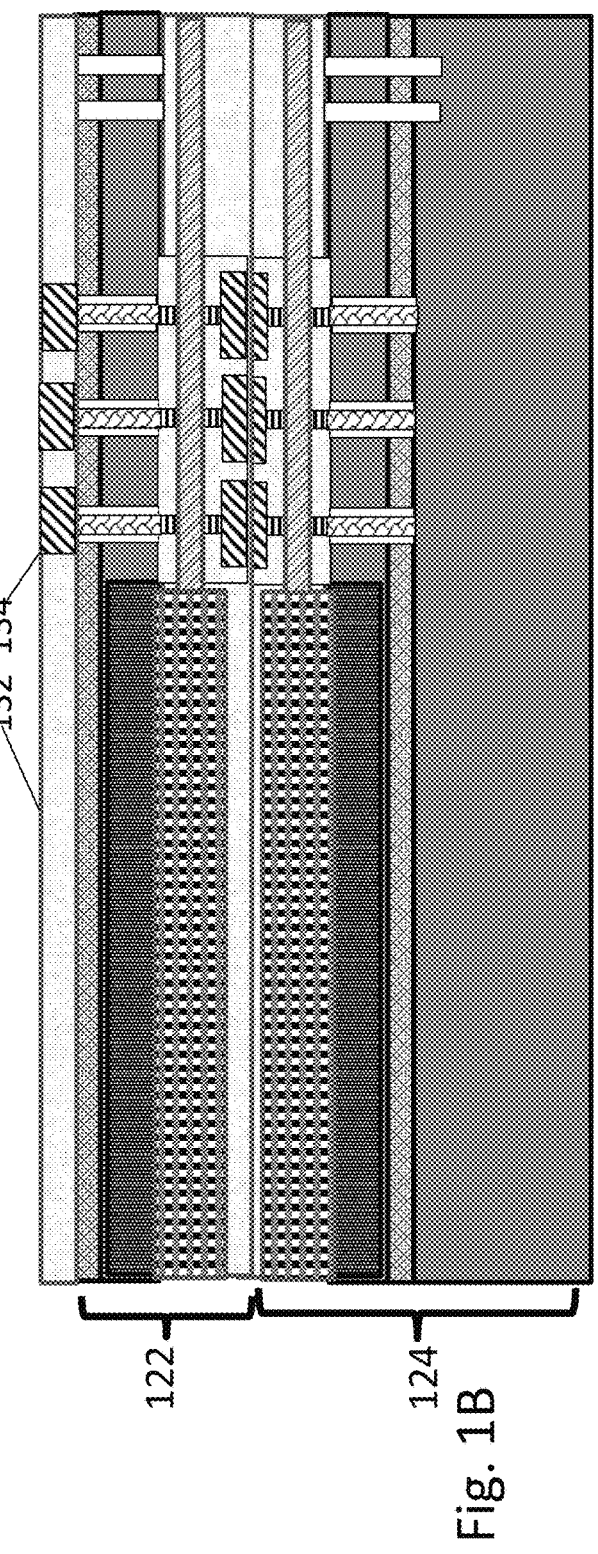
Fig. 1A
Fig. 1B

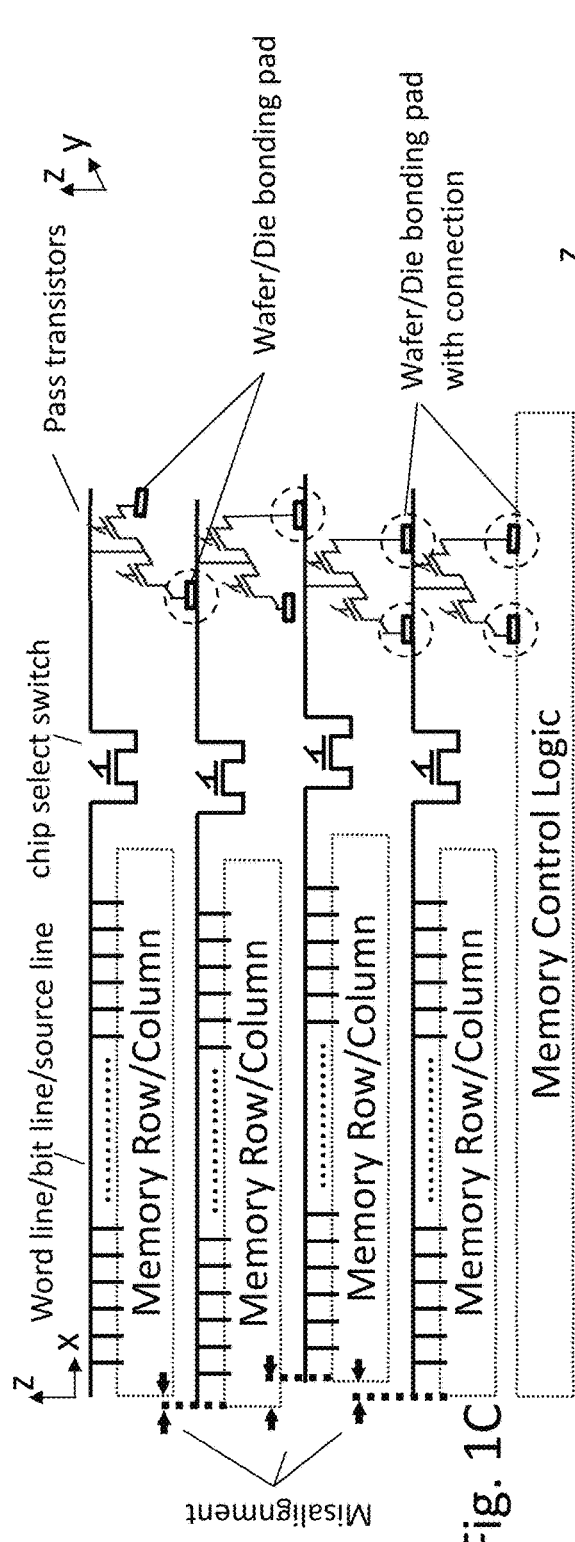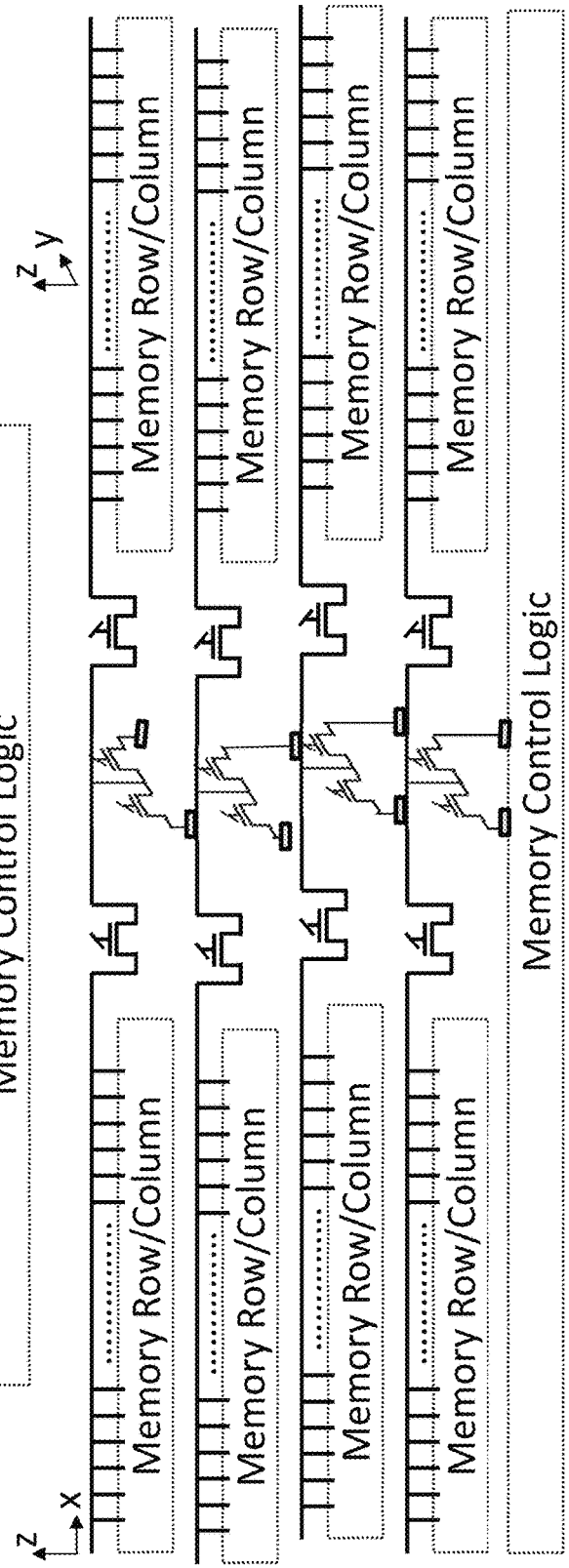

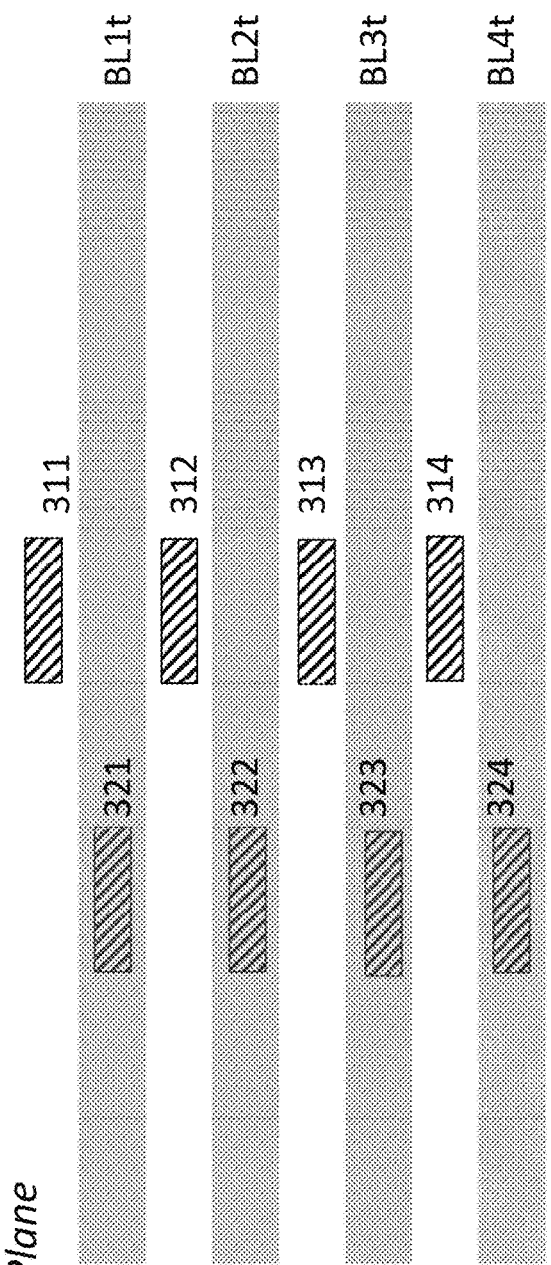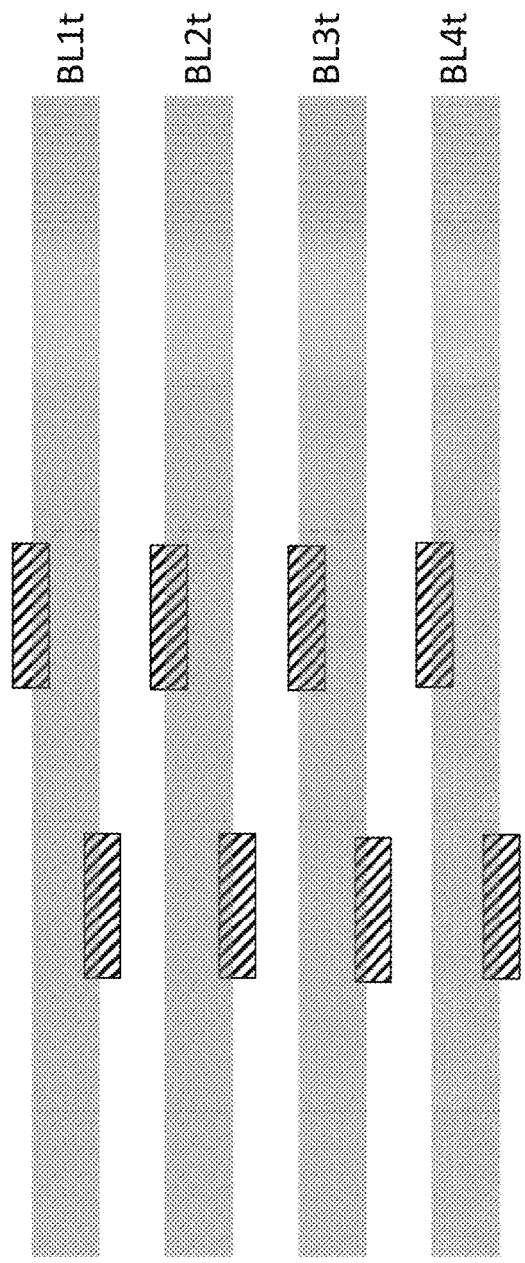

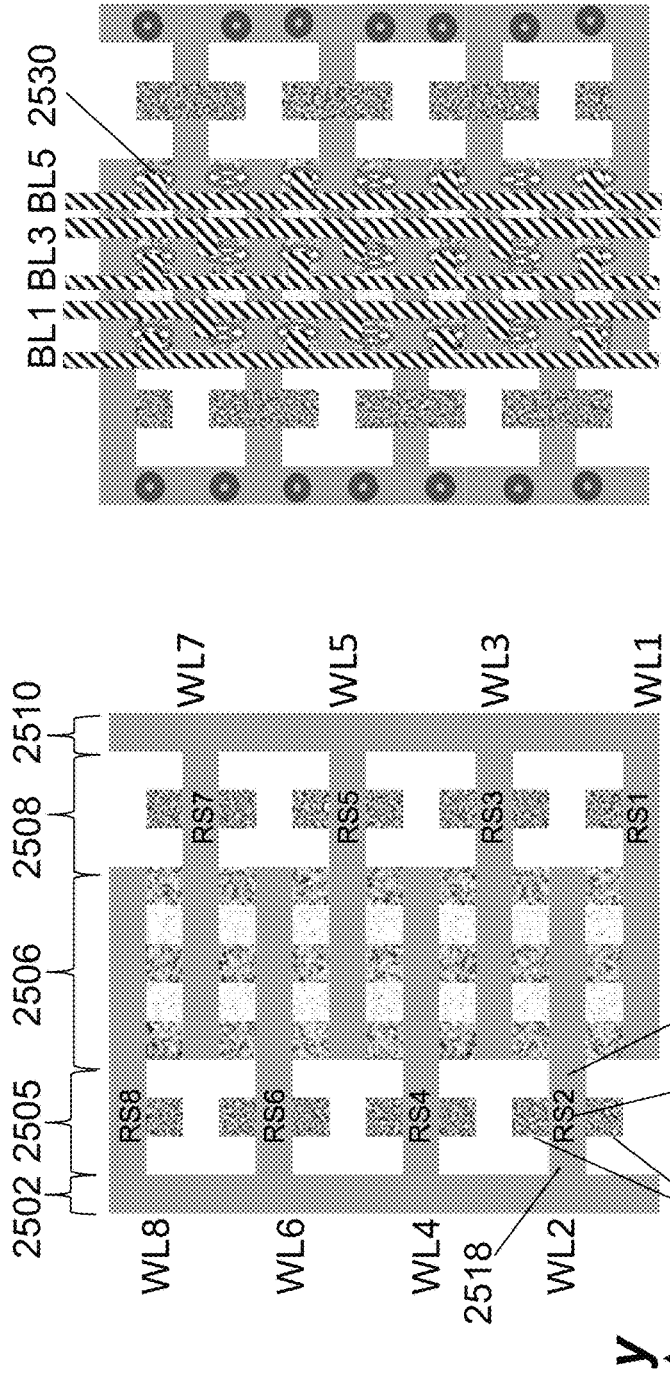
Fig. 9A
Fig. 9B
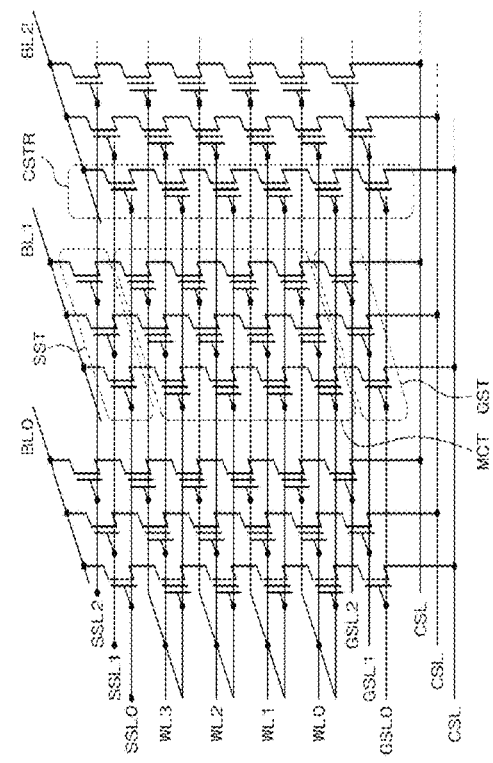
Fig. 10

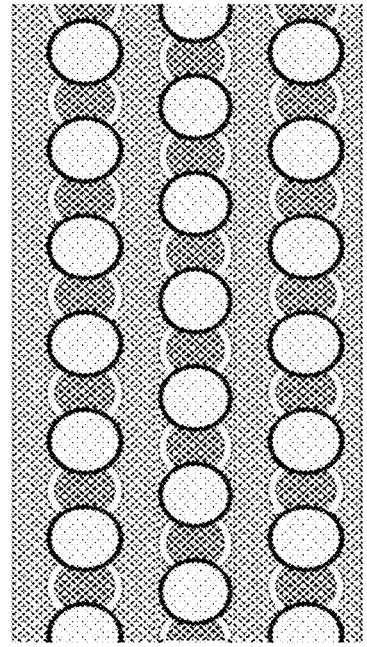
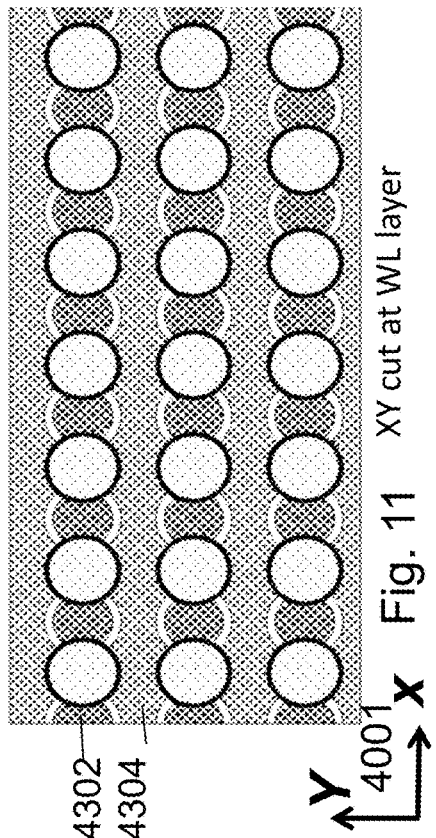
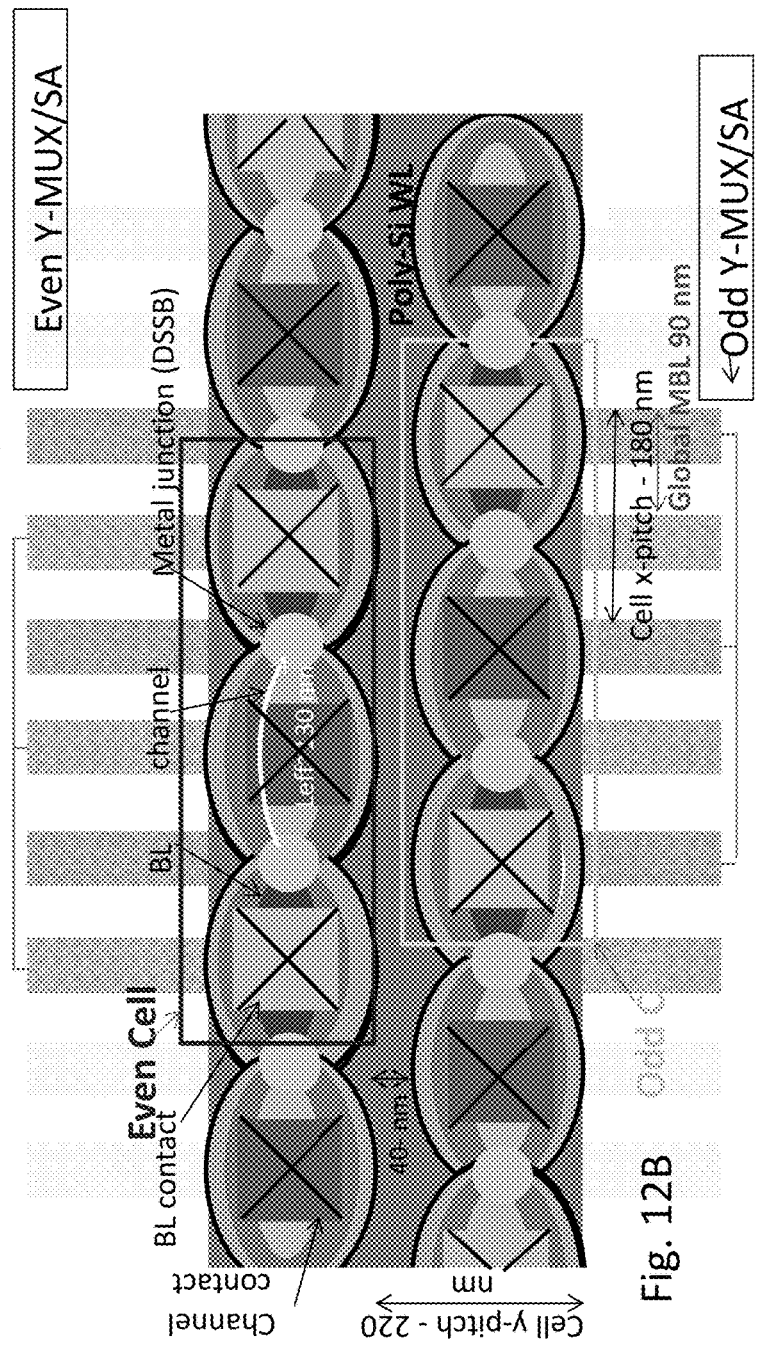

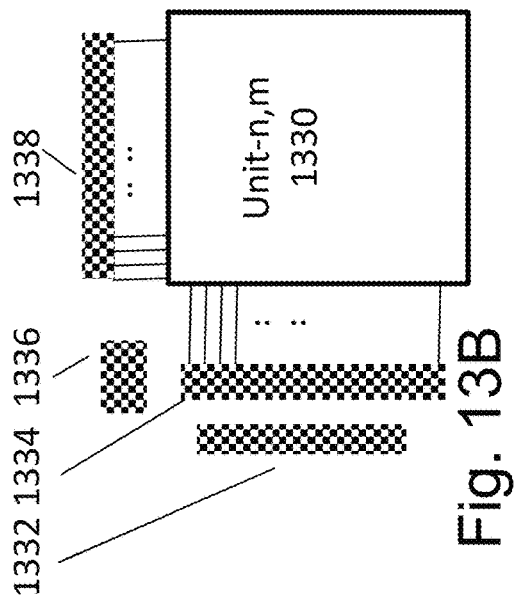
Fig. 13B
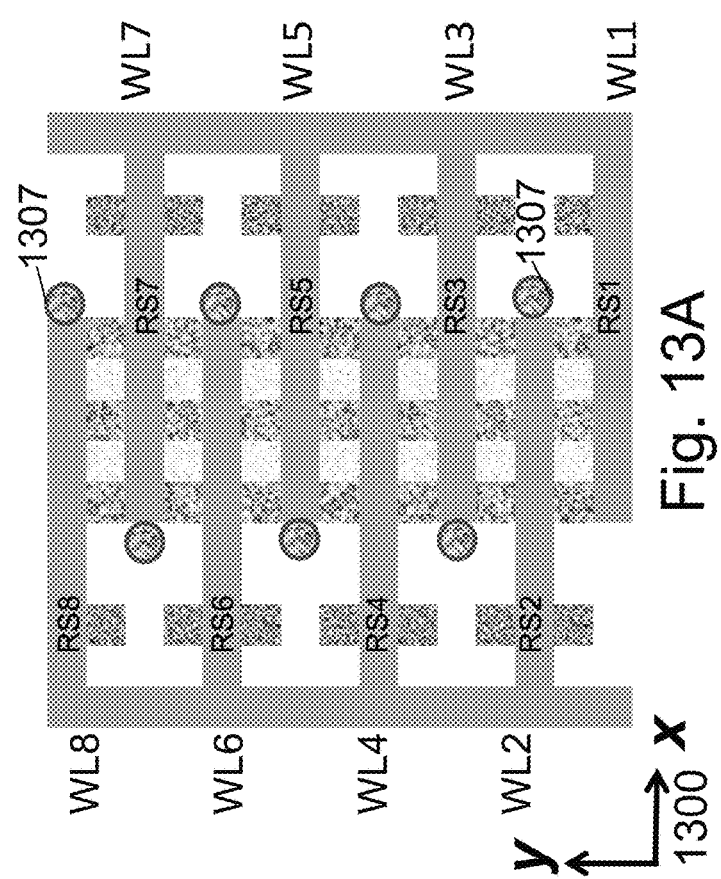
Fig. 13A
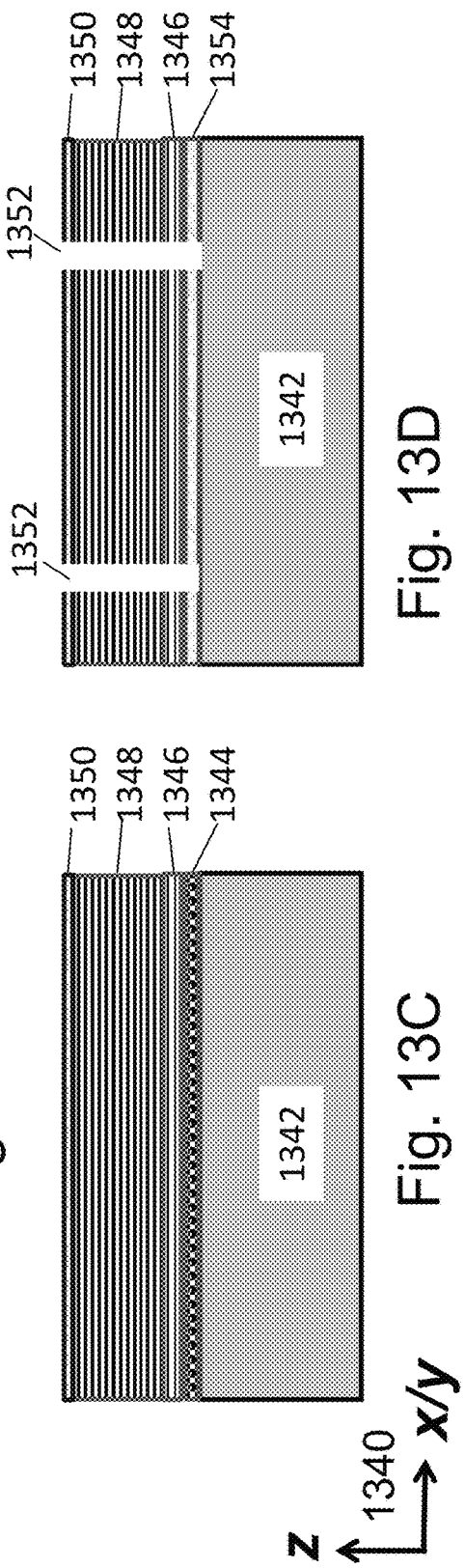
Fig. 13D
Fig. 13C

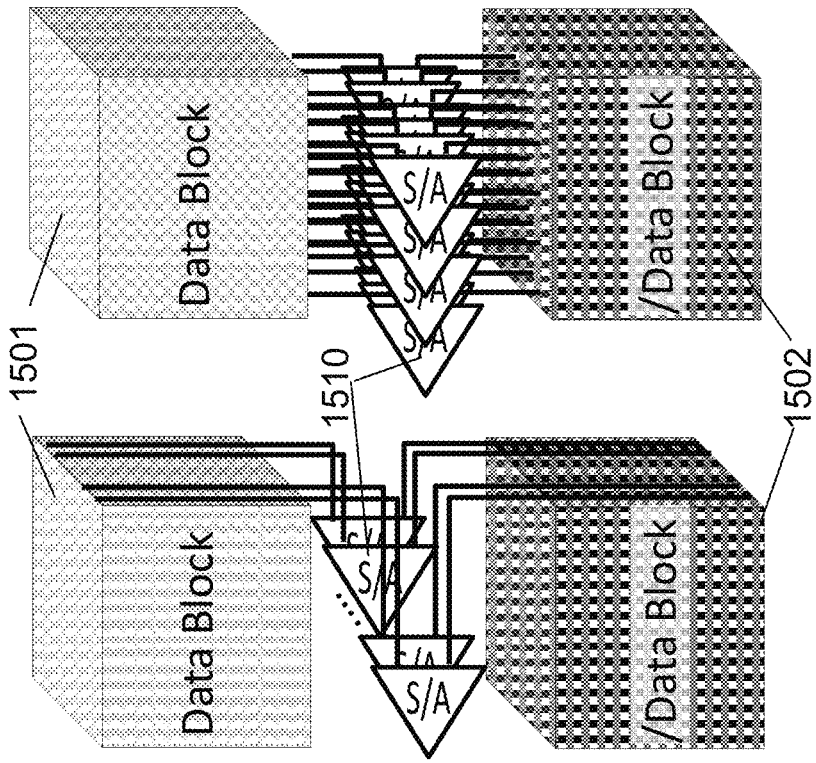
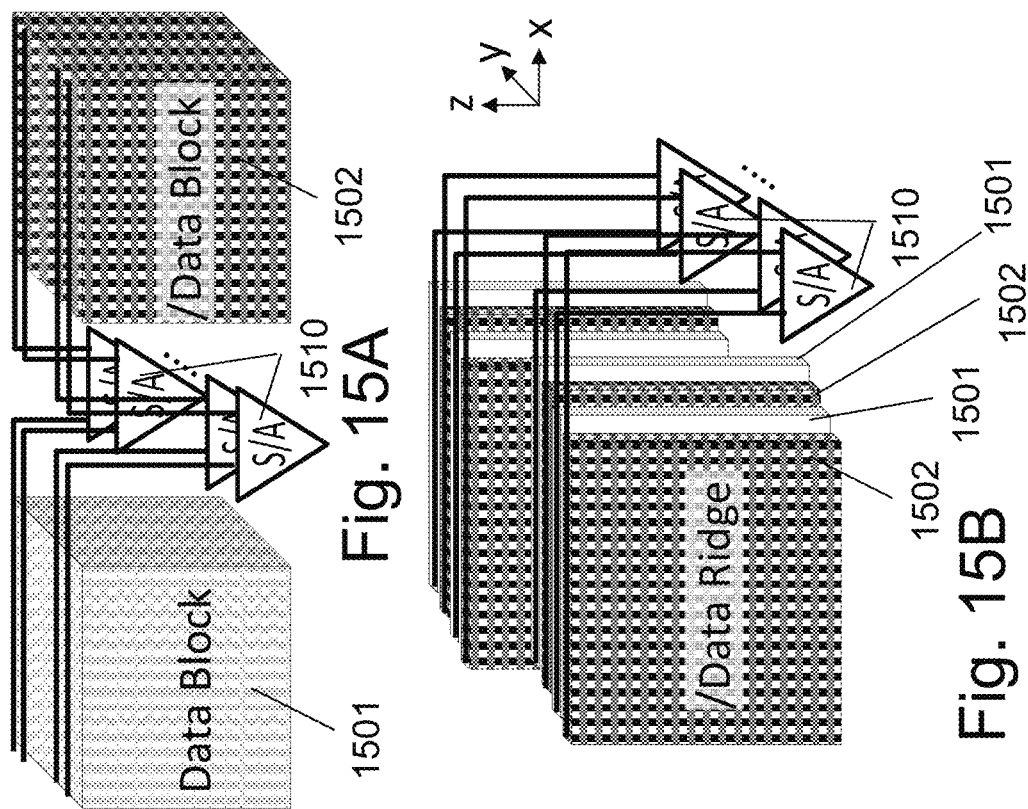
Fig. 15A  Fig. 15B  Fig. 15C  Fig. 15D

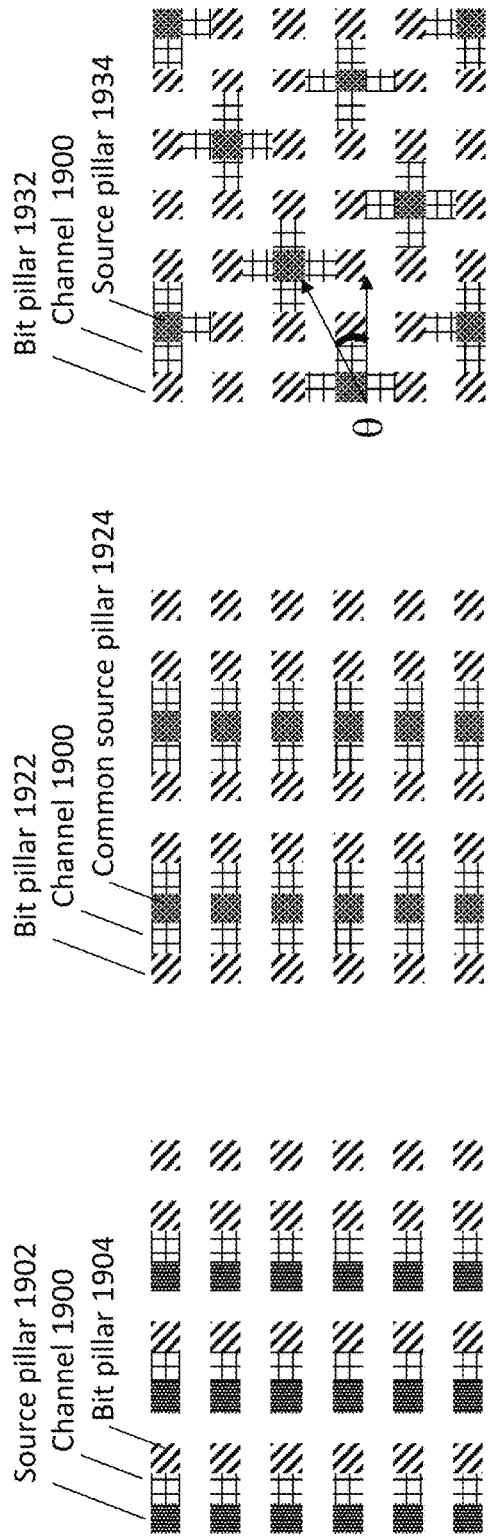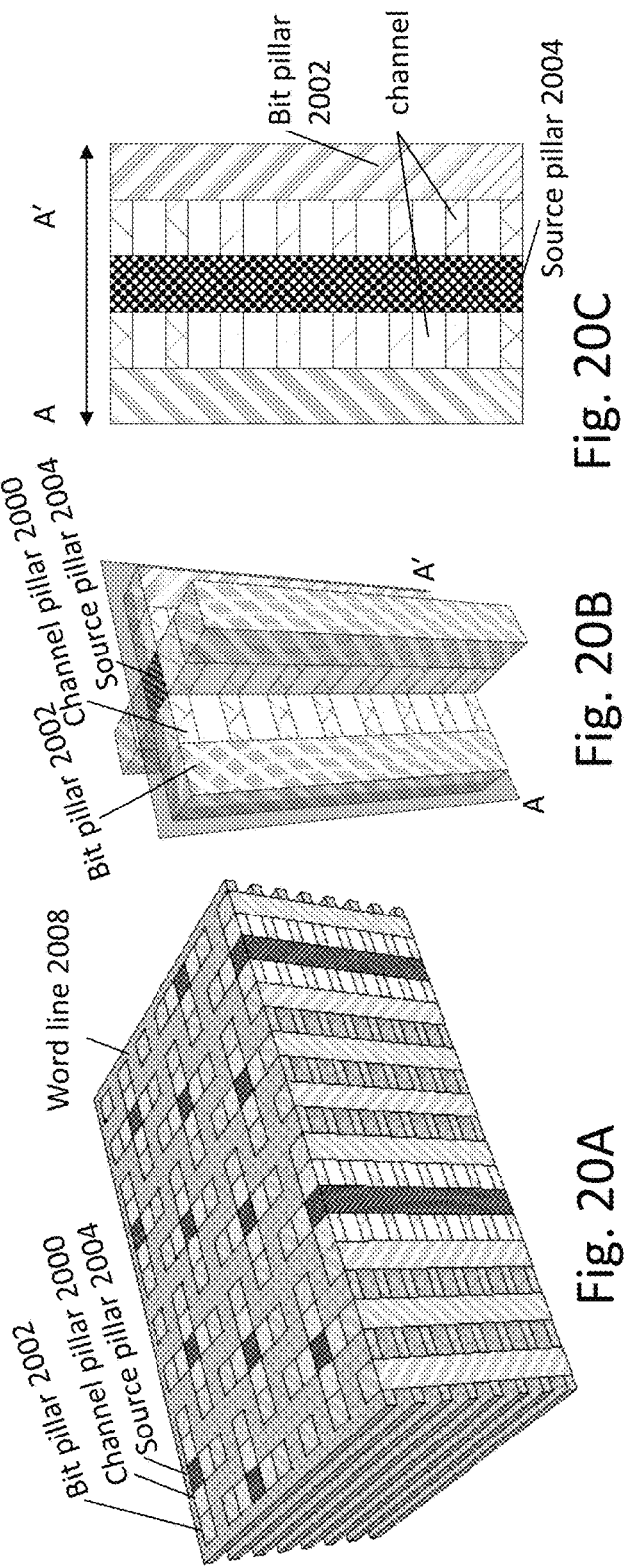

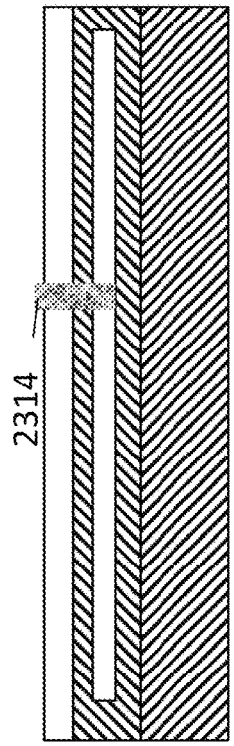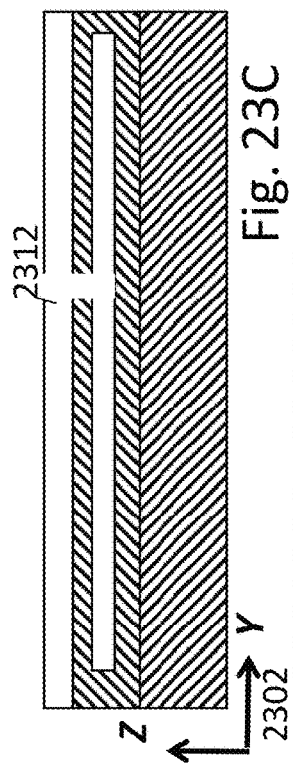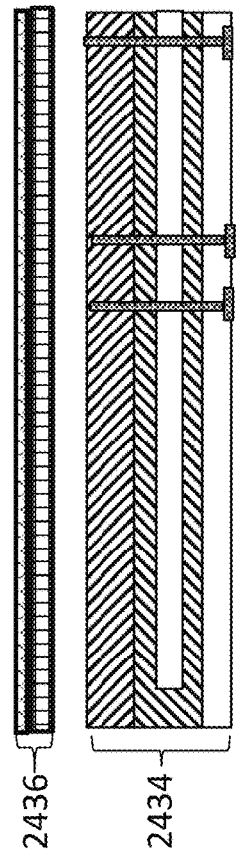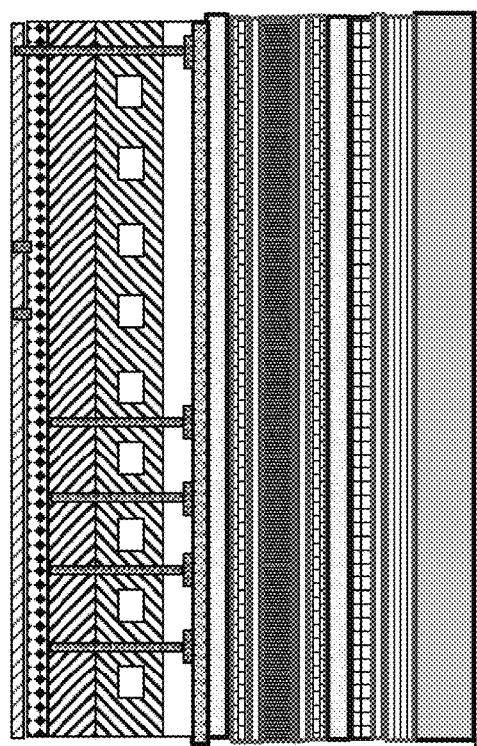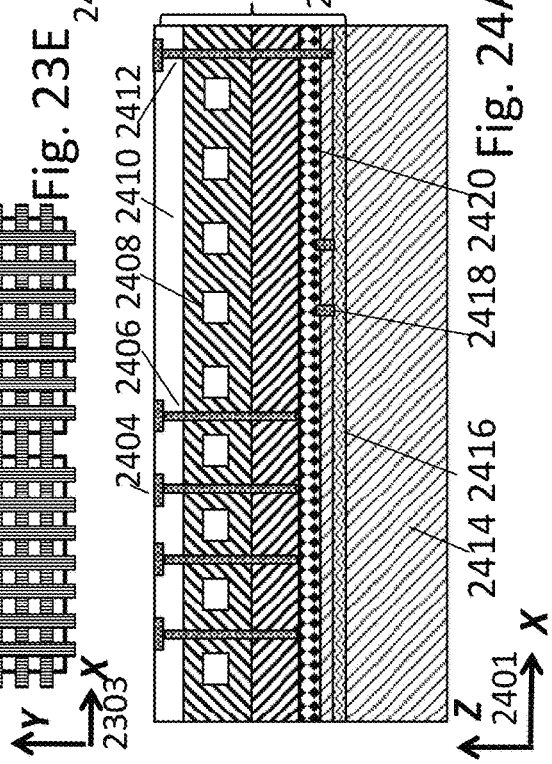

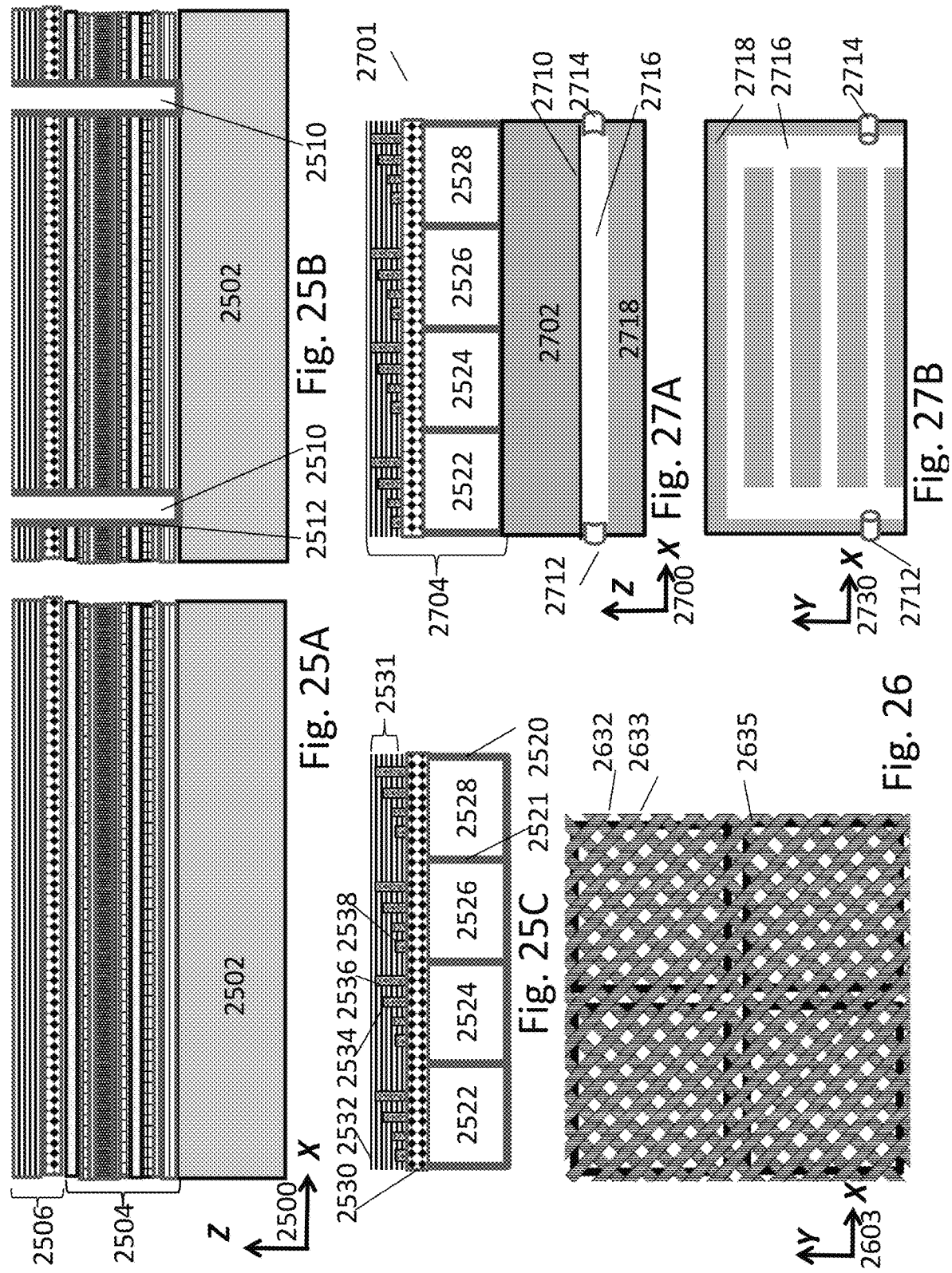

3D SEMICONDUCTOR DEVICE, STRUCTURE AND METHODS WITH CONNECTIVITY STRUCTURES

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) and Three Dimensional Integrated Logic Circuit (3D-Logic) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low, thus reducing power requirements and increasing performance.

There are many techniques to construct 3D stacked integrated circuits or chips including:

Through-silicon via (TSV) technology: Multiple layers of dice are constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,406,670, 9,460,978, 9,509,313, 9,640,531, 9,691,760, 9,711,407, 9,721,927, 9,799,761, 9,871,034, 9,953,870, 9,953,994, 10,014,292, 10,014,318, 10,515,981, 10,892,016, 10,991,675, 11,121,121, 11,502,095, 10,892,016, 11,270,988; and pending U.S. Patent Application Publications and applications, Ser. Nos. 14/642,724, 15/150,395, 15/173,686, 62/651,722; 62/681,249, 62/713,345, 62/770,751, 62/952,222, 62/824,288, 63/075,067, 63/091,307, 63/115,000, 63/220,443, 2021/0242189, 2020/0013791; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), PCT/US2018/52332(WO 2019/060798), PCT/US2021/44110, and PCT/US22/44165. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679,977, 10,943,934, 10,998,374, 11,063,071, and 11,133,344. The entire contents of all of the foregoing patents, publications, and applications are incorporated herein by reference.

Additionally the 3D technology according to some embodiments of the invention may enable some very innovative IC devices alternatives with reduced development costs, novel and simpler process flows, increased yield, and other illustrative benefits.

SUMMARY

The invention relates to multilayer or Three Dimensional Integrated Circuit (3D IC) devices and fabrication methods. An important aspect of 3D ICs is technologies that allow layer transfer. These technologies include technologies that support reuse of the donor wafer, and technologies that support fabrication of active devices on the transferred layer to be transferred with it.

In one aspect, a 3D semiconductor device, the device including: a first level including a first single crystal layer and a memory control circuit, the memory control circuit including a plurality of first transistors; a first metal layer overlaying the first single crystal layer; a second metal layer overlaying the first metal layer; a third metal layer overlaying the second metal layer; a plurality of second transistors disposed atop the third metal layer; a plurality of third transistors disposed atop the plurality of second transistors; a fourth metal layer disposed atop the plurality of third transistors; a memory array including word-lines, where the memory array includes at least four memory mini arrays, where each of the memory mini arrays includes at least four rows by four columns of memory cells, where at least one of the plurality of second transistors includes a metal gate, and where each of the memory cells includes at least one of the plurality of second transistors or at least one of the plurality of third transistors; and a connection path from the fourth metal to the third metal, where the connection path includes a via disposed through the memory array, and where the memory control circuit includes at least one temperature sensor circuit.

In another aspect, a 3D semiconductor device, the device including: a first level including a first single crystal layer and a memory control circuit, the memory control circuit including a plurality of first transistors; a first metal layer overlaying the first single crystal layer; a second metal layer overlaying the first metal layer; a third metal layer overlaying the second metal layer; a plurality of second transistors disposed atop the third metal layer; a plurality of third transistors disposed atop the plurality of second transistors; a fourth metal layer disposed atop the plurality of third transistors; a memory array including word-lines, where the memory array includes at least four memory mini arrays, where each of the memory mini arrays includes at least four rows by four columns of memory cells, where at least one of the plurality of second transistors includes a metal gate, and where each of the memory cells includes at least one of the plurality of second transistors or at least one of the plurality of third transistors; and a connection path from the fourth metal to the third metal, where the connection path includes a via disposed through the memory array, and where the first level includes a plurality of differential signaling interconnect structures.

In another aspect, a 3D semiconductor device, the device including: a first level including a first single crystal layer and a memory control circuit, the memory control circuit including a plurality of first transistors; a first metal layer overlaying the first single crystal layer; a second metal layer overlaying the first metal layer; a third metal layer overlaying the second metal layer; a plurality of second transistors disposed atop the third metal layer; a plurality of third transistors disposed atop the plurality of second transistors; a fourth metal layer disposed atop the plurality of third transistors; a memory array including word-lines, where the memory array includes at least four memory mini arrays, where each of the memory mini arrays includes at least four rows by four columns of memory cells, where at least one of the plurality of second transistors includes a metal gate, and where each of the memory cells includes at least one of the plurality of second transistors or at least one of the plurality of third transistors; and a connection path from the fourth metal to the third metal, where the connection path includes a via disposed through the memory array, and where the memory control circuit includes a plurality of differential read circuits.

BRIEF DESCRIPTION OF THE DRAWINGS

Various embodiments of the invention will be understood and appreciated more fully from the following detailed description, taken in conjunction with the drawings in which:

FIGS. 1A-1B is an example illustration of a wafer stacking process;

FIGS. 1C-1F are example illustrations of a wafer stacking process which manages the wafer bonder mis-alignment;

FIGS. 3A-3C are example illustrations of a solution to the bonding alignment error in the direction perpendicular to the bit-lines;

FIGS. 9A-9B are example illustrations of a 3D NOR-P with electrical programming for array access rather than a staircase;

FIG. 10 is a copy of FIG. 1 of U.S. Pat. No. 8,673,721;

FIG. 11 is an example illustration at the wordline level showing the chain of back to back channels and S/D pillars;

FIGS. 12A-12B are example illustrations of S/D pillars relatively shifted to form a checker board type pattern with odd and even rows;

FIG. 13A is an example illustration of an alternative 3D NOR-P with electrical programming for array access rather than a staircase;

FIG. 13B is an example illustration of an alternative 3D NOR-P with global pillars to assist in array access;

FIGS. 13C-13F are example illustrations of a method of forming a multilayer structure;

FIGS. 15A-15D are example illustrations of differential memory placements and bit line architecture using 3D NOR or 3D NOR-P architecture as an example;

FIGS. 19A-19C are example illustrations of different options of NOR-P S/D arrangement;

FIGS. 20A-20C are example illustrations of a 3D architecture of cross-cells;

FIGS. 23A-23E are example illustrations of customization of optical waveguides;

FIGS. 24A-24B are example illustrations of an optical interconnect structure prepared for transfer and transferring to a 3D IC;

FIGS. 25A-25C are example illustrations of cut views of a region of a 3D system of a multi-cores continuous wafer fabric;

FIG. 26 is an example illustration of a top view of an interconnect fabric called the X architecture; and FIGS. 27A-27B are example illustrations of microchannel cooling of a 3D IC system.

DETAILED DESCRIPTION

Figure 1E:
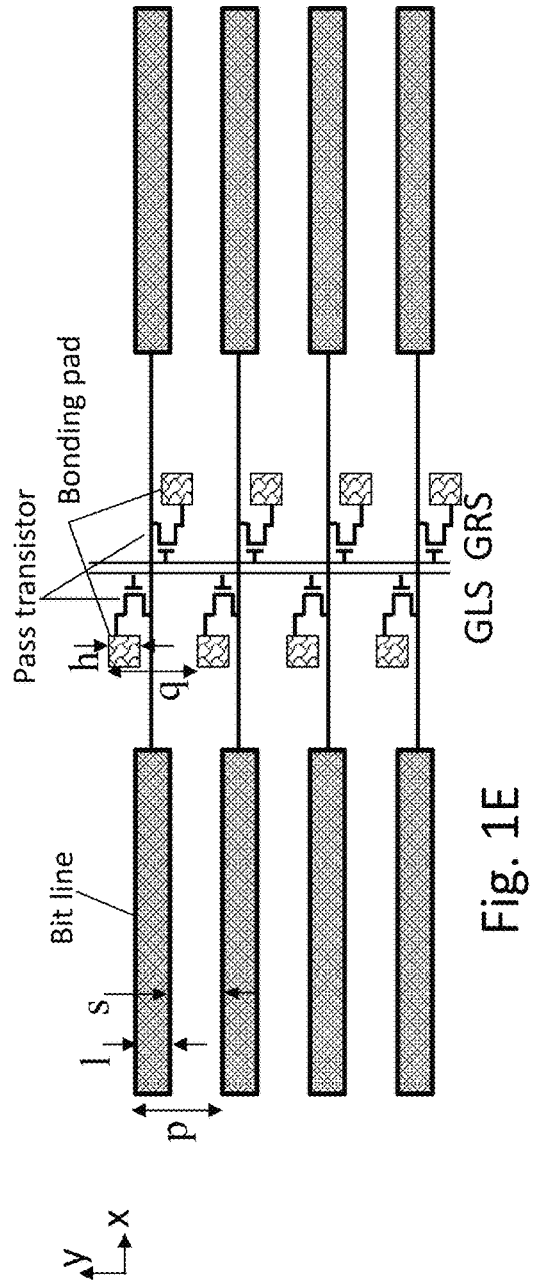

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by any appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

In PCT/US2017/052359, incorporated herein by reference, in reference to at least FIG. 25A-25G, a 3D memory integration flow is presented designed to utilize existing memory process flows and add processes to form a stacking fabrication flow to enable the desired 3D memory integration. An additional alternative is use an existing SOI process flow, for example, such as is offered by Global Foundries with the commercial names: 12FDX, 22FDX and so forth. Utilizing an SOI process could match well the 3D stacking as the buried oxide ("BOX") could be used as the cut-layer just as the SiGe 2502 of FIG. 25A in PCT/US2017/052359. An added advantage is that within such an SOI standard flow the STI depth is such to at least go thru and past the BOX and also there is a contact to the substrate below the BOX for body bias access and other functions.

FIG. 1A illustrates a structure similar to FIG. 25E of PCT/US2017/052359, and then adapted to a typical SOI wafer flow. An SOI wafer with substrate 106, a buried oxide (BOX) 104, which could be used for the 'cut-layer', a memory bit-cell array with its metal connection layers 102 fabricated on top silicon layer having control metal lines such as bit-lines and word-lines 114, having top isolation 101 with extended vertical connectivity pads 113, also referred as landing pads or connecting pins hereinafter, utilizing the standard SOI process such as back-gate contact process or alternatively extra dedicated process—the bottom vertical connectivity 112 are formed as substrate contacts, and optional use of Shallow Trench Isolation ("STI") to form alignment marks 116. The space between landing pads 113 is designed to be greater than the alignment margin of the bonding technology used so that bridging between the two landing pads is avoided. It should be understood that the three landing pads do not connect to one control line 115, rather each of three landing pads 113 in the x-direction is connected to a respective control line 114 arranged in the y-direction. The top surface of the top isolation 101 and the top surface of the vertical connectivity pads 113 may be substantially in-plane. If desired, alternatively, the top surface of the vertically connectivity pads 113 may be taller or shorter than the top surface of the top isolation 101 layer depending on the best practice feature of forthcoming fusion bonding techniques. Thus, memory stratum 100 may be formed. Memory stratum 100 may include top isolation 101, a memory bit-cell array with its metal connection layers 102, BOX 104, SOI wafer with substrate 106, bottom vertical connectivity 112, vertical connectivity, landing pads 113, bit-lines and word-lines 114, and alignment marks 116.

FIG. 1B illustrates the structure after a face to face fusion bonding of such two memory stratum 124,122, and grinding and etching out the silicon substrate 106 of the upper stratum 122 of the donor wafer. By repeating such bonding and removing handling substrate 106, at least two tiers, for example, 4 tiers, or 6 tiers, or 7 tiers, or 10 tiers, and so on, can be stacked. FIG. 1B also illustrates an optional addition of additional top oxide 132 and conductive landing pads or connecting pins 134 formed. A deposition, lithography, etch, and deposition step sequence could be used for forming these added structures (top oxide 132 and landing pads or connecting pins 134). This additional layer 132, 134 may be used for bonding pad or bump pad for packaging IO pads. Alternatively, this additional layer 132, 134 may be used for redistribution layer (RDL).

An additional inventive embodiment for 3D memory integration relates to managing the wafer bonder miss-alignment. This is an added option to those presented in PCT/US2017/052359 such as related to at least FIGS. 11F-11K, FIGS. 21A-21C, and also to the techniques presented in U.S. Pat. No. 8,273,610, incorporated herein by reference, in reference to at least FIG. 30-FIG. 32B, FIG. 69, FIG. 73-FIG. 75, FIG. 77, FIG. 79, FIG. 80, FIGS. 94A-94C, and FIGS. 155A-155D. This new technique could accommodate a relatively less precise bonder in order to assure the resolution of vertical connectivity from the wafer to wafer bonding, to be far beyond the mechanical resolution. For example, the presented invention offers, the alignment resolution of the vertical connectivity of the wafer to wafer bonding or die to wafer bonding or die to die bonding to be 50 nm, with the wafer bonding equipment with 1 μm alignment precision. It leverages the nature of a memory array being a repeating structure. The description of the technique will be related to the 3D system presented in PCT/US2017/052359 in respect to FIG. 22A-FIG. 25G. It is an alternative to the vertical connectivity presented there in respect to FIG. 21A-21C. In this technique the landing structure would be long strips along the control line direction such as the bit-lines extended beyond the block boundary of memory cell array. As a note, the description would be in respect to bit-lines for simplicity, yet artisan skilled in the art could adapt it to the bit-lines and word-line as well. Also, many mix and match options exist between this techniques and other techniques discussed before, including using one technique for the bit-lines and another technique for the word-lines.

FIG. 1C illustrates an alternative conceptual diagram having four memory strata overlaid on a control logic stratum presented in this invention. The memory in the memory stratum maybe at least one of DRAM, SRAM, Flash memory, RRAM, PCRAM, MRAM, CBRAM, or FRAM or 3D memory such as 3D NAND. In another embodiment, the memory stratum maybe replaced by the pixel array of an image sensor. In another embodiment, the 3D chip may include an image sensor pixel stratum and other memory strata. Control lines such as source line, bit line, or word line of one memory strata may be connected with a control line of neighboring memory strata, i.e. upper or lower layer, by one or more through-transistor-layer-via (TTLV). The through-transistor-layer-via (TTLV) connection may include at least two pass transistors per control line. The TTLV electrically connects control lines of upper and lower layers by pass transistor gate and bonding pad formed below the source/drain region of the transistor. For example, each control line aligned along the x-direction is connected to landing pads with an offset in the y-direction by respective at least two pass transistors. The y-direction offset of the two landing pads are designed to make a connection of at least one the landing pads with the target corresponding control line of the transferred memory stratum at substantially any y-direction misalignment. For example, only one bonding pad can connect to the target control line of the transferred memory or both two landing pads can connect to the target control line of the transferred memory. When both landing pads is connected to the target control line, the only one TTLV is activated by controlling the gate voltage of the pass transistor. In some embodiments, the memory control logic stratum may be located at very bottom or very top of the 3D stack. FIG. 1D illustrates the same concept explained in FIG. 1C. The memory sub-array is mirrored by TTLV region, sharing the TTLV (may be engineered to have two TTLVs, etc.). FIG. 1E illustrates a xy-plane view of the control line, the connected pass transistors, and the bonding pads. Two bonding pads are connected to the control line through the respective pass transistors. The two pass transistors redistribute the control line signal in a y-direction offset. The pass transistors are controlled by the global left select (GLS) and global right select (GRS), respectively. The pass transistors in left and right columns share their own common global select signal. Assuming that the line width and the space of the control line are l and s, respectively, the pitch of the control line is p=l+s. Then, the pitch of the left bonding pad and the right bonding pad (q) are required to be the same as the pitch of the control line p. In addition, the height of the both bonding pad (h) is required to not exceed the space of the control line (s). As a result, at arbitrary y-direction alignment for bonding, a control line has either one or both connection with left and right bonding pad. In another embodiment, the multiple bonding pads more than 2 aligned along x-direction can be grouped, or made longer in x direction, in order to reduce the contact resistance and decrease the bonding failure rate.

Figure 1F:
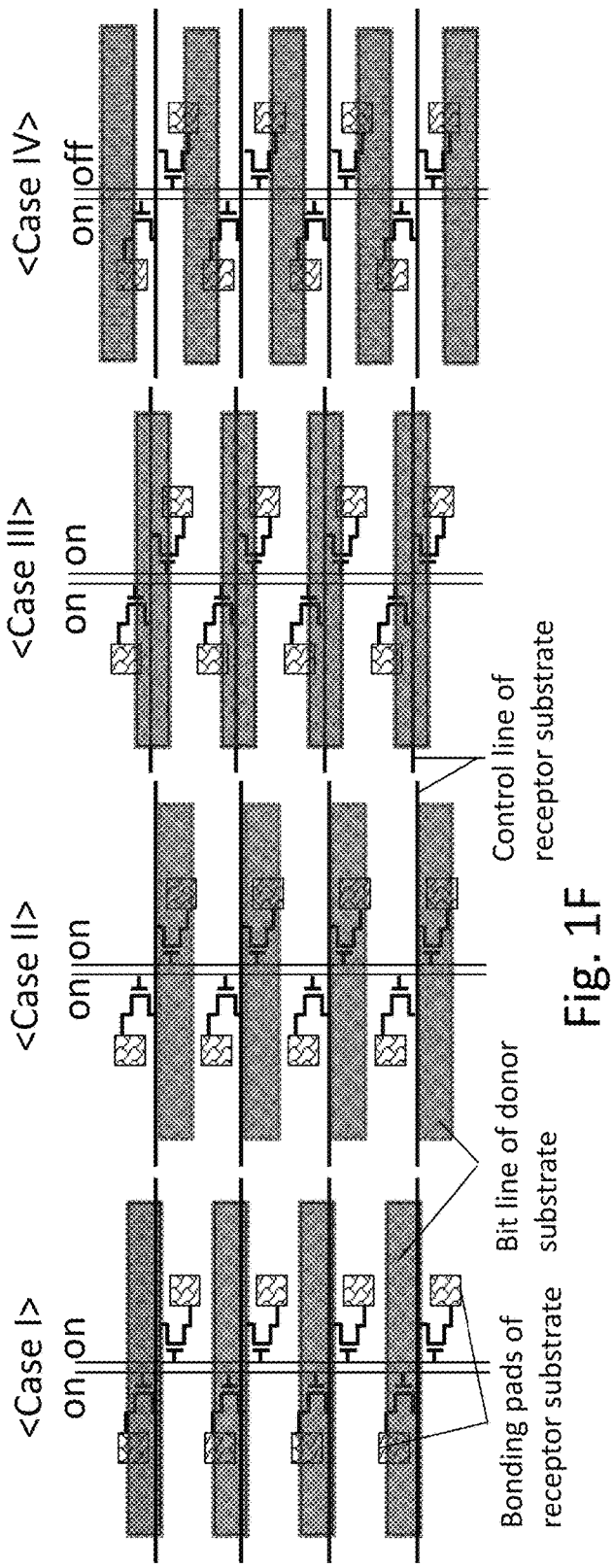

FIG. 1F illustrates possible cases of y-direction bonding alignment between bonding pad of receptor substrate and the control line of donor substrate. The control line of the receptor substrate is not drawn for simplicity. Due to the dimensional constraints explained in respect to FIG. 1E, a control line of the transferred wafer has either one or both connection with left and right bonding pad of the receptor wafer. Case I and Case II show only one connection is made between left (Case I) or right (Case II) bonding pad with the control line. Case III shows that both left and right bonding pads connected to one control line of the receptor substrate are connected to a control line of the donor wafer. Such first three cases, GLS and GRS can be turned on. Alternatively, only GLS can be turned on for case I and only GRL can be turned on for case II. In Case IV, the control line of the donor wafer becomes contacted to two bonding pads connected to the different control lines of the receptor wafer. In this case, one of the GLS or GRS needs to be shut off in order to avoid shorting one level control line with two control lines of the other level.

Figure 2A:
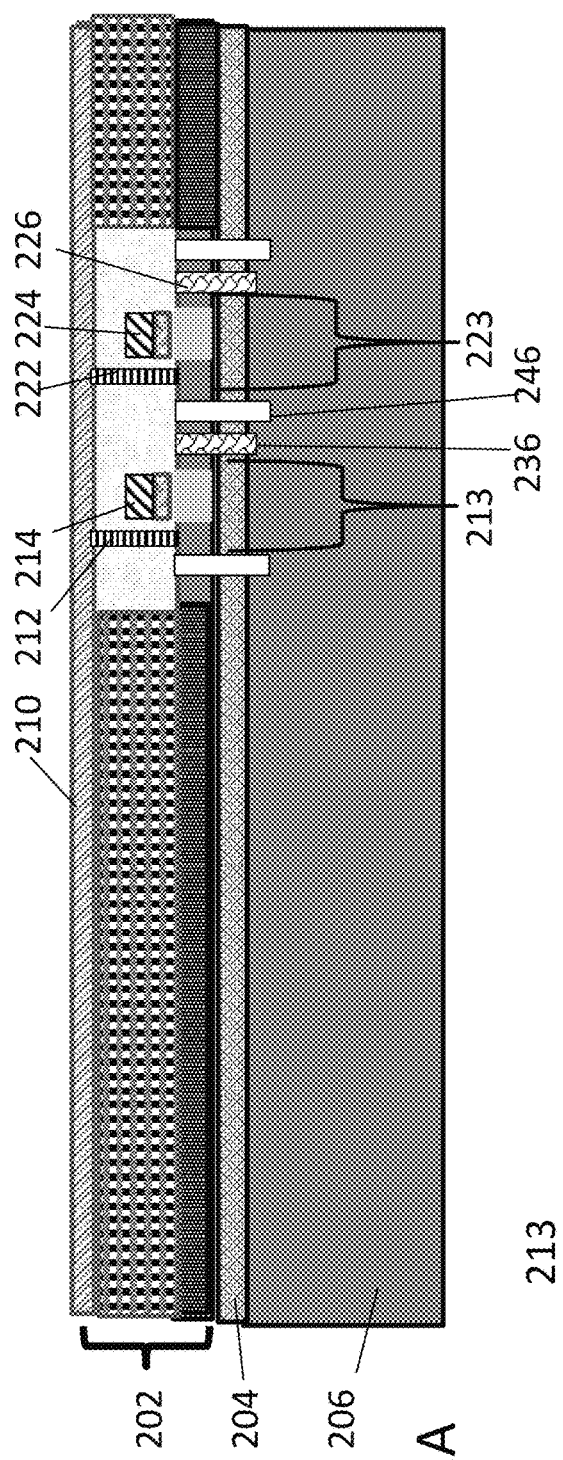
FIGS. 2A-2D are example illustrations of advanced stacking solutions to issues such as mis-alignment of each layer to the other in a stack.

The landing 'zone' would be designed long enough to accommodate the worst case misalignment error given by the wafer bonder equipment, which for a current non-precise bonder could be about 1 micron. FIG. 2A illustrates a side cut view (X-Z or Y-Z) of a region of a memory array stratum constructed to support this technique explained through FIG. 1C to FIG. 1F. It should be note that FIG. 2A to FIG. 2F are not drawn according to the single cut line. Instead, it should be understood that the left pass transistor and right pass transistor may be in plane or may not be in-plane but with a y-direction (depth along the screen) offset. However, it should be understood that the lower pinning via 236 is not in-plane but with y-direction (depth along the screen). For better understanding of formation of lower pinning via 236 with y-direction offset. In addition, the low pinning via 226 may be connected directly to the drain region of the pass transistors or the low pinning via 226 may be connected to the drain region of the pass transistors through a metal jumping connect. The connection of the control line 210 to the pass transistors can be made respective via 212, 222.

Figure 2B:
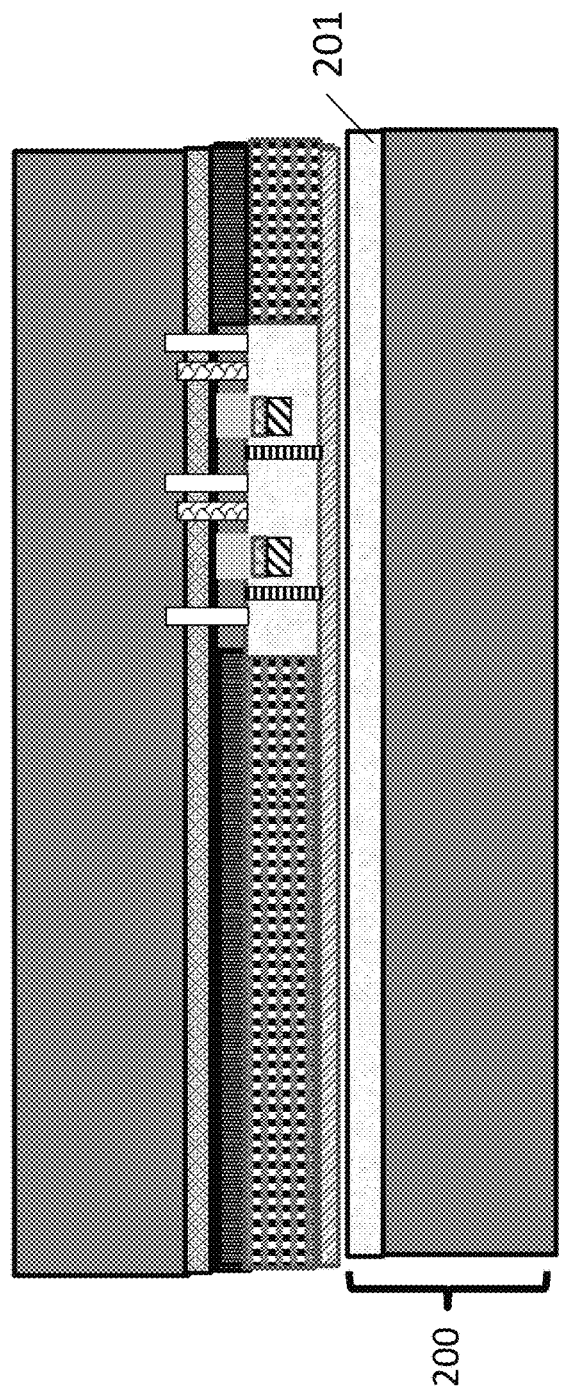
Figure 2C:
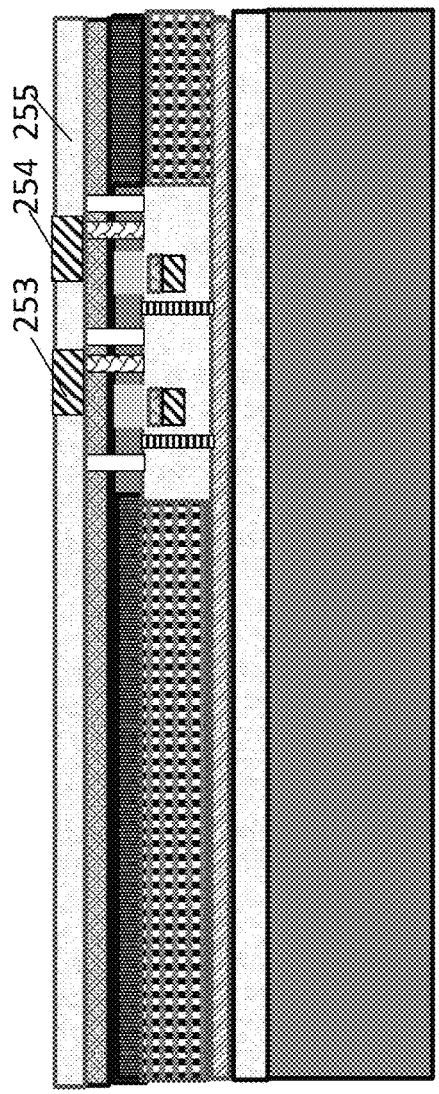
Figure 2D:
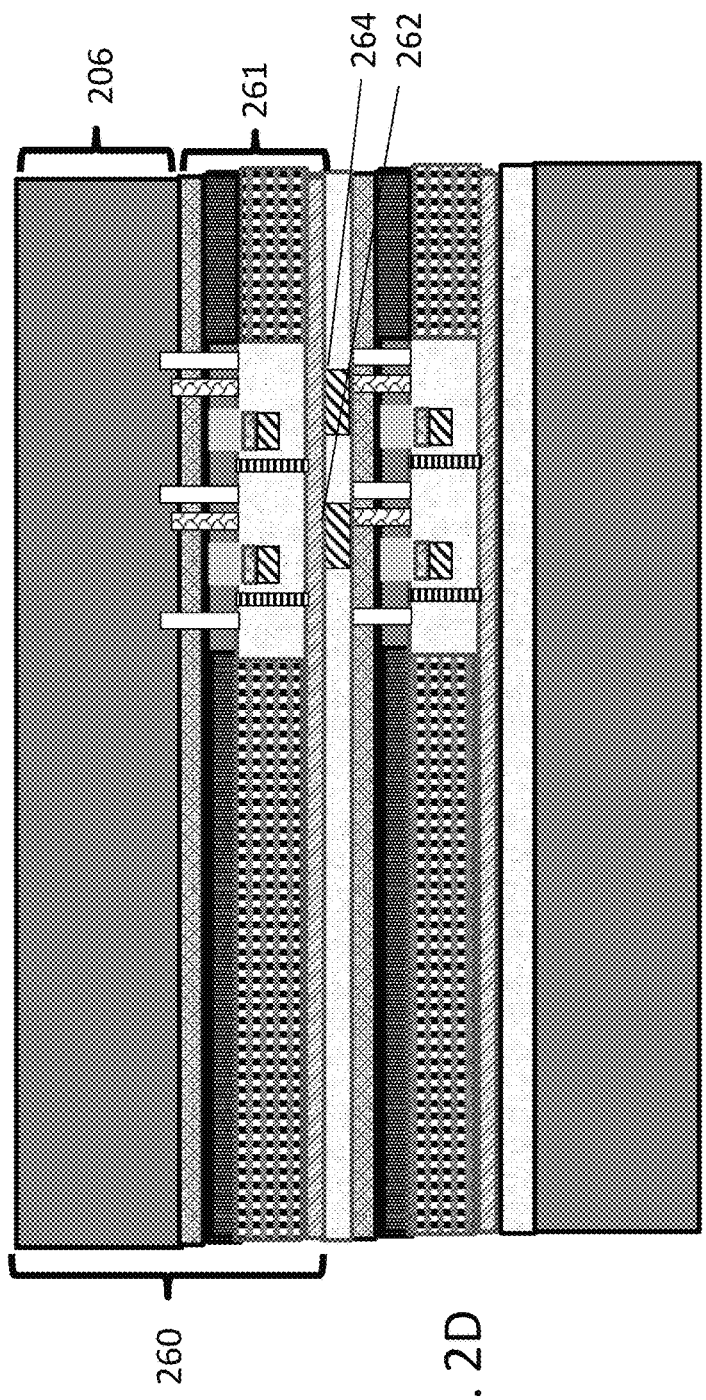
Figure 2E:
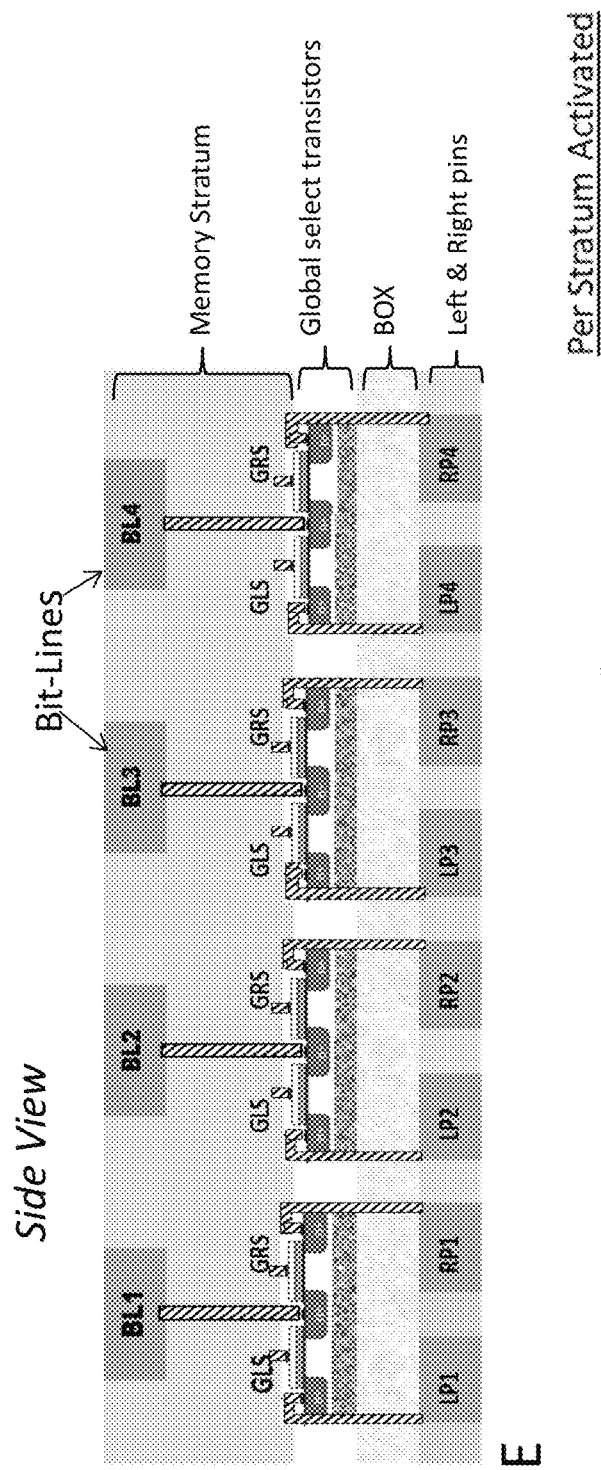
FIGS. 2E-2F are example illustrations of advanced stacking solutions to issues such as mis-alignment of each layer to the other in a stack where the orientation of pass gate is parallel to BL.
Figure 2F:
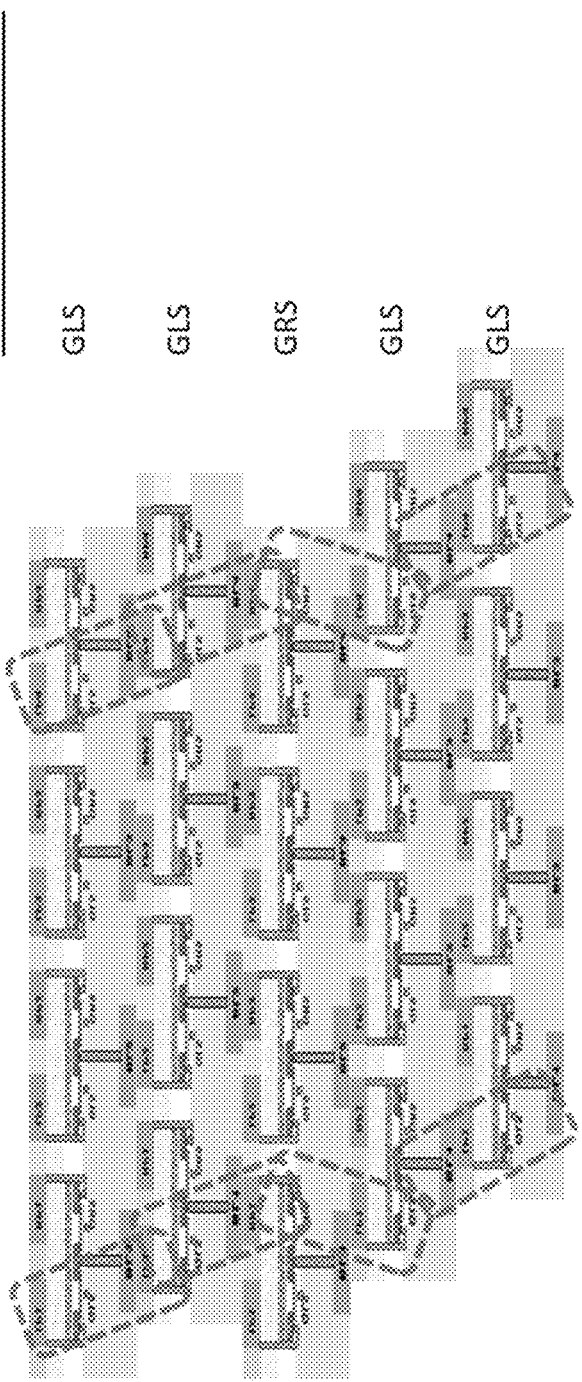
Figure 2G:
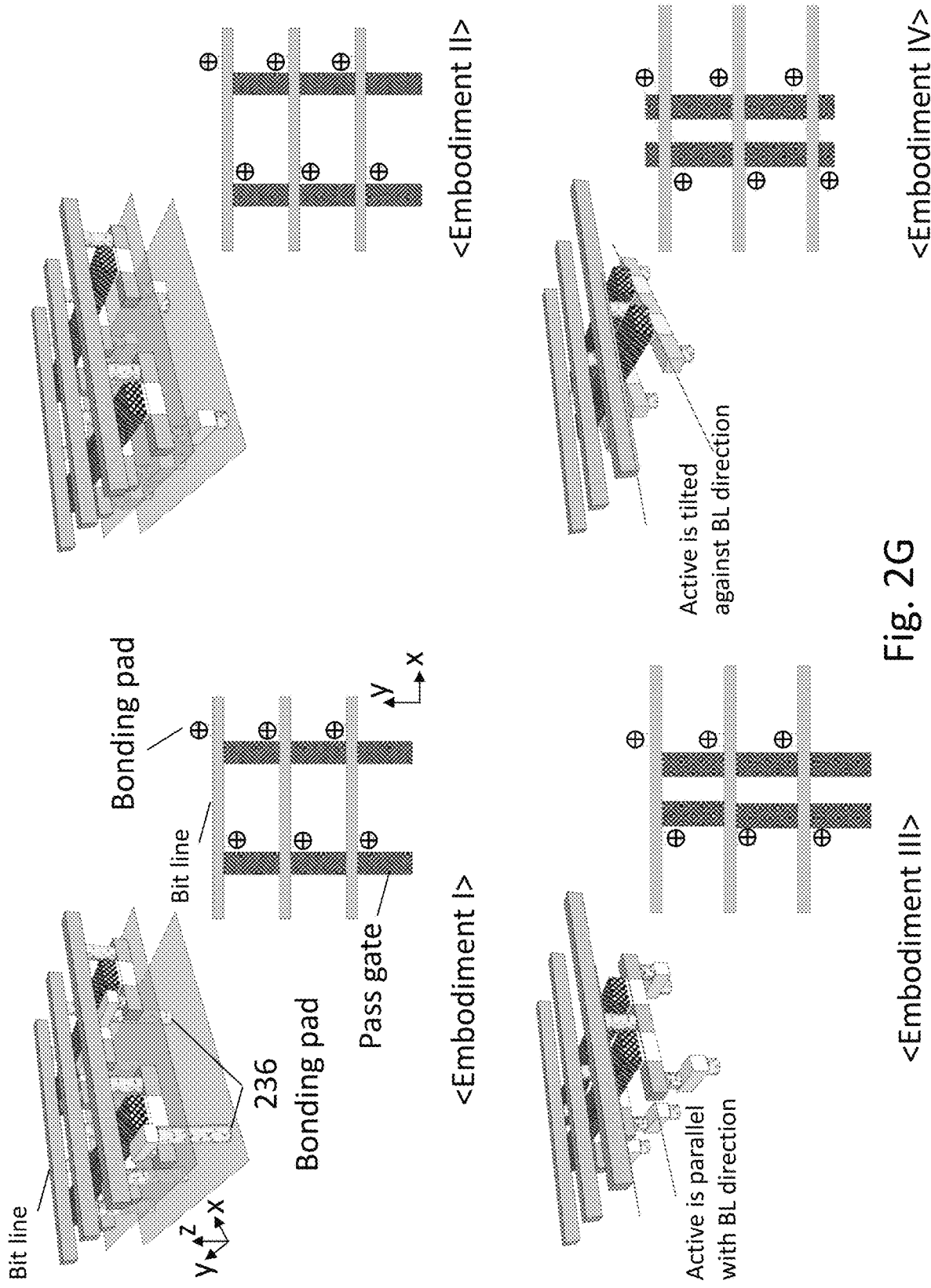
FIG. 2G is an example illustration of advanced stacking solutions to issues such as mis-alignment of each layer to the other in a stack where the orientation of pass gate is 90 deg with respect to BL.

Alternatively, the connection of the control line 210 to the pass transistors can be made only one common shared via as drawn in FIG. 2E and FIG. 2F. FIG. 2G illustrates 3-dimensional view of the pass transistor and its bonding pad (lower pinning via 236) with 3D consideration. It illustrates in respect to the 2D illustration of the substrate 206, a BOX 204 and memory array and connection layers 202 The bit-line 210 could be made at the top surface, or at least an upper layer metallization strip connected to the bit-line (note: similar concept could be applied in respect to the word-line) and extended long enough to accommodate the worst case alignment error. This region of the top exposed landing strip connected to the bit-line would serve as a vertical connecting strip long enough to guarantee contact along its direction. The bit-line could have a serial layer select transistor (not shown) such as is illustrated in FIG. 22D of PCT/US2017/052359. There are two optional connection pads designated for per-bit-line connect toward the substrate direction (bottom side). The first utilizes an upper pining via or staggered vias 212 through a pass transistor 213 having a gate 214 and then to the bottom through low pinning via 236 through the BOX 204. Hereinafter, we will refer to this configuration as through-transistor-layer-via (TTLV). The bottom end of the low pinning via 236 would be used to form connection to the forthcoming bit-line after fusion bonding to the following strata in the 3D stack. The gate 214 controlling the pass transistor 213 could be connected to a global signal we can call GLS. The second pass transistor 223 may be connected to the bit-line 210 by via 222 having gate 224 controlled by a global signal we can call GRS. STI 246 could be used to isolate the two pass transistors. The use of these two pass transistors 213 and 223 will be presented in respect to FIG. 3A-3C.

FIG. 2B illustrates the start of the stacking process by flipping the wafer of FIG. 2A and bonding it to a carrier 200. The top surface of the carrier wafer 200 may be a buffer oxide 201. The carrier wafer 200 may contain other functional logic blocks and circuitry.

FIG. 2C illustrate the structure of FIG. 2B after grinding and etching out the substrate 206 using the BOX 204 as an etch stop and optionally forming vertical connection pins 253, 254 and cover oxide 255.

FIG. 2D illustrates bonding additional stratum 260. The process could be repeated thus stacking the desired number of stratum.

Again, the repeating structure in the perpendicular direction compensates for the perpendicular alignment error provided that at least one of the landing pins 253, 254 will always make a contact with some bit line. The challenge is how to guarantee contact while also guaranteeing that pins would never short two adjacent bit lines. The innovative solution is to have two pass transistor controlled pins for each bit line as illustrated in FIG. 2E. The schematics illustrated in FIG. 2E and FIG. 2F shows the cross-sectional view cut along perpendicular direction of FIG. 2A near the pass transistor where the pass transistors are assumed to be 90 degree tilted compared to the FIG. 2A. For bit-line BLi there will be two corresponding pins, 'left pin' LPi controlled by 'global left select' signal—GLS, and 'right pin' RPi controlled by 'global right select' signal—GRS. The stacking fab will perform the stacking process similarly to the process presented before for a precision bonder, but this time once a memory stratum has been flipped bonded and thinned, a test would be done either visually or electrically to determine which of the global signals should be activated—GLS or GRS.

FIG. 2F illustrates a memory stack of 5 strata and the respective activation choice for each. Two vertical global bit-lines are red-marked, illustrating the pillar structure formed by such Advanced Smart Alignment technique.

FIG. 2G illustrates 3-dimensional view and top layout view of pass transistors and its bonding pads (or lower pinning via 236). As levels are bonded with a relatively large bonding misalignment (~1 micron) the relative position of the bonding pads to the bonding strips (bit-lines) could be different each time. FIG. 2G illustrated four embodiments for structuring pass transistors and their corresponding bonding pads relative to the memory control line. In Embodiment I, two pass transistors have respective bit-line contact and the bonding pads are fabricated together with the pass transistor. The y-offset of the bonding pad is implemented by the jumping connection via low level metal layer. In another embodiment shown in Embodiment II, two pass transistors have respective bit-line contact and the bonding pads are fabricated after receptor wafer fabrication flip and before the donor wafer transfer. The y-offset of the bonding pad is implemented by the jumping connection via redistribution metal layer. In another embodiment shown in Embodiment III, two pass transistors share one bit-line contact and the bonding pads are fabricated either after receptor wafer fabrication flip and before the donor wafer transfer, or together with the pass transistor such as Embodiment I (not drawn). Embodiment IV illustrates the active layer tilted against the bit-line direction. The active layer tilt angle is designed to meet the dimension requirement explained in FIG. 1E. The tilted active layer can naturally offer the y-offset bonding pad without metal jumping connection or redistribution metal layer. Therefore, the bonding pad may be directly formed through diffusion layer as illustrated in FIGS. 2A-2D herein. The per stratum activation of GLS and GRS, may be done as part of the 3DSoC set-up process or prior to final 3DSoC testing process. The GLS and GRS signals are wafer level signals but could be also controlled at the per-die level. The bonding alignment error could be larger than the width often bit-lines. Thus, by using this technique, multiple memory rows of the unit's right and left sides may be left un-connected. Yet as the unit size is on the order of 200 microns, the loss of these rows reflects a less than 1% loss impact.

Direct hybrid fusion bonding at the 100 nm level pad size is at the forefront of current wafer bonding work. It does require a high level of wafer planarization. At the level of better than 0.5 nm as was reported recently, in a paper by A. Jouve et al., "1 µm pitch direct hybrid bonding with <300 nm Wafer-to-Wafer overlay accuracy", IEEE S3S 2017, incorporated herein by reference. As a back-up, oxide to oxide bonding could be used with via and 'smart alignment' process, adding cost and requirements on the stacking fab. Yet these levels of processing are well within a modern semiconductor industry wafer fab BEOL capabilities.

Figure 3C:
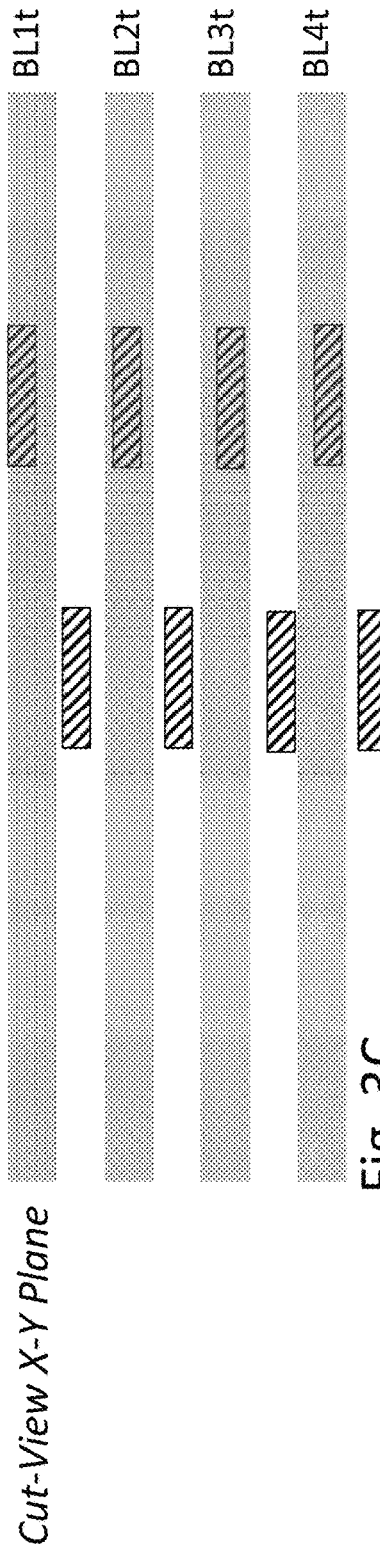

FIG. 3A-3C illustrates the inventive embodiment of a solution to the bonding alignment error in the direction perpendicular to the bit-lines.

FIG. 3A illustrates small region of bit-lines BL1t-BL4t of the donor wafer. These bit-line strips are the landing strips to be vertically connected to the bonded stratum top pins 262, 264 of the receptor wafer as shown in FIG. 2D. For each of the bit-lines of the underneath stratum, pins are selectively connected by the two transistors. Pins 311-314 are activated by global signal GRS, while pins 321-324 are activated by global signal GLS. Pins 311, 321 are potential connections to bit-line BL1b of the underlying stratum, 312, 322 to BL2b, 313, 323 to BL3b, 314, 324 to BL4b and so forth. FIG. 3A illustrates a bonding case in which GLS could be made active. FIG. 3B illustrates a case in which both GRS & GLS could be made active. FIG. 3C illustrates another case in which GRS could be made active. The Pins are made narrow enough to guarantee that they will never short to adjacent bit-lines. They are spaced so at least one of them always makes good contact with a bit-line. In some case to achieve these two objectives three transistors could be used with a respective three pins and a third global signal (GMS).

The selection of which global signal should be activated for these two stratum connections could be made after bonding inspection using an optical technique or other measurement method, for example, an automated inspection system. The activation could be done after the full construction of the 3D system as part of the initial testing and programming step. An on-chip anti-fuse could be used as this programming is to compensate for manufacturing bonding misalignment and only need to be done once.

The bonding alignment error could be larger than the space often bit-lines. Thus by using this technique multiple memory rows might be left un-connected. Yet as the unit size could be larger than 200 microns so the loss of 10 rows at the bottom or at the top of the array will cause less than a 1% loss.

For high precision bonding, the industry is adopting a technique called fusion bonding. In fusion bonding, both wafers are aligned and a pre-bond is initiated. When bringing the device wafers together, wafer stress, local warpage, and/or bow can influence the formation of a bond wave. The bond wave describes the front where hydrogen bridge bonds are formed to pre-bond the wafers. Controlling the continuous wave formation and influencing parameters is key to achieving the tight alignment specifications and avoiding the void formation noted above. The reason for this is that any wafer strain manifests itself as distortion of the wafer, in part due to lateral and vertical thermal non-uniformity and built-in bowing, which leads to an additional alignment shift. Process and tool optimization can minimize strain and significantly reduce local stress patterns. Typically, distortion values in production are well below 50 nm. Indeed, further optimization of distortion values is a combination of many factors, including not only the bonding process and equipment, but also previous manufacturing steps and the pattern design. Once the initial bonding has been confirmed to meet the alignment requirements, an annealing step would take place to finalize the bonding process. So it desired to have the first bonding step, also called pre-bonding, at a lower temperature or even at room temperature thus reducing stress and expansion associated with an elevated wafer temperature. Only after good alignment has been confirmed will the bonding move to the second step at an elevated temperature to finalize the bonding. The elevated temperature could be higher than 100° C., or even higher than 200° C., and preferably lower than 400° C. There may be a need to control the ramp-up and ramp down rates of this thermal anneal of the final bonding step.

An additional option could be integrated with the proposed flow herein, that the additional bonding step could be used after removing the bonded wafer substrate 206. Once the ~700 micron substrate 206 has been removed the top structure left 261 would be relatively flexible. Than applying pressure or thermo-pressure on it, could help to assure connecting pins to pad if those are not yet connecting 402 due to a thin gap left in-between.

Figure 4:
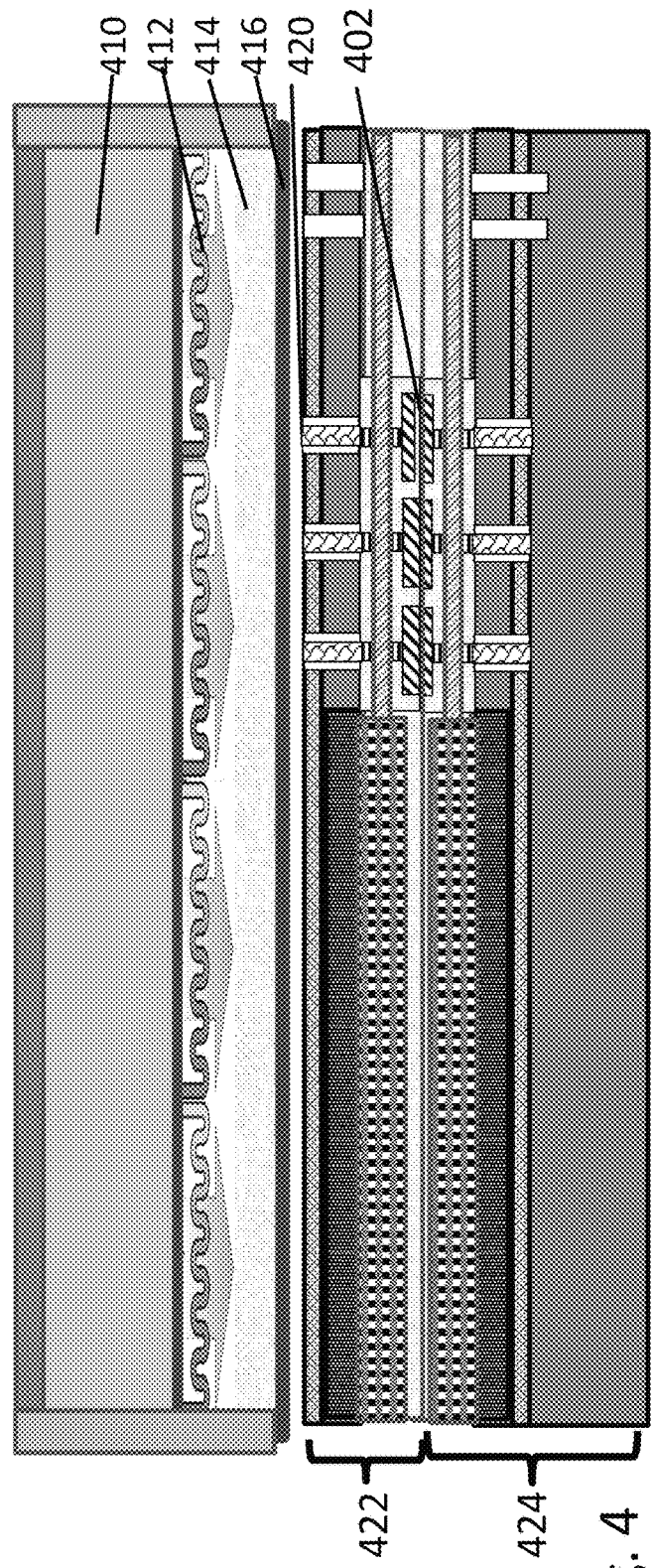
FIG. 4 is an example illustration of a special wafer chuck for wafer bonding.

For such pressure a special chuck could be used. The special chuck which we will call bonding-piston 400 could have a flexible contact surface 416 a fluid 414, water or oil or option for such fluid, or sol/gel, or elastomer to distribute the pressure evenly, heating bodies 412 segmented in multiple patterns and with independently temperature control and main body 410. Alternatively, a flexible contact surface may be implemented by flexible and thermally conductive materials, such as, for example, doped elastic polymers. Using such bonding-piston 400 the bonder could form an even pressure on the top surface of the bonded structure 424, 422 after the top substrate has been removed as is illustrated in FIG. 4. The top pressure on the thin and flexible top stratum 422 could help push down the pin 420 structure into the pad 402 and a bonding could then be achieve by applying the annealing while the bonding-piston is pushing down on the pin 402 structure.

Additional step that could be used to enhance these pins to pads bonding is light etch back of the top oxide surface. A few nanometers of atomic layer oxide etch could make the pins and the pads to connect and bond first while the oxide would be connected and bond slightly later achieving mechanical strength from the oxide to oxide bonding while the metal to metal bonding also provides the electrical connectivity.

Additional findings related to fusion bonding have been detailed in work by Di Cioccio, L., et al., "An overview of patterned metal/dielectric surface bonding: mechanism, alignment and characterization" *Journal of The Electrochemical Society* 158.6 (2011), incorporated herein by reference. For instance, Cu-Cu bonds can occur at room temperature, without pressure normal to the bonding interface. The mechanism is as follows: below 200° C., Cu surfaces have an unstable copper oxide; when two Cu surfaces are brought into contact, the asperities make contact first; Cu diffuses across the copper oxide interface; the unstable oxide moves laterally; the asperities undergo plastic deformation; the contact area spreads along the oxide interface; eventually, a tough bond occurs (as seen in bond toughness vs multi-day storage time data). This process can be accelerated using a 200° C. anneal. Use of CMP, to reduce asperities and make the surface hydrophilic, could be important. "Dishing" of the Cu surfaces during CMP can either delay bonding, or prevent it altogether, on large-area bonds. Generally this can be mitigated by dividing the large area into a multiplicity of smaller areas. Dishing may therefore be less of a problem for 20 nm+/−bond areas. Especially as metal-metal contact areas shrink well below 1 µm, some copper oxide contact between small bond areas could be important to ensure bonding according to the preceding mechanism proceeds to completion. This realization suggests that some selective augmentation of the height over metal bond pads could succeed in producing a low-resistance, high-quality metal-metal bond. Graphene suffices for this purpose, especially as it deposits preferentially on Ni and Cu surfaces. A simple, slight oxidation of the bond pads could create a slightly raised CuO surface, to ensure mechanical contact prior to wafer- and contact-bonding and annealing.

Selective and/or preferential, maskless deposition of adjuncts onto the metal pads, prior to bonding, could suffice to produce a low-resistance, high-quality bond. Such deposition could be performed using atomic layer deposition (ALD). A list of such adjuncts includes, but is not limited to, the following: aerogels; MoS2; epitaxial perovskites; metals; SiC; porous Si nanowires; transition metal di-chalcogenides (TMDCs), such as WSe2, which additionally may be doped or activated in-situ using, for example, He or H2 plasmas.

Low-resistance, high-quality metal-metal bonds may also be affected using copper nano-pillars, as described in Lee, K. W., et al., "Novel W2 W/C2 W Hybrid Bonding Technology with High Stacking Yield Using Ultra-Fine Size, Ultra-High Density Cu Nano-Pillar (CNP) for Exascale 2.5 D/3D Integration." *Electronic Components and Technology Conference (ECTC)*, 2016 *IEEE 66th*. IEEE, 2016, incorporated herein by reference.

The specific memory unit architecture herein could help by having the pins and pads in the periphery of the memory array units. Additionally a patterned oxide etch could be used to further assist the process of bonding these memory strata.

An additional process embodiment that could be applied to this memory stratum is the use of electrical current to harden the word-lines and bit-lines global pillars. Current is used for Bridge-RAM and R-RAM to form conductive filaments to reduce resistivity as a technique to form memory. Similarly, current applied through the pillars could be used to further harden/improve the connection between the pins and pads and may overcome a thin oxide or other barrier. The location with incomplete bonding naturally has high resistance and the flowing current through such results in localized hot spot. Therefore, Joule heating is localized to the weak bonding region and thus selectively improve the bonding due to intermixing of the metal material or partially melting the metal. The design of the top most and the bottom most level could be such that it would enable such a current hardening without damaging the low voltage circuitry and circuit elements. Such techniques are commonly used for metal to metal antifuses as presented in at least U.S. Pat. Nos. 5,126,282, 6,529,038 and 5,986,322; all of the forgoing are incorporated herein by reference. Conventional and other stacking technologies have been presented in: Di Cioccio, L., et al., "An overview of patterned metal/dielectric surface bonding: mechanism, alignment and characterization." *Journal of The Electrochemical Society* 158.6 (2011): P81-P86; Di Cioccio, Lea, et al., "An overview of patterned metal/dielectric surface bonding: Mechanism, alignment and characterization." *ECS Transactions* 33.4 (2010): 3-16; Kim, Soon-Wook, et al. "Ultra-Fine Pitch 3D Integration Using Face-to-Face Hybrid Wafer Bonding Combined With a Via-Middle Through-Silicon-Via Process." *Electronic Components and Technology Conference (ECTC)*, 2016 *IEEE 66th*. IEEE, 2016; Liu, Ziyu, et al. "Room temperature direct Cu-Cu bonding with ultrafine pitch Cu pads." *Electronics Packaging and Technology Conference (EPTC)*, 2015 *IEEE 17th*. IEEE, 2015; Teh, W. H., et al. "Recent advances in submicron alignment 300 mm copper-copper thermocompressive face-to-face wafer-to-wafer bonding and integrated infrared, high-speed FIB metrology." *Interconnect Technology Conference (IITC)*, 2010 *International*. IEEE, 2010; Lee, Kangwook, et al. "Nano-scale Cu direct bonding using ultra-high density Cu nano-pillar (CNP) for high yield exascale 2.5/3D integration applications." 3D *Systems Integration Conference (3DIC)*, 2016 *IEEE International*. IEEE, 2016; and Lee, K. W., et al. "Novel W2 W/C2 W Hybrid Bonding Technology with High Stacking Yield Using Ultra-Fine Size, Ultra-High Density Cu Nano-Pillar (CNP) for Exascale 2.5 D/3D Integration." *Electronic Components and Technology Conference (ECTC)*, 2016 *IEEE 66th*. IEEE, 2016, all of the forgoing are incorporated herein by reference.

An additional technology that could be utilized to achieve good metal to metal connection is ultrasound energy. Ultrasonic bonding has been used for years in wire bonding. An advantage of the use of ultrasound is having the energy focused in the bonding area allowing the processing to keep the overall temperature low, both to avoid forming defects in the semiconductor active devices and to reduce stress resulting from thermal expansion. For such processing, the chuck could include, for example, ultrasonic transducers instead of the heating elements 412, or in addition to them.

An additional embodiment is to tune the ultrasound frequency to match the bonding pins self-resonant (natural) frequencies for even better targeting of the sonic energy to the desired pin-pad locations. Use of ultrasound for bonding has been reported in a paper by Xu, Penghui, et al., "An ambient temperature ultrasonic bonding technology based on Cu micro-cone arrays for 3D packaging." Materials Letters 176 (2016): 155-158; by Matheny, M. P. and K. F. Graff, "Ultrasonic welding of metals." Power ultrasonics. 2015. 259-293; by Iwanabe, Keiichiro, et al., "Bonding dynamics of compliant microbump during ultrasonic bonding investigated by using Si strain gauge." *Japanese Journal of Applied Physics* 55.6S1 (2016): 06GP22; and by Li, J., et al., "Interface mechanism of ultrasonic flip chip bonding." *Applied Physics Letters* 90.24 (2007): 242902; all of the forgoing are incorporated herein by reference.

A potential challenge for such a stacking process is wafer to wafer variations. There are many sources for such variation and some could be managed by sourcing the wafers in the stack from the same process line being produced, preferably from the same lot using the same stepper. Yet some times this might not be possible or there might be variations that are still too high. During wafer processing such variations could be managed by the stepper equipment periodic alignment and optical magnification or reduction to achieve layer to layer alignment with sub nanometer precision. In a similar way such could be done using thermal expansion to compensate for these local variations.

Figure 5:
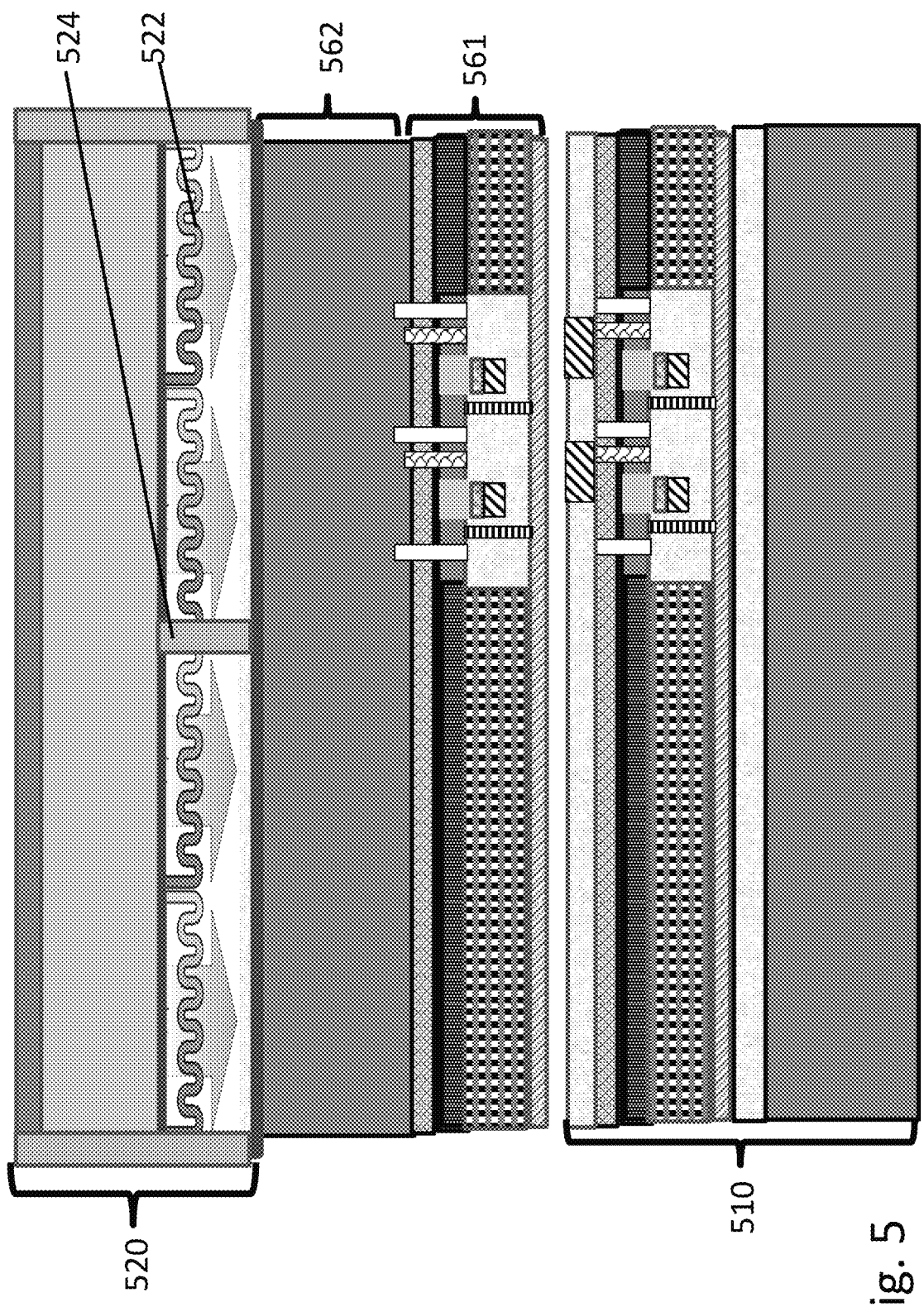
FIG. 5 is an example illustration of a thermal chuck with by area thermal control.

Accordingly the fusion bonding of the wafer described in at least herein could include a thermal chuck with by area thermal control. For example, the thermal chuck can be divided into a number of tiles with the unit thermal control size such as at a reticule or sub-reticule level. FIG. 5 illustrates a section of the structure. A base stratum 510 is being prepared to be bonded to an upper stratum 561 having a substrate 562. The substrate 562 may have been thinned to about 50 microns. The chuck 520 could have a thermal control 522 allowing setting various local temperatures across the wafer. A prior optical measurement could be conducted to measure the required variation to achieve the desired face to face connection. The zones needing expansion could be heated up while the zones needing contraction will be heated less. Chuck 520 may also include by area cooling functions and/or an entire chuck cooling function. Once properly set, the wafer could be bonded achieving good face to face connection. It could be desired to remove the substrate 562 promptly to reduce the overall stress experienced in the structure. The design of the circuit in the upper stratum 561 could account for the potential circuit variation attributes to the expansion or contraction required to achieve such face to face bonding connection.

The chuck 520 structure could include thermal isolation structures 524 so to allow better confinement of the temperature of each zone to better achieve expansion or contraction of different zones to better align to the bonding targets and control the bond wave more precisely. Chuck 520 structure may include temperature measurement devices in each area zone, for example, with an embedded MEMS device/structure, thermoelectric heaters and/or cooling devices/structures, as well as local feedback/proportional control functions/devices. Chuck 520 structure may include micro valves and channels for coolant or heating materials, such as liquids or gases.

A 3D system construction could use a mix of the technologies presented herein and the incorporated references. For wafers that been produced having precise wafer, reticle, and die alignment, a simple stacking process flow and tools might be good enough and then other wafers could be stacked on using more advanced techniques such as the Advanced Smart Alignment technique. These could be integrated with other bonding techniques such as using per zone temperature setting and filling/bonding and forming a via for connectivity afterward using techniques such as smart-alignment. Such mix and match techniques could be engineered to achieve the many times dissimilar objectives such as performance and cost.

Some of the stratum within such a 3D strata could include layers designed to function as, for example, an Electro Magnetic Field "EMF" shield, a power plane, a heat spreader, a heat isolation layer, or as some combination of such. For example, properly designed metal layer may provide some of the above functions. At least these functions and how to achieve them may be found in U.S. Pat. No. 9,023,688, incorporated herein by reference.

Figure 6:
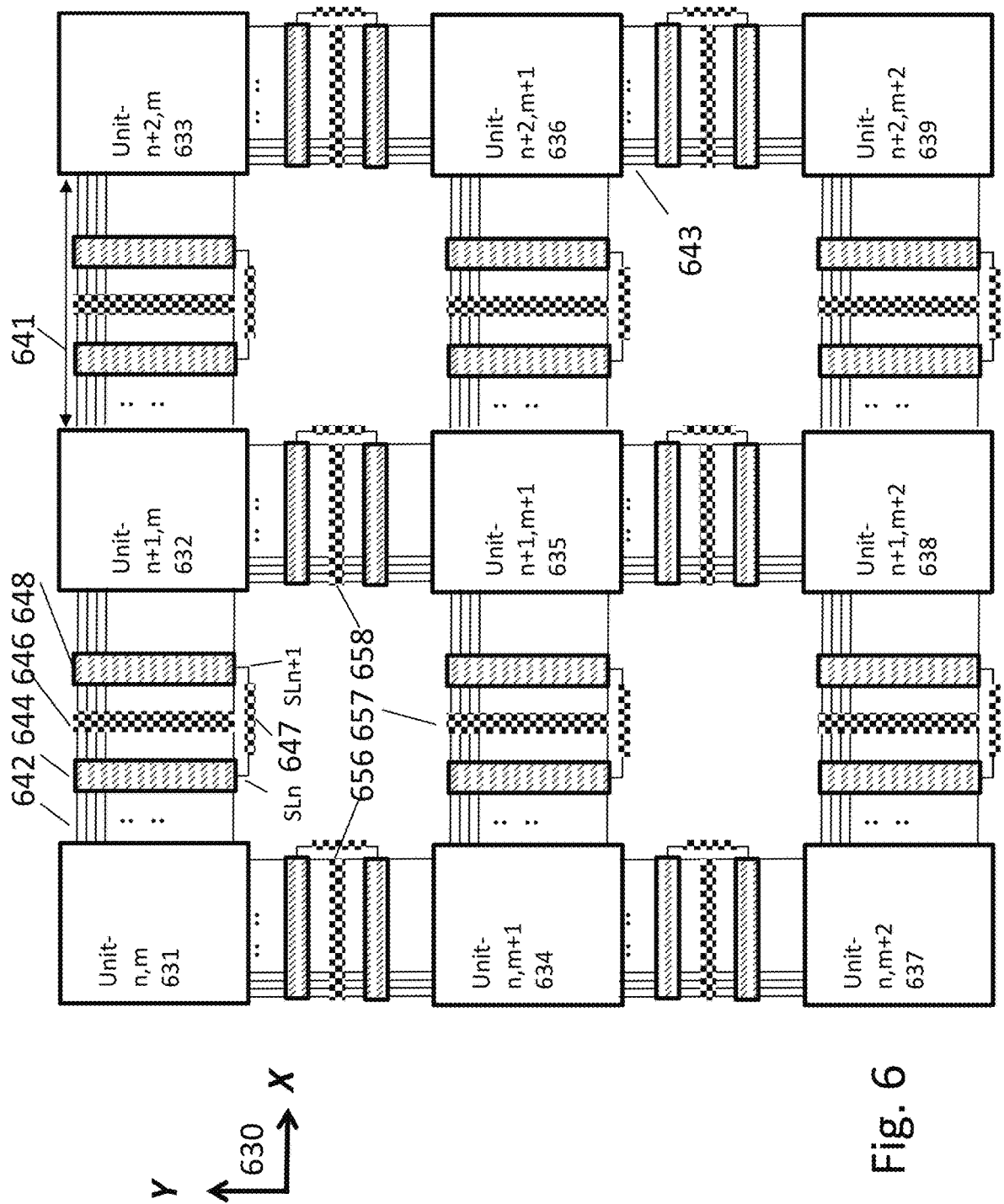
FIG. 6 is an example illustration of a section of a partition an array of memory units.

FIG. 6 is a copy of FIG. 22F of PCT/US2017/052359; the PCT application is incorporated herein by reference. FIG. 6 illustrates a region of one level—also called stratum—of memory of an exemplary 3D memory structure. It is an X-Y 630 illustration showing nine memory array units (631-639). Each unit is a memory array controlled by bit-lines 643 ("BL") oriented in Y direction, and word-lines 642 ("WL") oriented in X direction. The memory control lines, BL, WL, are extended between units through unit select 644, 648 connecting to the unit's vertical pillars connecting the memory control lines between the memory levels 646. Per unit per level select enables the connection of the unit memory control to the vertical pillars, forming a 3D memory, as an array of 3D memory units. Multiple levels of memory stratum stacked on top of each other could be controlled from the top or the bottom by controlling signals and such to the memory control pillars per unit per level select lines. Such top or bottom control could be extended to any 3D memory which could comprise multiple levels of similar or non similar memory technologies. The 3D stack could be formed by stacking fully processed levels/layers or by forming 3D memory processing multiple layers together such as been presented in PCT/US2016/52726 and PCT/US2018/016759. The discussion to follow will present an alternative structure integrating memory fabrics such as is illustrated in FIG. 6 in order to form a 3D system.

Figure 7A:
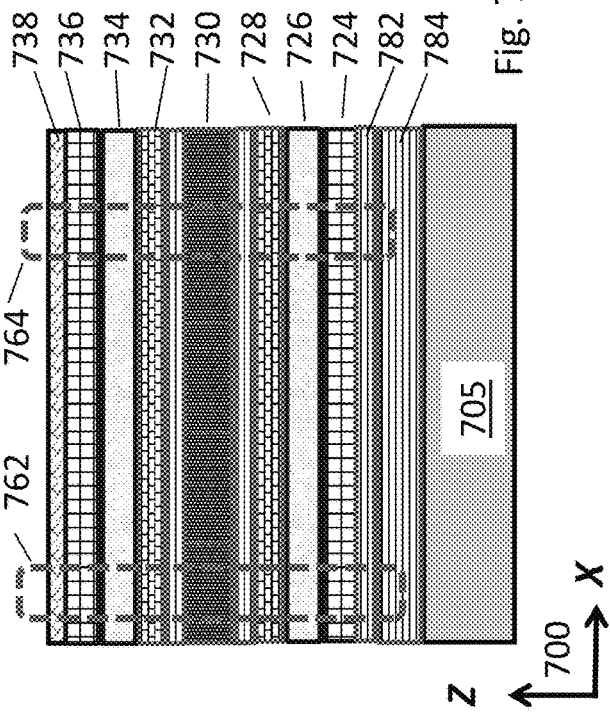
FIG. 7A is an example illustration of an alternative 3D computer system.
Figure 7B:
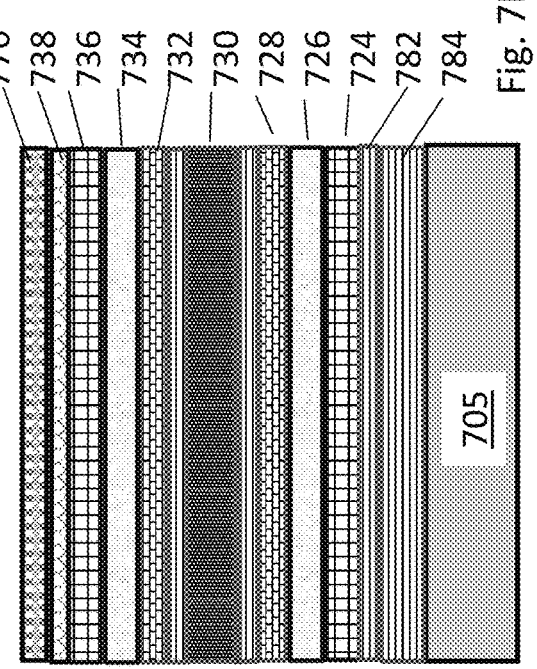
FIG. 7B is an example illustration of a generic 3D memory structure "G3DM"

FIGS. 7A and 7B are a copy of FIGS. 24A and 24B of PCT/US2017/052359 respectively. FIGS. 7A and 7B each illustrate a X-Z 700 side cut to a 3D system having a 3D memory fabric 730 or 750, memory control circuits also called memory peripherals circuits 748, 752, or 728, 732, thermal isolation levels 726, 734, or 754, compute level 724 and I/O level 736 which could connect with external devices to bring data in or export data out, and covered with protective isolation layer 738. This system may be, for example, mounted or formed, on a substrate or additional system 705. The per unit architecture supports parallel computing as the computing processors could be designed to correspond to the memory unit structure. As an example the processor bound by the mark 762 could access the memory unit marked by 762 independent for those related to mark 764 and in parallel to it. Such could be applied for a processing level designed as Graphic Processor Unit ("GPU") so for each processor unit there is one or more corresponding units (all could be marked within the dashed line 764), the 3D memory unit.

The operation of such a 3D system could reference the memory fabric as a dual port memory fabric in which one side of the stack could be used to input and output data access, while the other side could be used for processing the data in the memory stack. Both operations could utilize the same pillars of memory control, preferably by synchronizing access. Such could include time slot allocation or space slot allocation. For example, for space slot allocation one processor could have two or more units in which processing is done in one unit while data input/output is done with the other unit.

An additional advantage to the memory architecture herein as illustrated by FIG. 6 is a flexible memory access. With the proper memory control, the processor access to the 3D memory unit could be to a single bit, 8 bits, 16 bits or even 2024 bits in one memory access. Alternatively, the processor access to the 3D memory unit can be segmented into per-block with arbitrary unit bits selected from single bit, 8 bits, 16 bits or even 2024 bits. This could allow an effective memory access per the designed need.

The recent adoption of neural net and learning algorithms suggests many simple operations, such as multiply and accumulate, to process a massive amount of data. In many of these systems the base elements are called neurons and may need three operand reads (since each neuron MAC operation requires 3 reads, weight, activation and partial sum, and one write-new partial sum). In AlexNet, a well-known reference network in the domain, 3 billion memory accesses are required to complete a recognition. The processor unit could use corresponding memory control circuits to fetch the three operand reads in parallel from its 3D memory unit, and once ready store the result back to its 3D memory unit. The number of bits for many of these processes is less than 16 per operand so more than one such neuron could be processed per one 3D memory unit. For example, with the area marked by 764 could include a 3D memory unit having 8 levels of memories 730, memory control circuits 728 designed to provide three sixteen bit operands for one read, and a multiplier accumulator circuit within its processor fabric level 724. In some memory structures there is a need for a sense amplifier to convert the signal on the bit-line to a logic signal useable for the multiply accumulation function. Such could require 48 sense amplifier circuits on the memory control level. Alternatively, a lower number of sense amplifiers may be provided and the signals are multiplexed in and buffered afterward.

An additional alternative is to mix processing to unit access with processing to cluster of unit access. Thus, in addition to read and to the same unit the 3D system could be designed to support access to a group of units as just a bigger array. In such a mode, for example, the units 631, 632, 634, and 635 could be considered as a larger memory. To access the 2×2 units as a larger memory block the memory control of these units could be designed so the bit-lines and the word-lines are enabled to provide all the selected units, for example, using the vertical pillars 656 & 658 as BL access and the 2×2 block and the vertical pillars 646 & 657 as the corresponding WL access. Accordingly the exemplary 3D system illustrated in FIG. 7A could operate in a per unit mode in which read and write is per unit allowing massive parallel operation, and in another mode in which multiple units are functioning as part of a bigger array and data could be read or written across units. Such mode of data transfer between units could reduce the effectiveness of the system and additional techniques for across units data transfer could be useful.

Figure 7C:
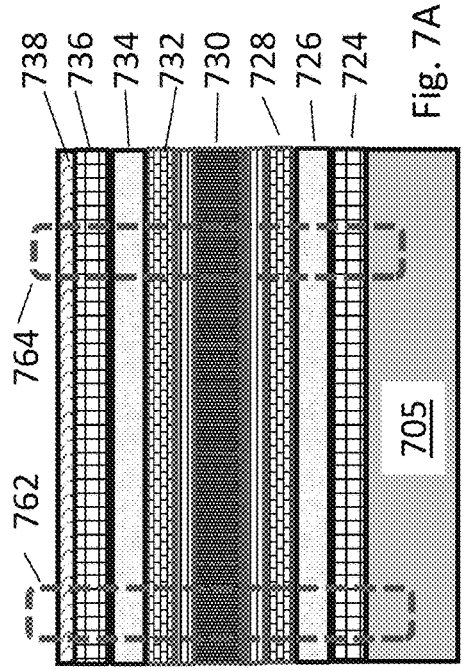
FIG. 7C is an example illustration of the 3D system of FIG. 7A with an additional level of global memory connectivity and associated additional stratum.

FIG. 7C illustrates the 3D system of FIG. 7A with an additional level of global memory connectivity 784, connected with its own control logic 782 to the per unit processor level 724. In a class of data intensive processors such as could be designed for neural networks and deep learning, massive amounts of data need to be manipulated including transferring partial sums generated in computing data from one unit 764 to be later process in another unit 762. In many of these processes the data transfer is part of the matrix multiplication and could be done in regular processes in parallel between many units.

Figure 7D:
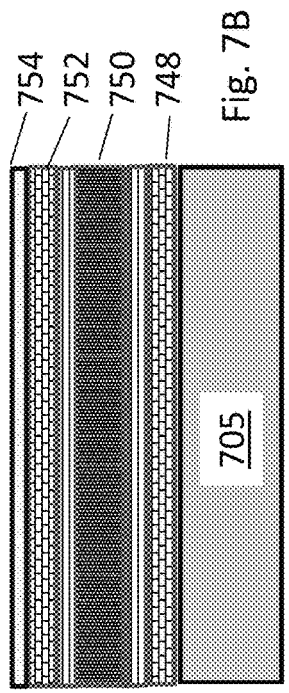
FIG. 7D is an example illustration of the 3D system of FIG. 7C with an additional layer of sensors.

FIG. 7D illustrates an additional alternative 3D system. It illustrates adding an additional layer of sensors 770 which could be connected in parallel to the underlying structure. Such sensors could be image sensors or bio sensors for which the massive parallel connection between the sensing elements—pixel, and the control elements could be very effective.

An alternative fabric could include buses oriented in the X direction and buses oriented in the Y direction. Such buses could include eight to sixteen data lines: about six to eight unit address bits and two to four control signals. These buses could be a single line per bit or a differential line with two lines per bit. These buses could include re-buffering electronic support to reduce the effect of the line's RC. These buses could include mixed length buses such that cover of the full length of the system in the X or Y direction to buses that are shorter, such as a half-length, quarter length and so forth, down to the length of two units.

Figure 8A:
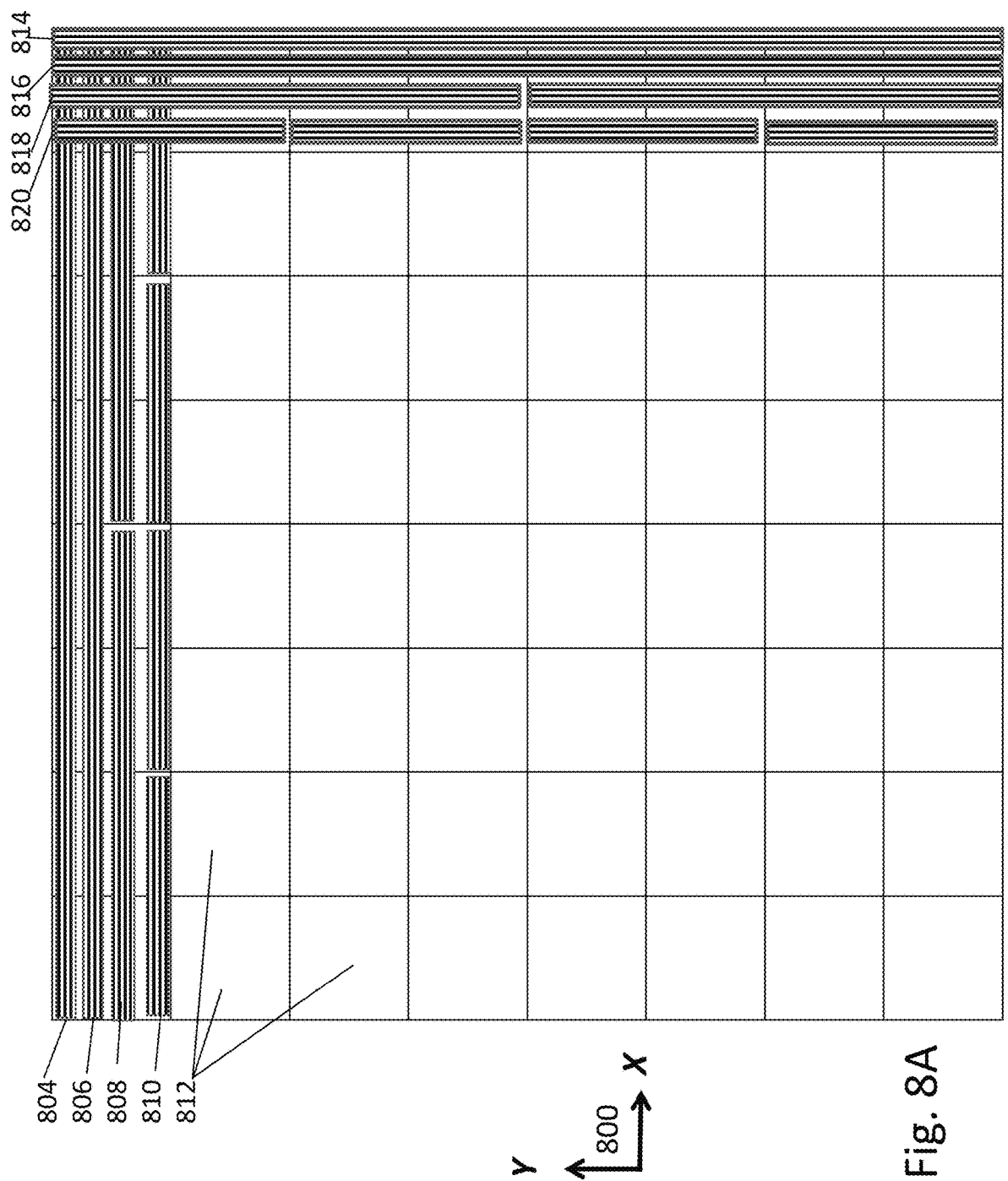
FIG. 8A is example illustration of an X-Y view of an 8×8 units 3D system having units with busses illustrated for one row and one column.

FIG. 8A illustrates an X-Y 800 view of 8×8 unit 3D system having units 812 with buses illustrated for one row and one column. It illustrates buses that extend through the full size 804, 806, 814, 816, buses that span four units 808, 818, and buses that extend over two units 810, 820. The 3D system could leverage many of the techniques used in GPUs to have control per unit as GPU has per processor and control of cluster of units or even the full structure similar to the central control of GPU.

Figure 8B:
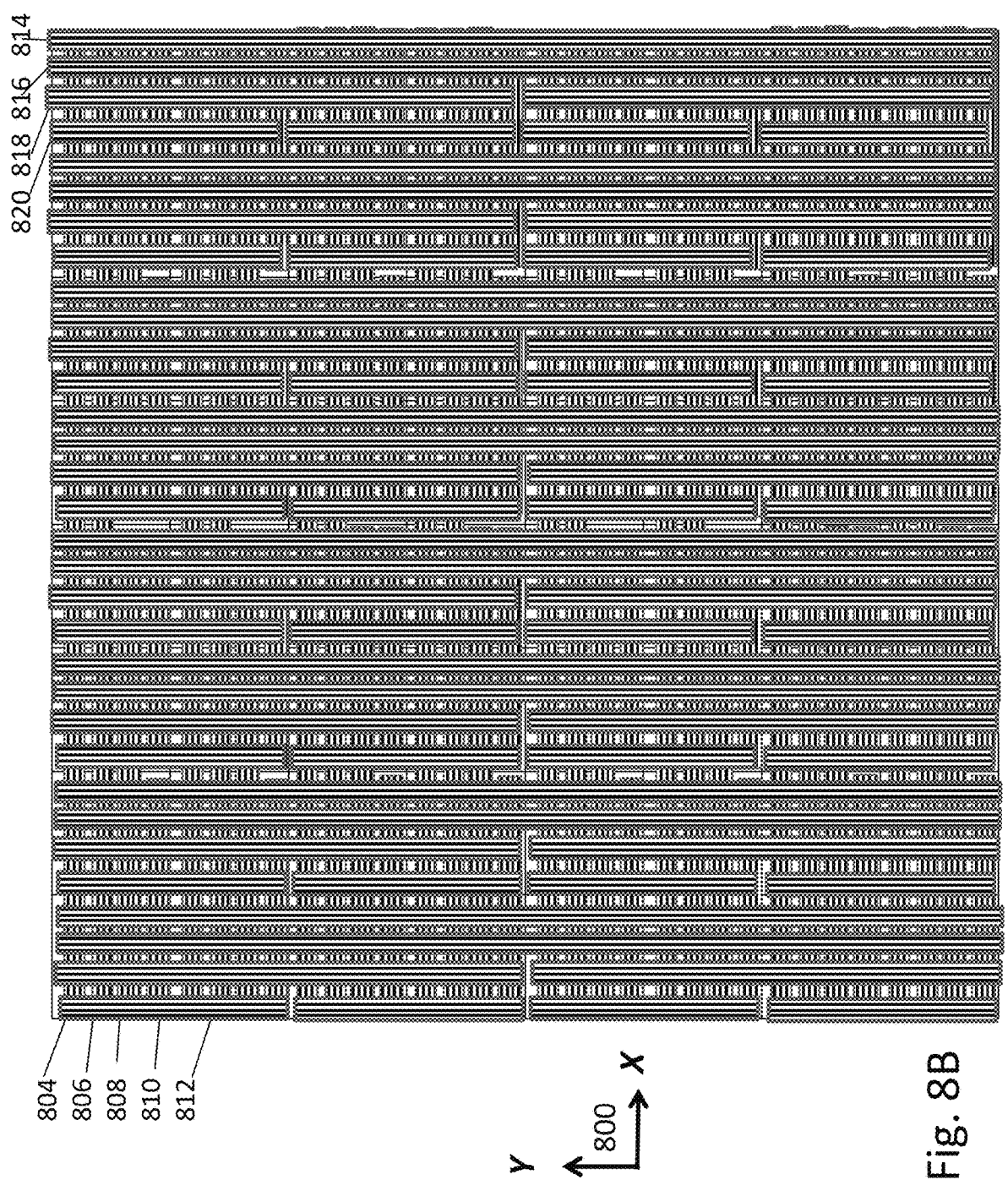
FIG. 8B is example illustration of an X-Y view of an 8×8 units 3D system having units with busses illustrated for substantially all rows and columns.

FIG. 8B illustrates the structure illustrated in FIG. 8A showing the buses overlaying substantially all units.

These across unit array data exchanges buses could be managed by the central system control circuits. These buses could function as a synchronized data exchange and could use differential data communication using centralized clocking to activate the active differential amplifiers to convert the differential signaling to conventional CMOS signaling, similar to what has been presented in U.S. Pat. No. 7,439,773, PCT/US2016/52726, and also U.S. Pat. No. 8,916,910, and U.S. application 2017/0170870, all are incorporated herein by reference.

Figure 16D:
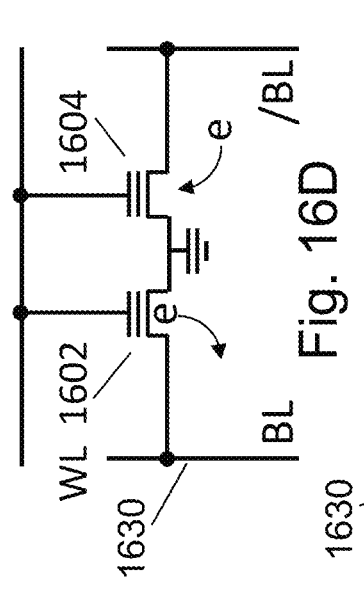
FIGS. 16A-16F are example illustrations of a unit differential memory element based on 3D NOR or 3D NOR-P.
Figure 16E:
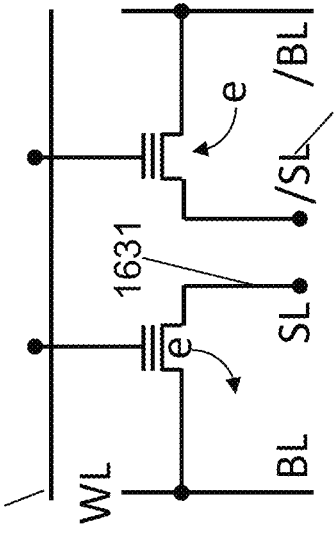
Figure 16F:
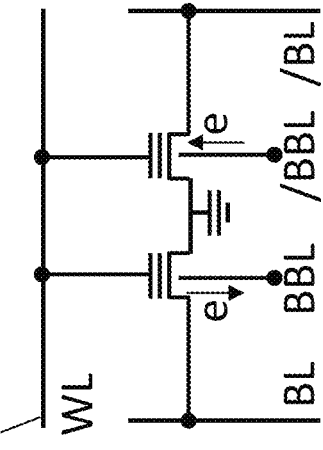
Figure 16A:
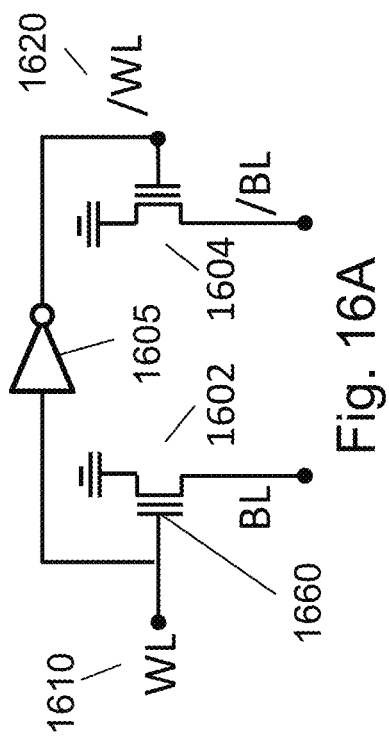
Figure 16B:
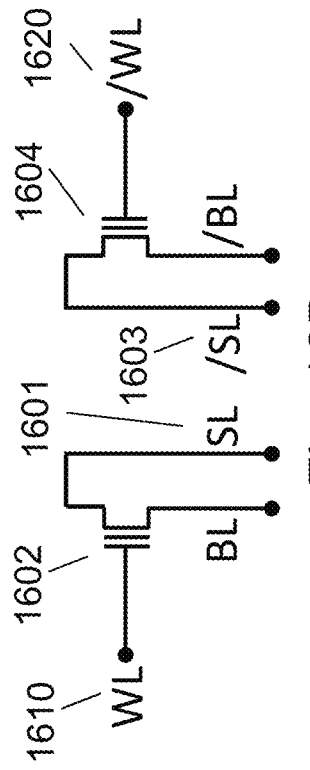

FIGS. 9A & 9B are copies of FIG. 16A &16B of PCT/US2018/016759 respectively, and FIG. 11 herein is a copy of FIG. 34A of the same PCT. These figures present an X-Y cut 2500 view of a 3D NOR-P structure as detailed in the PCT/US2018/016759.

An alternative to the ridge-select, in word-line horizontal transistors RS1-RS8 of FIG. 9A, is to have a select device for each of the S/D pillars, which is a pillar select similar to the one used in 3D NAND, often called a drain select, such as is illustrated in FIG. 10 herein. FIG. 10 herein is copied from FIG. 1 of U.S. Pat. No. 8,673,721, incorporated herein by reference. A control signal along the X direction could control the gate of these per pillar transistors functioning as ridge select similar to control signal SSL0-SSL2 of FIG. 10.

An additional alternative is to have row of S/D pillars relatively shifted to form a checker board type pattern with odd and even rows, as is illustrated in FIG. 12A which is the corresponding modification of FIG. 11. This also resolves the issue resolved by the tails 2530 of FIG. 9B forming odd (BL1-BL5) even (BL2-BL4) bit lines. FIG. 12B provide more details of some alternative 3D NOR-P structures having odd and even rows of S/D pillars (and channel pillars in between).

Staggered "Punches" in adjacent rows help to decouple between adjacent row of cells belonging to the same WL using single layer Global Metal Bit Line ("GMBL"), featuring: Accommodation of Odd and Even Y-Mux/SA at the bottom & top of array to simultaneously read/write/erase all cells along a given WL with as much as ×2 improved performance and without excessive array area blow-up. Using Column bias (positive voltage) may provide: Avoid disturb between adjacent cells (same "punch" row) during write. Enhanced cell current during read if excessive leakage along entire BL and undesired read disturb are acceptable. And reduced power as the need for voltage boosting may be avoided during read operation.

The 3D memory presented in PCT/US2016/52726, PCT/US2017/052359, and in PCT/US2018/016759 referenced as 3D NOR and 3D NOR-P could be designed for high speed applications using a very thin (less than about 1 nm) tunneling oxide or even no tunneling oxide. For such thin tunneling oxide, the retention time could be extended by an electric field formed either by the gate (Wordline) and/or by the "body" (the channel side). For example, when the programmed memory state represents the electrons being stored in the charge trap layer, during the stand-by mode, a positive holding voltage that is not exceeding the programming and read conditions is applied to the wordline or a negative holding voltage that is not exceeding the erasing voltage is applied to the body terminal.

To reduce leakage induced charge loss through the S/D, it could be preferred to have the S/D floating. These extend-retention voltages need to be removed prior to accessing that part of the memory. Having a 3D architecture with many relatively small units (about 200 microns a side size) with periphery control on top and/or underneath could make such extend-retention useful. It could be designed to control the S/D and WL with fine granularity to reduce the required energy in transition from hold state with extend-retention biasing to active state for read, write or erase.

Extending retention using the body could be done by placing a negative voltage on the body (See FIG. 27A-7C of PCT/US2018/016759). Accordingly it could be desired to make the body pillar independently controlled and only change the specific pillar when changing from hold to active. It could be desired to construct the body of a 3D NOR-P memory with top select and bottom select similar to SSL and GSL of FIG. 10 herein. Either the top or bottom select could be used to provide the general holding negative bias while the other select to provide the desired body voltage to the specific active operation (read, write, erase).

The following tables include example voltages to be placed on a target active cell, and its potential impact for the adjacent cell (3D NOR-P):

| For Read operation: | | | | |
|---|---|---|---|---|
| | $V_S$ | $V_D$ | $V_G$ | $V_{Body}$ |
| Target cell | −VDD | 0 | VDD | 0 |
| Adjacent Cell along same WL | −VDD | Float | VDD | −VDD |
| Cells along same S/D (Bitlines) | −VDD | 0 | 0 | 0 |

Notes:
VDD could be about 1.8 v, the designed threshold shift of programmed cell (Vt) could be about 1 v.

| For Write (Program) operation: | | | | |
|---|---|---|---|---|
| | $V_S$ | $V_D$ | $V_G$ | $V_{Body}$ |
| Target cell | −VPP | VDD | 2VPP | 0 |
| Adjacent Cell along same WL | −VPP | Float | 2VPP | −VPP |
| Cells along same S/D (Bitlines) | −VPP | VDD | Float | Float |

Notes:
VPP could be about 3 v using DSSB structure with thin O/N/O.

| For Erase (FN) operation: | | | | |
|---|---|---|---|---|
| | $V_S$ | $V_D$ | $V_G$ | $V_{Body}$ |
| Target cell | Float | Float | −10 | +10 |
| Adjacent Cell along same WL | Float | Float | −10 | +10 |
| Cells along same S/D (Bitlines) | Float | Float | −10 | +10 |

The memory could be designed with common control lines so while accessing a target cell the adjacent cells may share some of these control signals and could be designed not to disturb as the tables above indicate. Adding more select transistors to reduce the impact on adjacent cells is desired but cost and density effects need to be considered in such memory design, which in most designs will result in sharing some of the target cell signals with some of the adjacent cells in X, Y or Z directions.

An additional option is to design the memory control to support single bit erase. One option to do so is presented in the following:
Assuming DSSB device with ~1E18/cm^3 B channel doping and Ni silicide based. When a large voltage bias is applied on the metal junction, such as source voltage of 5V ($V_S$) and channel bias of -5V ($V_{ch}$) while the gate bias is-10V ($V_g$) and while the drain side is floating. All the rest of WLs along the same BL & Channel columns are in an inhibit mode with a voltage of +5V or 0V. The (first order) arguments follows electron injection in a DSSB device, assumed to feature ~20 ns program pulse carried out using a device with:
  Electrons barrier for emission from the metal junction into the channel featuring ~0.4-0.5 eV for typical Ni silicide based metal junction.
  The junction electric field brought about by the segregated doping concentration and the applied voltage results in:
    Lateral field of ~3.5 MV/cm at the junction edge which implies a tunneling distance of ~0.4-0.5 eV/3.5 MV/cm=1.15-1.45 nm
  Vertical field of ~6 MV/cm in the ONO (Assuming 10 nm thick) and maximum Si field of ~2 MV/cm while ~8V Gate-channel bias is applied.
In light of the above, single bit erase conditions can be appreciated, the barrier for hole emission from the metal junction into the channel is ~0.6-0.7 eV while the lateral field induced by the Segragated Doping is in opposite direction (~2 MV/cm), effectively increasing the effective barrier.

Setting the channel voltage at $V_{ch}=-5V$ and the source voltage at $V_S=5V$ while the gate at $V_g=-10V$ results in total lateral bias of >11.5V (1.5V due to gate contribution). However, the voltage drops actually fall mostly on the pn junction inside the channel, between the segregation region (Arsenic or phosphorous ~5E19/cm^3) and the channel (B ~1E18/cm^3). The depletion region under these circumstances is expected to be ~35 nm on which a 11.5V drop occurs.

This will provide a lateral field of ~3.5 MV/cm to generate Band-To-Band-Tunneling (BTBT) wherein the generated holes are accelerated along the channel and injected into the ONO under the net total vertical field. The lateral field induces field emission with a tunneling distance of ~1.12 eV/3.5 MeV~3 nm which is significantly larger than the electron's counterpart. However, as indicated in the literature, BTBT mechanism is typically enhanced by trap assisted tunneling, thus it is expected to be with better efficiency. For injecting holes from the channel into the ONO both the net vertical field and bottom-oxide barrier for hole injection should be considered as the barrier for holes is larger than for electrons (4.2 eV vs. 3.2 eV), thus erase efficiency compared to program is degraded. Using Vg=-8V and Vchannel=-5V gives a total vertical bias of -5V while assuming ONO=10 nm. This implies a lower ONO field under erase conditions compared to program operation, <3 MV/cm vs. 6 MV/cm, respectively. Increasing the gate bias may improve efficiency further BUT may be result in breakdown of the ONO as at the total bias in erase operation at the junction region is 13V, which implies a field of 13 MV/cm.

An additional effect is the alignment of injected holes to trapped electrons. As localization diverges, erase time is expected to increase, thus keeping hole injection localized is preferable as much as possible, for example, by using enhanced channel doping. Single bit program and erase operations as outlined above could enable a dense array as the need for isolation between adjacent cells along the same WL as common in a typical SB (DSSB) device could be avoided. Thus, as much as a 33%% smaller cell size could be achieved.

The low program and erase voltages as depicted in the table above is yet another feature of the invention.

FIG. 13A illustrates a top view (X-Y 1300) of 3D NOR-P structure similar to FIG. 9A. The change with reference to FIG. 9A is having pull-down pillars 1307 for the word lines for unselected ridges so the unselected word-lines are not left floating but rather are being pull down through high resistivity pillars 1307. In some applications a second ridge select could be constructed instead of the pull-down pillars. With select transistors on both ends of the word-lines, an active bias could be used such as had been previously suggested for retention extension. It could be noted that the density impact in the Y direction for such second ridge-select could be reduced as in the structure as is illustrated by the enabling of a ridge select in one side, such as RS4, corresponds well with enabling of bias for the adjacent ridges word-lines, WL3 and WL5.

For high speed applications the very thin tunneling oxide of less than 1 nm could be combined with a relatively thin blocking oxide of about 3 nm. A reduced O/N/O thickness could also support reduced write voltages and reduced power consumption accordingly. Also the use of body could allow reducing the gate line voltage with corresponding support from the body line for write and erase.

Additionally, the 3D NOR-P architecture could support operation of the memory structure with a reduced thickness of the channel and the corresponding word-lines to about 10 nm.

Additionally, some classes of 3D NOR or 3D NOR-P memory family that doesn't have a body contact could combine the concept of floating body with floating gate or charge trap in a similar way to the technique presented in U.S. Pat. No. 8,036,033, incorporated herein by reference. The 3D NOR memory cell as presented in PCT/US2016/52726 and PCT/US2018/016759, is a floating body having also a floating gate or charge trap or non-volatile feature such as resistive switching memory, ferroelectric switching, phase change memory. Accordingly, the techniques presented in U.S. Pat. No. 8,036,033, for direct transfer from the volatile portion to the non-volatile portion, could be adapted for the 3D NOR or 3D NOR-P memory. Such techniques support high speed memory operation by using the volatile memory feature with a power down option using direct transfer to the non-volatile portion prior to power down, and a quick low-power power-on memory reconstruction by direct transfer from the non-volatile portion back to the volatile portion.

An additional enhancement maybe derived from PCT/US2018/016759. A few alternatives for stair-case per layer contact are suggested such as in reference to its FIG. 18 and FIG. 47A. These per layer programmable per layer contact ("PPLC") could be formed in the slits such as 4102 of its FIG. 32E or 2202 of its FIG. 13A. Many 3D memory structures use slits formed between ridges to be used for source contacts and gate replacement access. These slits could also be used for the PPLC reducing the need for the Y oriented per layer access structure and in some cases reducing the need for per layer ridge select transistors. Additionally, the formation of the diode 5652 of its FIG. 47B could utilize the technique presented in He, Jin, et al. "A compact CMOS compatible oxide antifuse with polysilicon diode driver." *IEEE Transactions on Electron Devices* 59.9 (2012): 2539-2541, incorporated herein by reference. And the formation of sealing such as 4052 of its FIG. 31F could utilize the technique presented in U.S. patent application publication 2018/0090368, incorporated herein by reference.

As discussed in respect to FIG. 7A-7D some of the levels in the stack could be a multilayer memory structure such as 3D NAND or 3D NOR. As discussed, such levels could have a level select to select them to become active within the stack. FIG. 13B illustrates an alternative in respect to FIG. 6 focusing on single unit 1330. In a case wherein a level within a 3D stack includes many memory levels, additional pads 1332 could be used as global pillars to allow top control for a specific memory layer within the 3D memory level. The per-layer connection could leverage staircase or programmable per layer contact. The stack could include such global Z-level memory control lines per unit as is illustrated. It could be designed to have at least the number of pillars to accommodate the maximum levels within the 3D structure, which are about 96 layers in today's state of the art. The Y memory select pillars 1338 as previously discussed are about 2,000 per unit and so too could be the X memories select 1334. The pillars providing the level select are illustrated close to the unit corner 1336. Such a stack could be designed by an artisan in the memory art to allow overlaying or underling of the memory layer(s) control circuitry to control the respective memory by providing the proper signals to these global pillars (1332, 1334, 1336, and 1338). Such an artisan could engineer the pad structure in consideration of the required control line pitch limited by the wafer bonder precision and the choice of alignment techniques presented herein and the incorporated by reference art.

In current 3D NAND technology some vendors are using serial stacking due to the limitations of punch-holes etch technology. In these process flows a first group of layers are going through punch-holes etch and then more layers are deposited to be followed by a second step of punch-holes etch. Such an approach would greatly extend the overall processing time. The techniques presented herein could provide the advantages of a semi-parallel process. First multiple stacks could be processed in parallel including punch-holes etch and other processes. Then using techniques presented herein, a full memory stack could be formed. These could allow a memory structure with hundreds of memory levels and not have the cost of a fully serial process flow.

FIGS. 13C-13F illustrate a method of forming a multilayer base structure by having in parallel two or more multilayer structures and then transfer one on top of the other to make them into one stack. For example, oxide/nitride stacks are fabricated in two or more different wafers in parallel and then stacking of oxide/nitride stacks are repeated to double or triple or quadrupled until it reaches to the desired number of stacks. Such can increase the throughput of fabricating the multilayered films. In addition, the multilayered thin film wafer can be fabricated in one fab and then supplied to another fab for subsequent fabrication. These illustrations are a cut view in X-Z (or Y-Z) direction 1340.

Figure 13E:
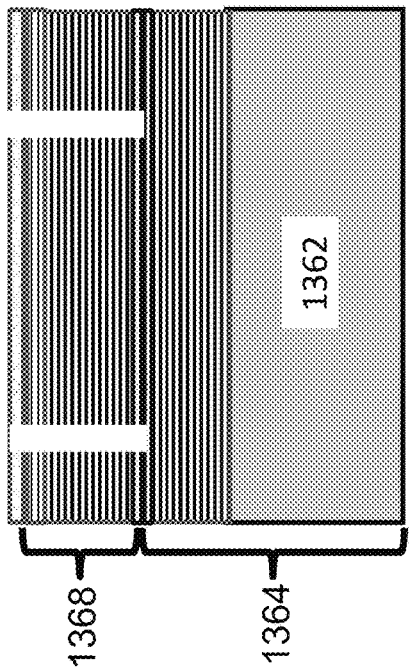
Figure 13F:
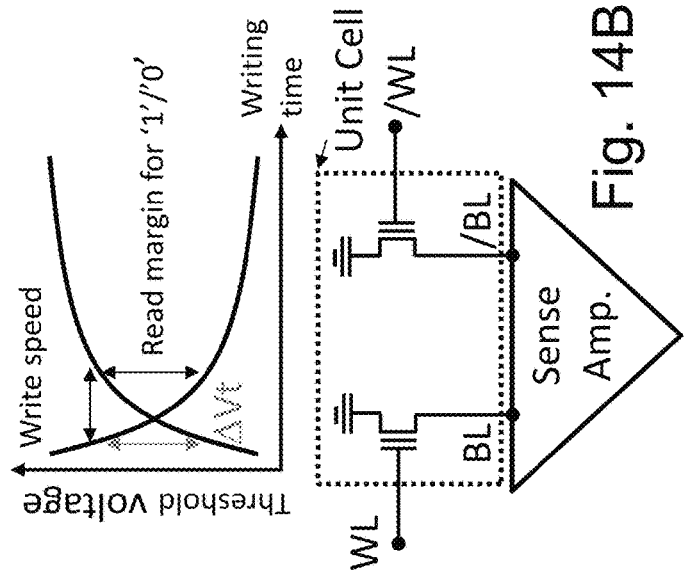

FIG. 13C illustrates a multilayer structure 1348 being formed on a cut layers 1346, 1344 over carrying wafer 1342 used as the base substrate. FIG. 13D illustrates the structure after etching holes 1352 substantially all the way to the 'cut layers' 1354, 1346 and etching them. There are multiple alternatives that could be engineered using this concept. The multilayer structure could be of single crystal formed using epitaxial growth as presented in PCT/US2016/52726. The cut layers could be any of the options presented there or SiGe such as presented in PCT/US2017/052359. In such case, the SiGe layer could be 1344 covered by buffer layer 1346 such as silicon. The etch of the cut layer could be full etch or leaving small post or forming porous layer as could be engineered by an engineer in the art of layer transfer. The multilayer 1348 could be those used today for 3D NAND such as alternating silicon oxide and poly or alternating silicon nitride and silicon oxide. The cut layer could be selected to fit the multilayer material to have good selectivity so etching through the opening 1352 would have minimal effect on the holes 1352 side walls. For example, it could be nitride for poly/oxide multilayer, and poly for oxide/nitride multilayer. The opening 1352 could be special large size holes formed in between designated memory banks zones such as designated dice lines. In some application the holes 1352 could be part of the functional holes in the memory zone such as slit holes or even channel holes. Use of functional holes could be combined with the use of precise bonder for the following bonding step combined with the proper structure design which may include some connectivity layer in-between the multilayer stack. FIG. 13E illustrates the multilayer stack structure after flipping the structure of FIG. 13D 1366 and bonding it on top of a similar multilayer base structure 1364. The upper layer 1350 of the multilayer stack structure could function as the bonding layer. FIG. 13F illustrates the multilayer stuck structure after cutting off the donor carrier wafer 1342. This could be utilizing techniques which would allow reuse of the base wafer 1342, or techniques in which the cut step is destructive such as etching off the carrier wafer 1342. For destructive techniques the step of holes 1352 forming could be skipped. The method could be extended for forming multilayer stacks of multiple bonded multilayer structures.

The stacking method presented here could be used to keep adding unprocessed multilayer structure 1368 using a simple bonder and then perform all the steps as used today in 3D NAND processing. Alternatively a precise bonder could be used so the transferred multilayer structure could be processed before to include many of the processes such as slit forming, layer replacement, channel holes etc.

An additional alternative is to use the 3D NOR or 3D NOR-P with two sites for one bit in a differential mode. Differential mode has been proposed for 2D memory structures in at least U.S. Pat. Nos. 5,754,477, 6,765,825, 6,950,342, 7,808,823, 8,320,193, and 8,422,294, all incorporated herein by reference. Differential mode could be considered less dense as two sites are used for one bit, yet it provides a far faster write and read including single cell write and read. Differential mode also effectively provides symmetrical times for write and erase as the erase of one cell is a write of the other cell. It could be preferred to choose the two storage sites being in adjacent cells to keep the control lines symmetrical for even better performance.

Figure 14A:
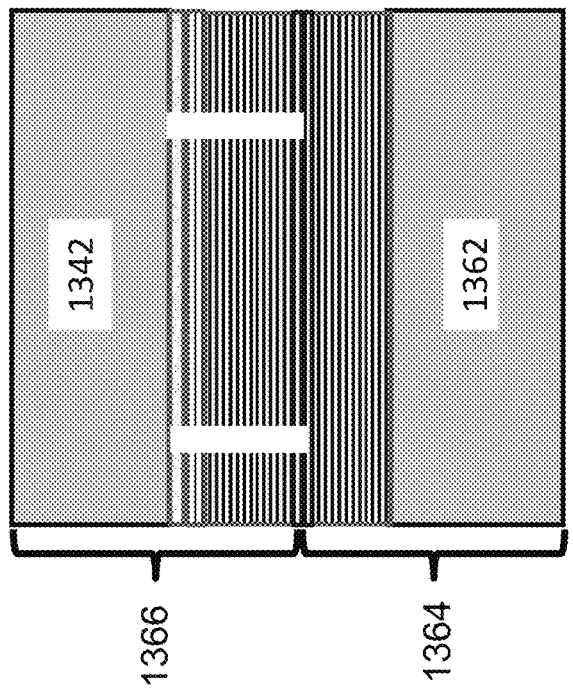
FIG. 14A is an example illustration of conventional charge trapping memory with the memory state sensed with its bit line voltage compared with a reference voltage.
Figure 14B:
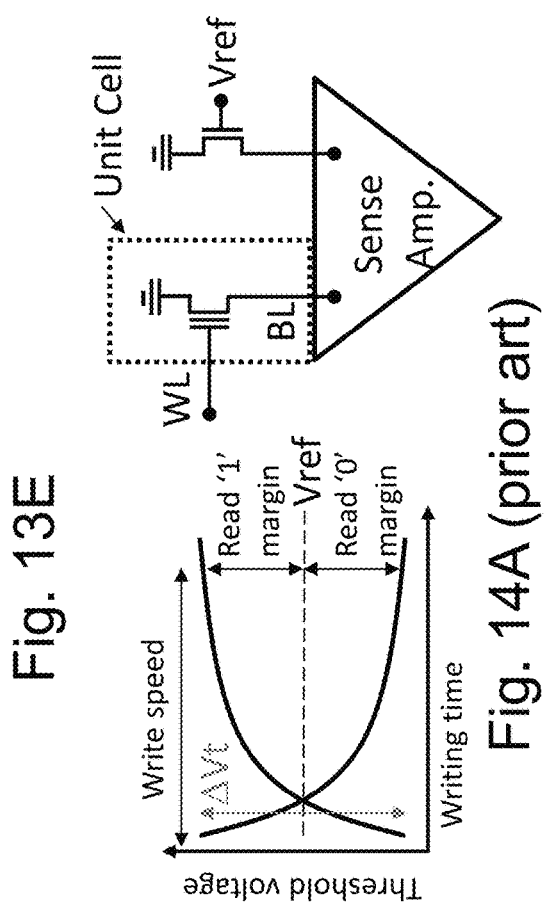
FIG. 14B is an example illustration of a differential charge trapping memory architecture.

In conventional charge trapping memory, the memory state is sensed with its bit line voltage compared with a reference voltage as shown in FIG. 14A. In the conventional memory, the memory read margin is determined by the voltage difference between a reference voltage and the threshold voltage of a programmed state and an erased state. The writing time is determined by the time required for the threshold voltage to be shifted to yield the desired read margin. For the differential charge trapping memory architecture, the complimentary bits are programmed at a first sub-cell and a second sub-cell as shown in FIG. 14B. The first and second sub-cells are differentially connected so if one sub-cell could be programmed then the other sub-cell could be simultaneously erased. Similarly, if one sub-cell is erased then the other sub-cell is simultaneously programmed. In such a differential mode memory, the memory read is carried out by simply measuring the voltage difference between BL and /BL, thus eliminating the need for an external reference cell. In the charge trapping memory, the rates of charge trapping and de-trapping are largest at early program/erase time and then they slow down as the program/erase time continues. Therefore, the differential mode improves the program/erase speed more than twice compared to the conventional mode. Alternatively, at a given program/erase time, the differential mode could reduce the program/erase voltage (substantially reducing power) to get the same read margin compared to the conventional memory. For differential mode, the threshold voltage shift of each sub-cells to exhibit the target read margin could be smaller than the conventional mode. Therefore, the stress to the tunneling oxide could be reduced, resulting in improvement of cyclic endurance. Consequently, due to the improved endurance, post-cyclic retention could be improved for the differential mode. In addition, the differential mode becomes variation tolerant because the reference voltage is a relative value with respect to a potentially adjacent sub-cell whereas the conventional memory uses a fixed reference voltage level for all memory cells.

FIGS. 15A-15D illustrate examples of the differential memory placements and bit line architecture using 3D NOR or 3D NOR-P. As shown in FIG. 15A, a first memory sub-block unit 1501, a second sub-block 1502, and sense amplifier 1510 and its associated supporting logic are arranged side by side along the x-direction, where two memory sub-blocks storing complimentary bits and the sense amplifier and its associated supporting logic is placed in between two sub-blocks. This architecture forms an 'open bit-line' arrangement. As shown in FIG. 15B, a first memory sub-block 1501 and a second memory sub-block 1502 are arranged side by side along the y-direction and the sense amplifier 1510 and its associated supporting logic is arranged on their side along the x-direction. In this architecture, the y-size of the unit sub-block can be as small as one memory transistor, forming the memory sub-ridge. This architecture forms a 'folded bit-line' arrangement. FIG. 15C illustrates another open-bit line architecture where the first memory wafer (where a first memory sub-block 1502 substantially resides), the sense amplifier 1510 and its associated supporting logic wafer, and the second memory wafer (where a second memory sub-block 1501 substantially resides) are stacked. Thanks to wafer stacking, the logic area could be equivalent to the foot-print of the memory block, which enables an even finer granularity memory unit access and thus results in an improvement in bandwidth and latency. This configuration is illustrated in FIG. 15D.

Figure 16C:
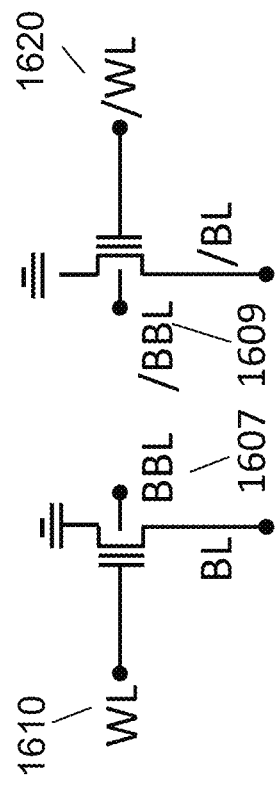

FIGS. 16A-16F illustrate examples of the unit differential memory element based on 3D NOR or 3D NOR-P. As one embodiment of the present invention, FIG. 16A shows a single WL 1610 being used which is directly connected to a gate 1660 of the first sub-cell 1602 and the inverted voltage (/WL) 1620 is connected to a gate of the second sub-cell 1604 through a respective inverter circuit 1605. The inverter circuit 1605 may reside as a part of logic devices near the sense amplifier. Another embodiment of the present invention may leverage localized charge trapping storage sites near source and drain sides as shown in FIG. 16B. A source line (SL) 1601 is connected to a source region of the first sub-cell 1602 and /SL (inverted SL) 1603 is connected to a source region of the second sub-cell 1604. The role and functions of SL (or /SL) and BL (or /BL) are interchangeable in order to attain multi-bit differential memory. Combinations of source-side or drain-side hot-carrier injections may be used for localized programming. The reciprocal programming may be achieved by a combination of hot-hole injections from source-side or drain-side. Four possible programmed states may be achieved at a cell, source-side trapped and drain-side detrapped, source-side detrapped and drain-side trapped, both side trapped, and both side detrapped. The programmed states of source-side trap site and drain-side trap site may be opposite from the first sub-cells to second sub-cells. The devices with FIG. 16B may also be used as a single-bit cell. As another embodiment of the present invention, particularly for the 3D NOR or 3D NOR-P having a body tap, is shown in FIG. 16C. Additional control line connected to the body tap and called back-bias line (BBL) 1607 is supplied. A BBL 1607 is connected to a body of the first sub-cell and BBL 1609 (inverted BBL) is connected to a body of the second sub-cell. The BBL 1607 and /BBL 1609 are orthogonal to WL 1610 and /WL 1620. For programming operation in such configuration, a target bit selection can be made by a selected pair of WL 1610 and BBL 1607 and /WL 1620 and /BBL 1609, and programming may be accomplished at the selected cell through the FN tunneling mechanism. In addition, for example, BBL 1607 and /BBL 1609 may be used to extend charge retention time during stand-by mode by applying a slight negative voltage such as −0.5 V to form an electrical potential barrier across the charge trap to the channel. While high voltages to WL 1610 and /WL 1620 may be used to inject electrons into the storage site, high voltages to BBL 1607 and BBL 1609 may be used to remove electrons from the storage sites. Typically, the electron removal (erasing) is slower than the electron injection (programming). In order to tackle the asymmetry in writing and erasing time, the use of BBL 1607 and BBL 1609 may make the electron removal time similar to the electron injection time to get a desired threshold voltage level. For this, the erasing voltage applied to BBL 1607 may be greater than the programming voltage applied to WL 1610.

Other embodiments of the differential memory element may use a common WL for the first sub-cell and the second sub-cell as shown in FIGS. 16D-16F. The implementation of common WL in differential memory element may be natural for the first and second sub-cells being physically neighbored side-by-side at the same level (floor) of 3D layer within the same ridge or the same block. One embodiment of using common WL 1630 is FIG. 16D. The charge injection and charge removal may be achieved by FN tunneling through BL region. A multi-bit differential memory may be available by adding independently controllable SL 1631 to a first sub-cell 1602 and /SL 1633 to a second sub-cell 1604, similar to the mirror-bit concepts explained in FIG. 16B. In addition, the body tapped structures exemplified in FIG. 16F may present the similar benefits explained in FIG. 16C.

For the differential memory sharing common WL as seen in FIGS. 16D-16F, two step writing may be used. The programming operation may be conducted to the first sub-cell 1602 followed by the erasing operation to the second sub-cell 1604. Alternatively, the erasing operation may be conducted to the first sub-cell 1602 followed by the programming operation to the first sub-cell 1602. The erasing time and the programming time may be different. For example, the erasing time may be longer than the programming time. Alternatively, the erasing time may become the same as the programming time by increasing the erasing voltage and the electric field associated with the erasing operation.

In another embodiment of the present invention, the first sub-cell stores a memory state between erasing and programming states but the second sub-cell does not store a memory state but solely serves as a reference transistor.

Figure 17A:
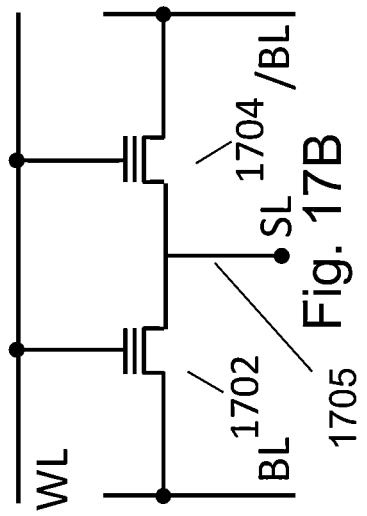
FIGS. 17A and 17B are example illustrations of another embodiment of a differential memory cell.
Figure 17B:
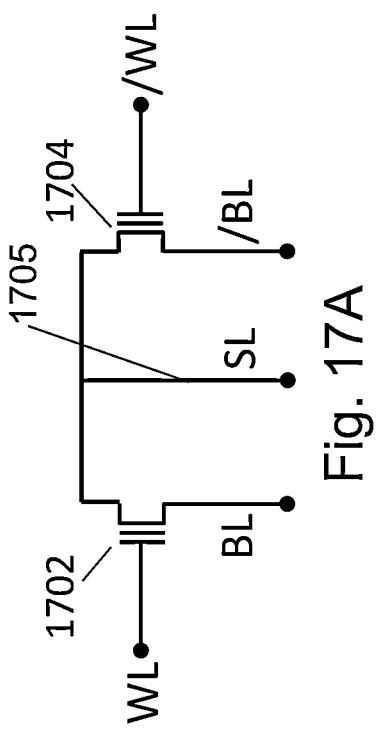

FIGS. 17A and 17B illustrate another embodiment of a differential memory cell. The presented embodiment features that the first 1702 and second 1704 sub-cells shares a common SL 1705. Differential memory cell sharing grounded S/D as seen in FIGS. 16C and 16F and may also contain a body terminal. Different memory states may be stored to the first 1702 and second 1704 sub-cells. When the common SL 1705 is grounded during the operation, FIGS. 17A and 17B may work equivalently to the FIG. 16. However, when the common SL 1705 is actively used during the operation, it may enable the mirror-bit feature in one programming cycle. The controlling common SL 1705 voltage may further enable to write a differential memory state to the first and second sub-cells simultaneously.

In another embodiment of the present invention, the differential memory provides a method for storing multiple bits in one cell. In addition to the opposite memory states to the first and second sub-cells, the same memory states may be stored to both the first and the second sub-cells. For example, both sub-cells store either erasing states or programmed states. Such cases can be sensed out by examining the quantity and similarity of the current at BL and BL. When both sub-cells are programmed, BL and BL current flows are low but at a similar current level. When both sub-cells are erased, BL and BL current flows are high but at a similar current level. Therefore, the present embodiment may offer four bits storage in one differential memory cell.

A differential memory element that combines back-bias line and mirror-bit operation may now be possible.

It is to be noted that referencing the above inventive embodiments to 3D NOR and 3D NOR-P is meant to be inclusive to other 3D memory structures, for example, such as 3D NOR-C, 3D NOR-C4, and other forms of 3D memory.

When the 3D memory cell presented in this invention is used in a DRAM application and utilizing an ultra-thin tunneling oxide or no tunneling oxide, a temperature compensated self-refresh function may be utilized. Such compensation could just as well be used for many other applications, for example, of the memory structures presented here, or elsewhere. In addition to controlling the temperature compensated self-refresh, the programming and erasing voltage or time conditions can also be tuned according to the temperature. Such an example may be program and erase operations in DSSB (SB) devices using source side hot electrons and Band-To-Band (BTB) Tunneling hot holes, respectively. Both mechanisms may be highly sensitive to temperature as the shallow barrier, <0.2-0.3 eV, at elevated temperatures may feature an increased electron ejection rate from the metal junction into the channel while the defect assisted BTB tunneling mechanism is known to be temperature dependent. According to the present invention, a temperature sensor could be used to detect the memory cell's temperature and feedback to the refresh control circuit to adjust the refresh interval and the program and erase voltages or pulse lengths. Such adjustment of the pulse length or voltages, being any combinations of the transistors nodes, gate, drain, source and channel may provide improved uniformity of program and erase over the entire array cells and will enable faster completion of the program and erase operations. Such temperature sensors may be built as part of the control circuits. The temperature sensing element may be, for example, structures such as polysilicon or metal resistor, or ring oscillator, Darlington circuit, bandgap circuit as presented in at least U.S. Pat. Nos. 8,931,953, 7,997,794, 9,719,861, and U.S. application publication 2009/0153227; all of the forgoing are incorporated by reference herein.

In another embodiment, a plurality of the temperature sensing elements could be embedded within a 3D memory cell block. Such temperature sensing elements could be distributed amongst the 3D memory cell blocks. The temperature sensor may also use an inherent portion of the 3D memory cell, thus providing the function without the need for extra fabrication processes. Such temperature sensing may be accomplished by utilizing the temperature dependence of the resistance of a wordline. Alternatively, the temperature sensing may be accomplished by utilizing the temperature dependence of the channel resistance of the memory cell transistor under a defined gate (WL) voltage for the temperature sensing. Such multiple temperature sensors inherent in the 3D memory cell structure can be utilized to measure multiple points which may be distributed within a 3D memory structure.

Figure 18:
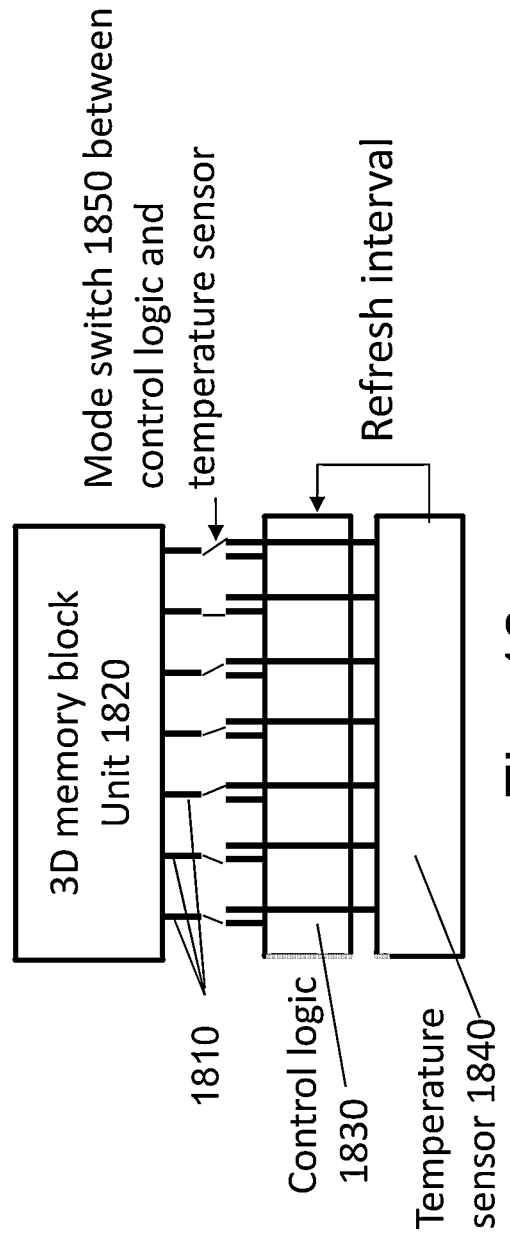
FIG. 18 is an example illustration of a temperature compensated self-refresh architecture.

The temperature compensated self-refresh may be accomplished at the unit level for the 3D memory structures presented herein with partitions to the many relatively small units having control circuits above or below. FIG. 18 schematically illustrates an example of a temperature compensated self-refresh architecture. The control lines 1810 of the 3D memory cell(s) contained within the 3D memory block unit 1820 are connected to either control logic 1830 to control program and read and refresh or connected to the temperature sensor 1840 through a mode switch 1850. The mode switch 1850 connects the control lines 1810 to the control logic 1830 during memory access for program, erase, read, and refresh or to the temperature sensor 1840 during the standby state. The temperature sensor 1840 retunes the temperature information and associates the address to the control logic 1830 so that the control logic 1830 adaptively adjusts the refresh period. Such a temperature compensation scheme could be engineered by memory technologists in the art to many types of memory structures. Specifically in a 3D memory structure in which the temperature profile could be different in various locations & levels and could be additionally affected by various use modes and actual memory access patterns, the use of the memory cells to measure the per location temperature could allow an effective & efficient refresh operation by compensating for the temporal hot spots within the 3D memory structure via a shorter refresh cycle, and so forth.

3D NOR-P offers different options in terms of S/D arrangement. One option is shared S/D pillars (shared source and shared drain). Another option is shared source pillars but non-shared drain pillars. Note: For FIGS. 19 and 20 the terms 'bit pillar' and 'drain pillar' are interchangeable. FIG. 19A illustrates a top layout view of a non-shared source pillar 1902 and non-shared drain pillar 1904 arrangement. To improve the memory cell area efficiency, the shared source line scheme has been popular in 2D NOR type memory. In a conventional shared source and non-shared drain (bit pillar 1922) scheme, two memory transistors share one common source pillar 1924 at a given level, as illustrated in FIG. 19B. One embodiment of present invention includes shared source pillar 1934 and non-shared drain (bit pillar 1932) architecture where four memory transistors share one common source pillar 1934 at a given level as illustrated in FIG. 19C. The active layout resembles a cross where the center becomes source and four edges become drain and the four channels 1900 there between. Such a unit cell structure will be called as a unit cross-cell hereinafter. Unit cross-cells comprising four memory transistors are repeated in the x-y plane with an angle. The arrangement angle would be determined by the length of channel and the drain of x-direction transistors and that of y-direction transistors. As an example of the memory size for the same drawn area shown in FIGS. 19A~19C, 19 memory transistors at FIG. 19A, 24 memory transistors at FIG. 19B, 29 memory transistors at FIG. 19C are obtained, respectively. Note that the shapes, squares/rectangles in these exemplary illustrations may be optimized due to engineering, process, and device concerns and optimizations. For example, some edges and corners may be champhered or curved so to shape the resultant e-fields appropriately. Unused pillars could be used for heat extraction and/or biased to minimize radiation single event effects.

FIG. 20A illustrates an exemplary 3D architecture of cross-cells, including bit pillars 2002, channel pillars 2000, source pillars 2004 and word lines 2008. FIG. 20B illustrates a unit 3D structure of cross-cells (without gate) for easier viewing. FIG. 20C illustrates a cross-sectional view cut along the AA' plane of FIG. 20B.

As a general note we described herein or within incorporated documents a memory structure and variations. There are many ways to form other variations of these structures that would be obvious to an artisan in the semiconductor memory domain to form by the presented elements described herein. These may include exchanging n type with p type and vice versa, increase density by sharing control lines, silicidation of some silicon control lines, improve speed and reduce variation by strengthening bit-lines and word-line with upper layer parallel running and periodically connected metal lines (strapping).

In general as previously discussed the 3D stacking flow presented here could be used for 3D memory structures just as for 2D structures and could be engineered by an artisan in a memory art for mix and match. For 3D memory the level select could become the structure select. Such as discussed before adding additional transistors into the word-lines or the bit-lines to select a 3D structure of multilayer as a multi-floors level. It could be desired to have additional set(s) of pads and pins to allow vertical connectivity also for the per layer contacts. Accordingly the memory control accesses the memory stack just like accessing a single memory structure as they are connected in parallel while the selecting of one structure in the stack is achieved by activating its level select (LS). As had been discussed before in such an architecture the memory matrix could be structured as a matrix of units each about 200 microns by 200 microns. Current state of the art of 3D memories (3D NAND) are approaching 96 layers yet with a height of about 6 microns. Many such 3D memory structures could be stacked before the unit height approaches its X/Y size.

Figures 21A, 21B:
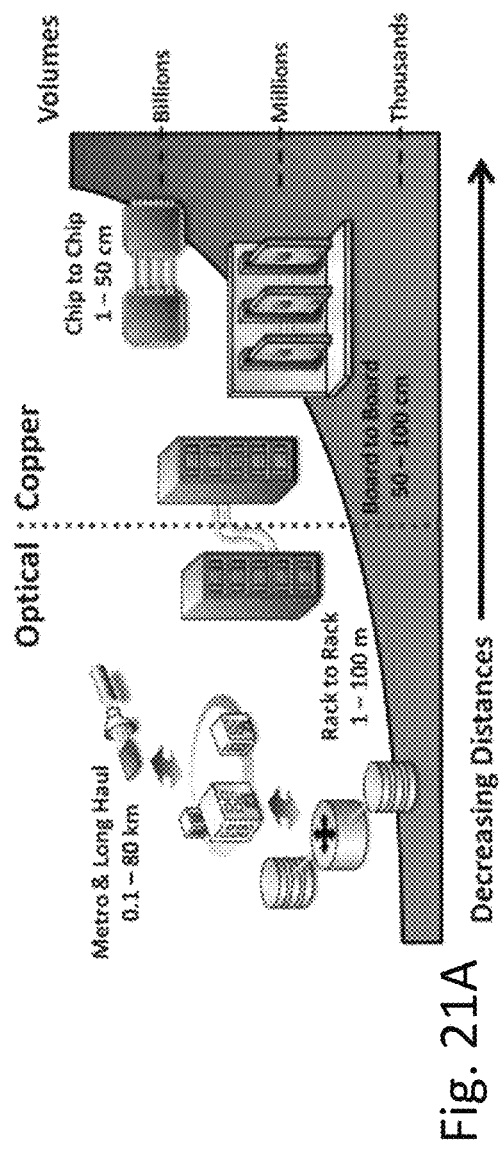
FIGS. 21A-21B are example illustrations of on-chip optical interconnect ("OCOI") state of the art presentations.

A modular 3D IC system, as disclosed here utilizing arrays of units each with its unit 3D memory cell block, memory control circuit block, processing logic block, and I/O block, needs good in-plane (X-Y) lateral interconnect for system level functionality. While the out-of-plane (Z) vertical interconnects are formed having vertical vias with diameters of nano-meter sizes (10 nm-200 nm) up to micron sizes (3-20 μm) and relatively short height of equal or not exceeding the back side back-side ground die thickness, such as less than 50 μm, the interconnect length of horizontal in-plane direction (X-Y) remains at millimeter sizes, from die level (3-16 mm, for X and Y sides), reticle level (20-30 mm), to multi reticles, and up to wafer sizes (60-300 mm). Clearly the interconnect challenge is now greater for the X-Y interconnect. The propagation delay and power dissipation using low-resistance metals such as copper and low-k dielectric material may have a switching frequency limit in the 10 GHz range, which will end up impeding the 3D system performance improvement. The optical interconnect in X-Y allows an enormous bandwidth increase as well as immunity to electromagnetic noise and chip temperature variation. Furthermore, the optical interconnect decreases power consumption. In reference to FIG. 8A-8B herein, conventional on chip metal interconnect techniques were presented. In the current art, optical interconnects have recently become common and many off-chip systems use optical interconnects which utilize optical fibers. FIG. 21A-21B illustrates the state of the art as was reported in papers by M. Paniccia and J. Bower, "First electrically pumped hybrid silicon laser," pp. 1-27, 2006, and B. J. Offrein, "Optical interconnects for computing applications," SEREC, 2009, incorporated herein by reference. Some research and academic work has been published suggesting on-chip optical interconnect ("OCOI") but as FIG. 21B indicate such seem still to be a futuristic idea.

The monolithic 3D technologies presented herein and in the referenced works could be used to simplify the challenge and enable 3D integration of optical on-chip interconnect to further enhance such 3D systems and allow efficient X-Y interconnect across or among 3D SoC (System on Chip) or other 3D devices.

An important aspect of the monolithic 3D technologies is the enabling of heterogeneous integration, in which one level (wafer) is produced using process and material to fabricate logic devices while another level (wafer) is produced using different process and different materials to fabricate optical interconnect devices. Furthermore, these levels (wafers) would likely be made in different locations or wafer fabs. Then using a layer transfer process, one level is transferred over the other enabling fine vertical (3D) integration between the two.

The on-chip optical interconnect level could include more than one sub-level, for example, such as a passive photonic device level(s) for signal routing such as wave guides, photonic crystals, and resonators, and an active device level(s) such as photodetector and light source (for example, a laser). The photodetector and light sources can reside in its own different levels or they can be in the same level but with the two made with different substrates knitted tighter side by side. For example, the photodetector maybe based on germanium, the light source maybe based on III-V semiconductor, and the passive devices may be based on silicon (core)-silica(cladding) structures. The logic level itself could include many levels as illustrated in FIG. 7D.

The optical modulator which is controlled by an electrical driver connected to an electrical logic block maybe inserted between light source and waveguide. The optical modulator combines an optical structure and electrical structure. A PIN diode and microresonator make an optical modulator in one embodiment. A MOS capacitor and Mach-Zehnder interferometer make an optical modulator in another embodiment. Any of those optical modulators may be monolithically integrated as a part of the waveguide.

In one embodiment of the 3D SoC, the optical interconnect level may use a single wavelength point to point link (1-1 link), single and multiple wavelength point-to-many broadcast (1-n link), or multiple wavelength bus and switching (n-n link). The 1-1 link may be used in data-intensive links such as processor-memory buses. The 1-n link may be used to replace the clock distribution network and eliminates the use of several hundreds of repeaters, which used metallic interconnect. Herein, n represents an integer number larger than 1. Current technologies support optical interconnect such that a wave guide could allow many electrical input ports to add optical coded data to be transferred by the waveguide and many output ports to sense the data in the waveguide and to form electrical data outputs based on the optical data in the waveguide. This could be called an n-n optical link.

In another embodiment of 3D SoC, only the light source may be off-chip whilst the rest of the optical components are integrated on-chip. The light source and on-chip optical interconnected 3D SoC may be implemented using multi-chip module technology.

In one embodiment of optical interconnect 3D SoC, the wavelength of the light source maybe ranging from 1.3~1.55 μm. Alternatively, wavelength division multiplexing (WDM) may be used. Each individual wavelength signal does not interfere with another wavelength while a single wavelength could be used to replace a multiple bit bus. Therefore, WDM provides a very high data rate beyond any single wavelength device bus data rate.

The choice of layer transfer technique could be engineered based on the specific choice of substrates of the various levels, fabrication line and so forth. Techniques such as ion-cut which was detailed in respect to at least FIG. 14 of U.S. Pat. No. 8,273,610, incorporated by reference, and in many of the presented 3D IC flows in it. U.S. Pat. No. 8,273,610 presents multiple techniques to repair the damage formed during the ion-cut process such as in reference to its FIG. 184. This challenge is significantly reduced with respect to optical level transfer as these optical elements are far larger and less sensitive to transfer precision compared to advanced logic transistors. Alternative layer transfer techniques using porous layer and known as ELTRAN technology, such as detailed in respect to at least FIG. 22-FIG. 27D of U.S. Pat. No. 10,014,292, incorporated herein by reference, could be used. Another layer transfer technique which could fit well has been presented such as in respect to FIG. 44A-FIG. 45D of PCT/US2016/52726, and in respect to FIG. 1A-FIG. 6D of PCT/US2017/052359, both incorporated herein by reference. Or variations of these layer transfer technologies could be used. Using precise wafer bonders such as the one produced by EVG, presently named Gemini FB, with "face-to-face bond aligner with sub-50 nm wafer-to-wafer alignment accuracy" may facilitate the layer transfer.

Optical interconnect could be used to complement the metal interconnect for X-Y connectivity of a 3D IC system. At relatively long in-plane distances such as 5 mm, 10 mm, 20 mm or even longer than 40 mm, optics provide higher speed and lower power dissipation. The capacitive load and on-resistance impede the metal connection performance. Optical wave guides could be used for simultaneous transfer of multiple signals using modulation techniques similar to those used in fiber optic communication systems. But unlike electrical connections, optical wave guides need far larger dimensions, which imply that the optical wave guide profile is sized in microns rather than in nanometers. A layer transfer based optical interconnection could be to leverage a generic optical connectivity fabric. Such could be transferred and reused over different designs, allowing each design to use the generic optical fabric in a different way. Such a generic fabric could include wave guides going though across dice lines and across reticle borders. As discussed in many of the incorporated art herein, 3D devices could include redundancy and repair technology to allow a very high level of integration including a finished device/system size of, for example, a reticle size, a few reticle sizes, or even wafer level, known as wafer scale integration ("WSI"). For some of those techniques a generic fabric represents a challenge of dicing metal lines which may need an etch step and sealing material deposition to be included. An optical wave guide could be diced without the need for such etch or addition of sealing layers to protect the device as the optical waveguide in most cases is formed by isolation layers which do protect the device from external humidity, etc. This could be part of the engineering & design trades made by an artisan skilled in the art. Such makes the concept of one or more generic optical connectivity layers an attractive option to support different system configurations which could include dicing for different sized base devices customized for the specific target application. Stress relief layers may be added in-between the optical (Ge, SiGe, etc.) and the Si circuitry—so after layer transfer and bonding they are between the optical and other layers. Silicon dioxide is an example of a stress relief material.

The formation of a very long waveguide going across reticles might include a step of isotropic etch and other smoothing techniques to allow better waveguide performance as it crosses reticle boundaries.

Figure 22B:
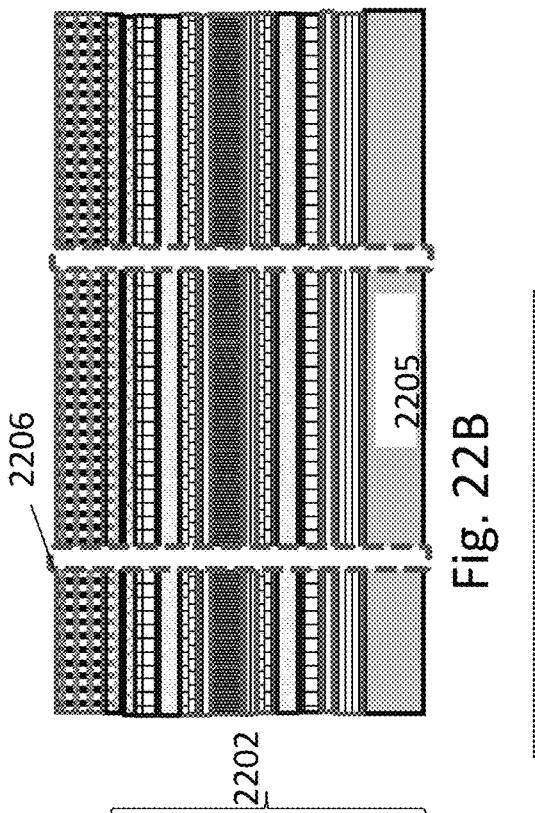
FIGS. 22A-22C are example illustrations of a structure of 3D SoC diced to a different system size.
Figure 22A:
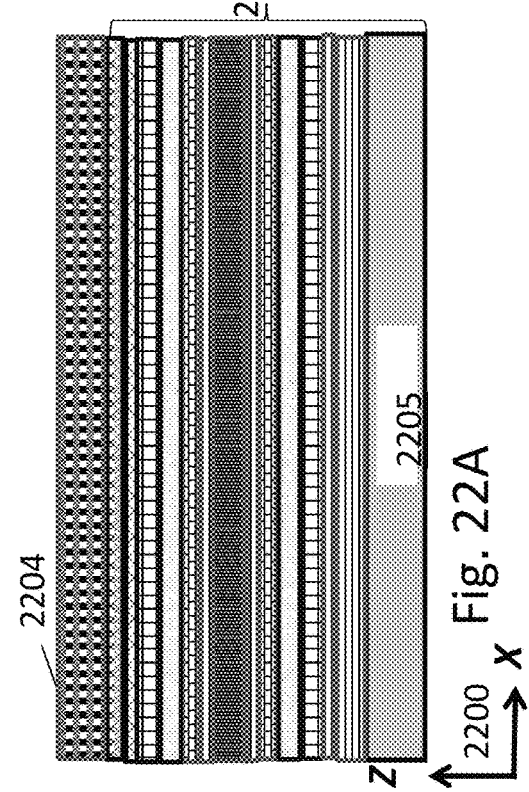

FIG. 22A illustrates a structure of 3D SoC 2202 similar to the one illustrated in FIG. 7D having an optical interconnect structure 2204 transferred over to provide long range X-Y connectivity. FIG. 22A is an X-Z 2200 cut illustrating section of such 3D wafer constructed over wafer substrate 2205.

Figure 22C:
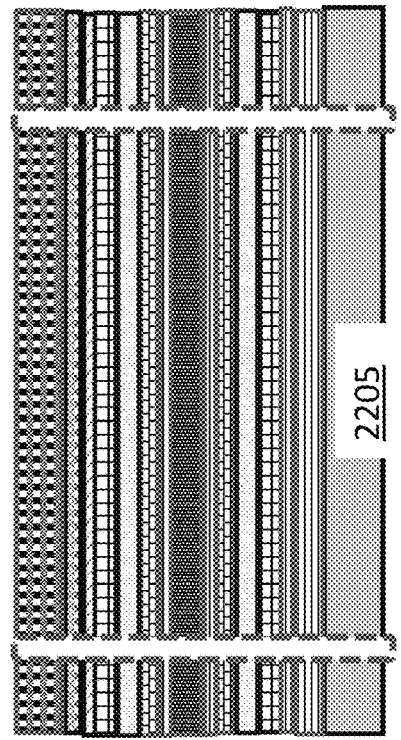

FIG. 22B illustrates the wafer of FIG. 22A diced to one size having dice lines 2206, while FIG. 22C illustrates the structure diced to a different system size.

The architecture of the generic optical interconnect level 2204 could be designed to support a modular 3D system fabric having a generic array of units underneath. An industry standard could be set so different design teams can use the generic optical interconnect each in a way that supports its target system design and application.

In one embodiment, a vertical cavity surface emitting laser (VCSEL) may be considered as the III-V light source and a PIN germanium diode may be considered as the detector. In another embodiment of the present invention, all silicon based light sources and detectors may be considered. In such case, a Raman-silicon laser and a silicon based PIN photodetector may be considered.

Prior art work shows alternative options to form an On-Chip Optical Interconnect. Such worked had been presented in U.S. Pat. Nos. 7,389,029, 8,837,872, 8,428,401, 8,938,139, 9,368,579, 9,423,560, 9,851,506, and application 2015/0049998, all are incorporated herein by reference. These technologies could be engineered to support specific applications. U.S. Pat. No. 8,428,401 does teach use of a metal structure as part of the optical wave guide which could require some attention if it needed to be part of a dicing lane. These could be resolved by either dicing process or etching these regions before dicing, modifying the waveguide in regions that could be part of dicing lanes, such as by replacing the metal on these regions with a dielectric having a lower reflective index.

In an embodiment of the generic optical connectivity fabric, the waveguides are arranged in a Manhattan pattern in X- and Y directions while microdisk-type resonators are formed periodically arranged in a checkerboard pattern. Also, an array of VCSEL and photo detectors may be formed periodically in a checkerboard pattern. Alternatively, 2D photonic crystals where periodically arranged silica cylinders are fully in the XY plane may also form a generic optical connectivity fabric. Then, the layout of photonic crystals may be later tailored on demand.

A common architecture is to have the optical waveguides as part of the 'backend' interconnection layer and the photon generator (LED, Laser) and photo detector in the substrate. The waveguide could be a transparent material (silicon oxide, silicon nitride, etc.) surrounded by reflective material such as metal or material with higher reflective index to keep the light beam inside the waveguide. The wave guide could be designed so it could be used by spatially separated multiple inputs and multiple outputs allowing its flexible use. FIG. 4 of U.S. Pat. No. 8,428,401 illustrates a one input with multiple output waveguide structure. Additional work was presented by Shen, Po-Kuan, et al. "Multiple-input multiple-output enabled large bandwidth density on-chip optical interconnect." Journal of Lightwave Technology 34.12 (2016): 2969-2974; by Heck, Martijn JR, and John E. Bowers. "Energy efficient and energy proportional optical interconnects for multi-core processors: Driving the need for on-chip sources." IEEE Journal of Selected Topics in Quantum Electronics 20.4 (2014): 332-343; and by Dai, Daoxin, and John E. Bowers. "Silicon-based on-chip multiplexing technologies and devices for Peta-bit optical interconnects." Nanophotonics 3.4-5 (2014): 283-311, all are incorporated herein by reference, The optical interconnect could be custom made for the specific 3D system or pre-built being generic and thus servicing multiple 3D systems. It could also be semi-custom, by customizing the generic structure to a specific application. An option for such semi-custom alternative could be a customization of a generic waveguide by introducing one or more 'cut' into it customizing one long waveguide to a two segment waveguide, and/or a three segment waveguide, and so forth.

Figure 23A:
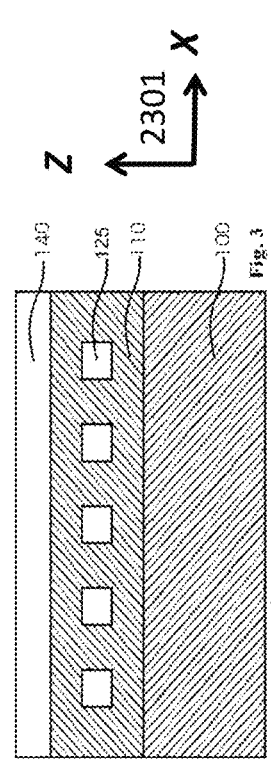
Figure 23B:
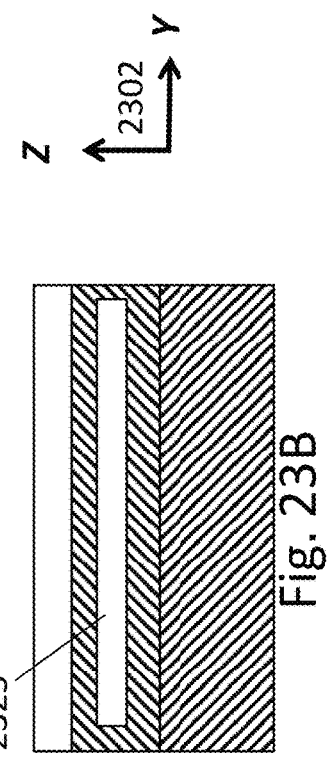

FIG. 23A is copy of FIG. 3 of U.S. Pat. No. 7,389,029, showing a side view cut X-Z 2301 of a waveguide 125. FIG. 23B illustrates a cut view Y-Z 2301 along the waveguide 2325. The customization of such a wave guide could be achieved by etching at specific points and filling with an optical blocking/reflecting material or just similar material used for the waveguide 2325 side walls. FIG. 23C illustrates, Y-Z 2302 cut view, the structure after the etching step opening access 2312. FIG. 23D illustrates the segmentation of the waveguide 2325 into two segments. Such semi-customization of a waveguide generic structure could extend the use of generic optical interconnects structures. The customization process could be done before the transfer or after the transfer over to the 3D system.

FIG. 23E illustrates a top view X-Y 2303 of a region of a 3D wafer having cross die (reticle) optical wave guides. The illustration shows for dies 2335 with designated dice lines 2334, with crossing waveguides in X direction 2333 and crossing waveguides in Y direction 2332

FIG. 24A illustrates an X-Z 2401 cut view of a region of an optical interconnect structure prepared for transfer over to a 3D IC device. Over a transfer substrate 2414 electro-optic and/or opto-electric devices 2420 are fabricated including the control electronics, the laser or LED, the photo diode and other support devices. A cut layer 2416 is positioned under the electro-optics devices to support the layer transfer process. Waveguides 2408 are formed at the back-end, for example, similar to the illustration of FIG. 23A. The electro-optics devices are connected (not shown) to the waveguides to facilitate the signal light in and signal light out of the waveguides. The structure includes vias 2406 and pads 2404 to support connection to the 3D system. These could include pass-through connections 2412 and connection to following layer after transfer prepared vias 2418. The top layer 2410 is a protective isolation layer which could be used for bonding at the following step.

The layer transfer techniques presented herein enable a thin layer transfer and accordingly allow for a very high density of vertical interconnect between the various levels in the 3D system. This also applies to the layer transfer associated with the optical interconnect. Accordingly the vias such as prepared vias 2418 or the feed through 2412 could have a small circumscribing diameter, for example, such as, about 100 nm, about 200 nm, or even about 400 nm, which is much smaller than the state of the art TSV, which is about 5 microns (R&D) or larger (10+ microns in pilot production).

FIG. 24B illustrates a 3D system 2424 which could be similar to one such as in FIG. 7D, with optical interconnect 2426 such as is illustrated in FIG. 24A, flip and bonded on top, having the transfer substrate 2414 substantially cut off. The bonding could be hybrid bonding to form direct conductive connections between the optical interconnect level and the underlying 3D IC system in addition to the oxide-oxide bonding.

In some applications is might be useful to have one set of waveguides 2408 traveling in parallel along the Y-axis directions layer 2432, and then transfer over an additional structure of waveguides traveling in parallel along the X-axis directions X direction layer 2434. For example, the pre-prepared connections prepared vias 2418 could be used to connect the control and the electro-optics devices for the transferred waveguides X direction layer 2434. These waveguides could be generic, custom, or customized either before or after being transferred over to the 3D system. In such a 3D system it might be desired to keep the I/O layer (736 of FIG. 7D) and the sensor layer (770 of FIG. 7D) as the top most layers (Z direction). This is illustrated in FIG. 24B by having the structure of I/O and sensors 2436 as an optional add on level, positioned as the top most level of the 3D System on a wafer. This wafer could then be diced to the desired size of the end product 3D System device. If compression wire-bonding is utilized, an optical waveguide keep out zone (optKOZ) underneath the bonding pads may be necessary.

In dissertation works by Donguk Nam titled "STRAINED GERMANIUM TECHNOLOGY FOR ON-CHIP OPTICAL INTERCONNECTS", December 2013; by Devanand Suresh Sukhdeo, titled "BAND-ENGINEERED GERMANIUM FOR CMOS-COMPATIBLE LIGHT EMISSION", June 2015; and by Ju Hyung Nam, titled "MONOLITHIC INTEGRATION OF GERMANIUM-ON-INSULATOR PLATFORM ON SILICON SUBSTRATE AND ITS APPLICATIONS TO DEVICES", March 2016, additional work has been published by Abedin, Ahmad, et al. "GOI fabrication for monolithic 3D integration." SOI-3D-Sub-threshold Microelectronics Technology Unified Conference (S3S), 2017 IEEE. IEEE, 2017; by Chaisakul, Papichaya, et al. "Integrated germanium optical interconnects on silicon substrates." Nature Photonics 8.6 (2014): 482; and by Lee, Kwang Hong, et al. "Integration of Si-CMOS and III-V materials through multi-wafer stacking." SOI-3D-Sub-threshold Microelectronics Technology Unified Conference (S3S), 2017 IEEE. IEEE, 2017, all incorporated herein by reference, layer transfer and strain technology has been utilized to form optical light source (LASER) to support OCOI. Such techniques could be a good fit to the structures presented herein. Use of Germanium for the electro-optic devices could be a good fit with the use of SiGe for a Cut-Layer. These could include use of the buffer layers concept suggested in respect to FIG. 1B of PCT/US2017/052359.

In one embodiment for the generic optical connectivity fabric, the n-n link may be desirable for reconfigurable networks, which uses optical switch boxes to dynamically define a communication route between arbitrary two functional blocks. The often called 'network on chip' (NoC) has been proposed in Benini, L. and De Micheli, G., Networks on Chip: A New SoC Paradigm, IEEE Computer, 35, 70, 2002; Guerrier, P. and Greiner, A., A generic architecture for on-chip packet-switched interconnections, in Proc. Design, Automation and Test in Europe 2000, 250, 2000; and Dally, W. J. and Towles, B., Route packets, not wires: On-chip interconnection networks, in Proc. 38th Design Automation Conference, 2001; Yang, Peng, et al. "Unified Inter- and Intra-chip Optical Interconnect Networks." *Photonic Interconnects for Computing Systems: Understanding and Pushing Design Challenges* (2017): 11.Nikdast, Mahdi, ed. *Photonic Interconnects for Computing Systems: Understanding and Pushing Design Challenges*. River Publishers, 2017, by Werner, Sebastian, Javier Navaridas, and Mikel Luján. "A Survey on Optical Network-on-Chip Architectures. "*ACM Computing Surveys (CSUR)* 50.6 (2017): 89; by Morris, Randy, Avinash Karanth Kodi, and Ahmed Louri. "Dynamic reconfiguration of 3D photonic networks-on-chip for maximizing performance and improving fault tolerance." *Proceedings of the* 2012 *45th Annual IEEE/ACM International Symposium on Microarchitecture*. IEEE Computer Society, 2012; by Beg, Christopher. *A System Level FMCW RADAR*

*Optimization For Automotive Powertrain Control Application Requirements.* MS thesis. University of Waterloo, 2013; by Achballah, Ahmed Ben, Slim Ben Othman, and Slim Ben Saoud. "An Extensive Review of Emerging Technology Networks-On-Chip Proposals." *Global Journal of Research In Engineering* (2017); and by Abellán, José L., Chao Chen, and Ajay Joshi. "Electro-photonic noc designs for kilocore systems." *ACM Journal on Emerging Technologies in Computing Systems (JETC)* 13.2 (2017): 24, all are incorporated herein by reference. Additionally the following U.S. Pat. Nos. 9,620,489, 9,322,901, and applications 2018/0246286, 2016/0178861, incorporated herein by reference, teach similar concepts of using optical interconnects to support horizontal connectivity for a 3D IC system.

One of the known challenges in reticle size or wafer level integration is yield. In 3D integration there are multiple redundancy and repair techniques which have been detailed in the incorporated by reference patents herein. These could be used for the optical interconnected 3D system such as is referenced in respect to FIG. 22A-22C. Another alternative is to leverage the special attributes of the optical interconnect fabric presented herein. As illustrated in FIG. 23 the optical interconnect fabric uses waveguides to transit die or reticles, thus crossing the designated dice lines. These waveguides are relatively large passive structures constructed with passive materials such as oxide and nitride. The width of the typical waveguide is about a micron compared to the tens of nanometer width of interconnect metal lines within advanced ICs. Current processing technology could produce these waveguides to go across a wafer of even 300 mm diameter at a very high yield. Accordingly, optical interconnect could allow integration of many independent dies with very low added yield loss. Such multi-die integration could allow production of a high level integration of many dies operating as one system even if some of these dies are faulty and need to be disabled. For example a 3D system could be diced to have a size of 60 mm by 60 mm, which may include 100 independent dies each about 6×6 mm. The system could be designed to function even if 10 of the dies are defective and accordingly disabled. The optical waveguide could be designed to transfer data across the defective die. The waveguide and especially those that are designed for multi-input multi-outputs could transfer data across a defective die without being affected by the disabled die. The disabling of defective dies could be achieved by self-test techniques or even by external techniques such as been used for memory repair, for example, such as laser or ion milling to disconnect the power to the defective dies.

Additional aspect of a multi reticle 3D system is added redundancy for the system elements that could be sensitive to yield loss, aspects such as the connections from the optical interconnect to the rest of the system such as the logic level. A simple approach to reduce such yield loss is double modular redundancy or even triple modular redundancy. So these sensitive elements which could include also the electro optics elements such as the laser, and the photo diodes, etc. Having a whole structure being dedicated to the optical interconnect leaves room for doubling or an even higher level of modular redundancy to overcome any reasonable random defect. Additionally the pre-testing could help reduce any yield losses caused by the optical interconnect structure. Such could allow an efficient multi-reticle 3D system construction. Double redundancy could be designed for parallel connections such as common in double vias for interconnect. Alternatively, it could be designed to be activated by self-testing circuits and support redundancy activation as is well-known in the art and could be engineered by an artisan in the field of fault tolerant systems.

Techniques to use optical lithography to pattern large areas greater than the full reticle field by 'stitching' multiple reticle patterns that had been projected independently are known in the art, and are used for Interposer lithography and other applications. Alternatively some lithography tools are designed to support large area projections. Such are presented in a paper by Flack, Warren, et al. "Large area interposer lithography." *Electronic Components and Technology Conference (ECTC)*, 2014 *IEEE 64th*. IEEE, 2014; by Lu, Hao, et al. "Demonstration of 3-5 μm RDL line lithography on panel-based glass interposers." *Electronic Components and Technology Conference (ECTC)*, 2014 *IEEE 64th*. IEEE, 2014; by Furuya, Ryuta, et al. "Demonstration of 2 μm RDL wiring using dry film photoresists and 5 μm RDL via by projection lithography for low-cost 2.5 D panel-based glass and organic interposers." *Electronic Components and Technology Conference (ECTC)*, 2015 *IEEE 65th*. IEEE, 2015; by Sundaram, Venky, et al. "Demonstration of Embedded Cu Trench RDL using Panel Scale Lithography and Photosensitive Dry Film Polymer Dielectrics." *International Symposium on Microelectronics*. Vol. 2017. No. 1. International Microelectronics Assembly and Packaging Society, 2017; by Zihir, Samet, et al. "60-GHz 64- and 256-elements wafer-scale phased-array transmitters using full-reticle and subreticle stitching techniques." IEEE Transactions on Microwave Theory and Techniques 64.12 (2016): 4701-4719; and by T Braun, M Topper, R Aschenbrenner, K Lang, *White paper on PanelLevel Packaging Consortium*, all are incorporated herein by reference.

Additionally, some prior works suggest integrating systems using an interposer with optical waveguides such as presented by Arakawa, Yasuhiko, et al. "Silicon photonics for next generation system integration platform." *IEEE Communications Magazine* 51.3 (2013): 72-77; by Urino, Yutaka, et al. "High-density and wide-bandwidth optical interconnects with silicon optical interposers." *Photonics Research* 2.3 (2014): A1-A7; and by Urino, Yutaka, et al. "Demonstration of 12.5-Gbps optical interconnects integrated with lasers, optical splitters, optical modulators and photodetectors on a single silicon substrate." *Optics express* 20.26 (2012): B256-B263, all are incorporated herein by reference An additional alternative is to pre-test the optical interconnect components allowing the use of the concept of Known-Good-Die to wafer level die-to-wafer 3D integration by pretesting the optical interconnect fabric before transfer over to the 3D system. These could be easier with the use of a generic optical interconnect which could be produced in volume and pretested before use for the specific application.

Such pretesting could be performed with an external test fixture by measuring light coming at the edge of the wafer. Alternatively, for an optical interconnect structure which includes both the waveguides and the opto-electronics circuit, built-in self-test could be used. Such self-test could be designed in the fabric which could include a photovoltaic region to generate the power for self-test and reduce the need for probing. And reporting the result could also be achieved contactless by use of an optical or wireless signal from the wafer to the test control system.

Such could also be used for the semi-custom optical interconnect fabric as the customization process presented in reference to FIG. 23C-23D is relatively simple and should not affect the fabric yield.

The optical inter-die interconnect fabric as been discussed is one alternative for effective X-Y interconnecting fabric.

At least five other alternatives could be used in similar way using electrical signals with metal conducting material: 1) Differential signaling such as was discussed herein in reference to FIG. 8A-8B, 2) SerDes, 3) RF (Radio Frequency) transmission lines ("TL"), 4) RF Zenneck Surface Wave Interconnect ("SWI"), and 5) free space RF communication without transmission lines. Or any mix and match of these communication technologies.

The RF type interconnects fit well the presented use (optical interconnect), for 3D system by layer transfer. The common technologies for RF circuits are on RF-SOI substrates supported by multiple vendors these days. Those substrates could be used for layer transfer as been discussed herein and in the related application such as by etching the backside handling substrate using the buried oxide as an etch stop. Accordingly FIG. 24A-24B could be used to illustrate use of RF for adding X-Y interconnection fabric to 3D IC system. FIG. 24A could be viewed as illustrating an RF-SOI wafer in which 2416 could be the 'Buried Oxide' (BOX) 2420 could be the RF circuits associated with forming the electromagnetic RF waves, the modulation circuits to add in the data to be transferred, and the down converting circuits to convert back the modulated data at the receiver side to logic voltage level. The Y direction RF connections—the transmission lines, the wave guides or the SWI are illustrated by 2408. The interconnection fabric 2432 could than been flipped over a 3D target system 2424 as is illustrated in FIG. 24B. The RF-SOI substrate 2414 could be then ground down and selectively etched off. And additional level 2434 of X direction RF connections 2435 could be added on top. As is illustrated through vias could be used to vertically connect the various levels including to connection to overlaying Input Output ("I/O") level 2436 (which could also be underlying, depending on engineering and design tradeoff and considerations).

These alternative technologies may challenge the dicing over generic fabric as they do use metal as the interconnecting material. So in such case etch and deposition prior to dicing could be used for proper set up of the dicing lanes as presented in reference to FIG. 25B.

These technologies could be engineered as an effective alternative to the optical fabric including the use of generic interconnecting fabric with simple customization option by segmentation (cutting) of wave guides. Most fitting alternative to optic could be the TL and SWI. Use of multiple frequencies as a carrier wave could be engineered for n-n connectivity which make the use of a generic interconnection structure easier, as the programming for specific applications could be achieved by control of frequency allocation rather than by switches and conventional programmable interconnects. These techniques are detailed in the papers incorporated herein by reference. Alternatively, multiple-input and multiple-output or MIMO methods may be used for on-chip wireless communication. The layer-to-layer wireless communication within 3D system and intra-layer wireless communication may be enabled via integrated on-chip antennas and can allow arbitrary X-Y-Z interconnect. Techniques for such wireless interconnect has been presented by Russer, Johannes A., et al. "Si and SiGe based monolithic integrated antennas for electromagnetic sensors and for wireless communications." Silicon Monolithic Integrated Circuits in RF Systems (SiRF), 2011 IEEE 11th Topical Meeting on. IEEE, 2011, by Abadal Cavalle, Sergi. "Broadcast-oriented wireless network-on-chip: fundamentals and feasibility." (2016), and by Nossek, Josef A., et al. "Chip-to-chip and on-chip communications." *Ultra-Wideband Radio Technologies for Communications, Localization andSensor Applications*. InTech, 2013, all are incorporated herein by reference.

The details of utilizing such interconnect technologies for Network on Chip (NoC) or other on silicon devices integration is known in the art and presented in publication such as by Karkar, Ammar Jallawi Mahmood. "Interconnects architectures for many-core era using surface-wave communication." (2016), by Karkar, Ammar, et al. "Surface wave communication system for on-chip and off-chip interconnects." *Proceedings of the Fifth International Workshop on Network on Chip Architectures*. ACM, 2012, by Ong, S. N., et al. "A 22 nm FDSOI Technology Optimized for RF/mm-Wave Applications." 2018 *IEEE Radio Frequency Integrated Circuits Symposium (RFIC)*. IEEE, 2018, by Liang, Yuan, et al. "On-chip sub-terahertz surface plasmon polariton transmission lines with mode converter in CMOS." *Scientific reports* 6 (2016): 30063, by Kazior, Thomas E. "More than Moore: III-V devices and Si CMOS get it together." *Electron Devices Meeting (IEDM), 2013 IEEE International*. IEEE, 2013, by Kazior, T. E., et al. "High performance mixed signal and RF circuits enabled by the direct monolithic heterogeneous integration of GaN HEMTs and Si CMOS on a silicon substrate." *Compound Semiconductor Integrated Circuit Symposium (CSICS), 2011 IEEE*. IEEE, 2011, by Kazior, Thomas E., et al. "More than Moore-Wafer Scale Integration of Dissimilar Materials on a Si Platform." *Compound Semiconductor Integrated Circuit Symposium (CSICS), 2015 IEEE*. IEEE, 2015, by Bertozzi, Davide, et al. "The fast evolving landscape of on-chip communication." *Design Automation for Embédded Systems* 19.1-2 (2015): 59-76, by Karkar, Ammar, et al. "Mixed wire and surface-wave communication fabrics for decentralized on-chip multicasting." *Design, Automation & Test in Europe Conference & Exhibition (DATE), 2015*. IEEE, 2015, by Karkar, Ammar, et al. "Hybrid wire-surface wave architecture for one-to-many communication in networks-on-chip." *Design, Automation and Test in Europe Conference andExhibition (DATE), 2014*. IEEE, 2014, by Karkar, Ammar, et al. "A survey of emerging interconnects for on-chip efficient multicast and broadcast in many-cores." *IEEE Circuits and Systems Magazine* 16.1 (2016): 58-72, by Karkar, Ammar, et al. "Network-on-chip multicast architectures using hybrid wire and surface-wave interconnects." *IEEE Transactions on Emerging Topics in Computing* 6.3 (2018): 357-369, by Tiemeijer, Luuk F., et al. "Low-loss patterned ground shield interconnect transmission lines in advanced IC processes." *IEEE transactions on microwave theory and techniques* 55.3 (2007): 561-570, by Kim, Jaewon, et al. "Novel CMOS low-loss transmission line structure." Radio and Wireless Conference, 2004 *IEEE*. IEEE, 2004, by Turner, Walker J., et al. "Ground-referenced signaling for intra-chip and short-reach chip-to-chip interconnects." Custom Integrated Circuits Conference (CICC), 2018 *IEEE*. IEEE, 2018, by Hamieh, Mohamad, et al. "Sizing of the physical layer of a rf intra-chip communications." Electronics, Circuits and Systems (ICECS), 2014 21*st IEEE International Conference on*. IEEE, 2014, by Agyeman, Michael Opoku, et al. "On the design of reliable hybrid wired-wireless network-on-chip architectures." *Embedded Multicore/Many-core Systems-on-Chip (MCSoC), 2015 IEEE 9th International Symposium on*. IEEE, 2015, by Fesharaki, Faezeh, et al. "Guided-wave properties of mode-selective transmission line." IEEE Access 6 (2018): 5379-5392, and in U.S. Pat. Nos. 8,889, 548 and 9,405,064, all of the forgoing are incorporated herein by reference.

Accordingly, the interconnect fabric 2204, 2206 of FIG. 22A-22C, could constructed with RF electronics and transmission line or SWI instead of optical waveguides. The customization technique of FIG. 23C-23D could be engineered to customize RF transmission line or SWI, and so could be applied to FIG. 23E with respect to 2332 and 2333. Similarly the techniques presented in respect to FIG. 24A-24B could be engineered and adapted to RF electronics to form RF transmitters and receivers, allowing data transfer by transmission line or SWI instead of optical waveguides 2408. In most cases optical waveguides are constructed from materials that are good for transmitting optical waves such as, for example, like silicon oxide, while RF waveguides are transmission lines are constructed from material that are good for transmitting RF waves such as copper, and other conducting metals. The support elements to generate these waves and to modulate these waves are different and in so many cases are the materials which are used for their constructions. These are known in the art and are detailed in some of the paper incorporated herein by reference.

The use of RF could include use of differential signaling. Use of differential transmission line could help reducing the cross talk effect, allow lower voltages, and other advantages. The previous concepts for interconnection fabric could be adapted to use differential transmission line using techniques such as has been presented by Sawyer, Brett, et al. "Modeling, design, and demonstration of 2.5 D glass interposers for 16-channel 28 Gbps signaling applications." *Electronic Components and Technology Conference (ECTC)*, 2015 *IEEE 65th*. IEEE, 2015, by Sawyer, Brett, et al. "Design and demonstration of 2.5 D glass interposers as a superior alternative to silicon interposers for 28 Gbps signal transmission." *Electronic Components and Technology Conference (ECTC)*, 2016*IEEE 66th*. IEEE, 2016, by Wary, Nijwm, and Pradip Mandal. "Current-Mode Triline Transceiver for Coded Differential Signaling Across On-Chip Global Interconnects." *IEEE Transactions on Very Large Scale Integration (VLSI) Systems* 25.9 (2017): 2575-2587, by Holloway, Jack W., et al. "A fully integrated broadband sub-mmwave chip-to-chip interconnect." *IEEE Transactions on Microwave Theory and Techniques* 65.7 (2017): 2373-2386, by Alzahmi, Ahmed, et al. "High-performance RF-interconnect for 3D stacked memory." *SoC Design Conference (ISOCC)*, 2017*International*. IEEE, 2017, and by Akahoshi, Tomoyuki, et al. "Configuration for High-speed Transmission between Flip-chip Packages Using Low Loss and Flexible Substrate." *Transactions of The Japan Institute of Electronics Packaging* 11 (2018): E17-016, all are incorporated herein by reference. And in U.S. Pat. Nos. 9,240,619, 9,071,476, and US patent applications 2016/0197761

Some of the incorporated by reference art, in here suggest the use of interposer, often reference as 2.5D, for chip to chip interconnect. The technology suggested over here is teaching more effective technique, by adapting these interposer techniques to wafer level for layer transfer over the wafer with the chips to be interconnected. Wafer scale 3D integration of processing chips or cores or units could have as presented full system 3D structure with good vertical connectivity. Adding the horizontal connectivity (X-Y) by layer transfer of thing RF circuits fabricated on a wafer such as RF-SOI with connectivity fabric using layer transfer allow effective wafer level processing of fully connected 3D system. Such approach need to accommodate non perfect yield mostly at the processor chip-core-unit level. The presented of techniques in here allow for overcoming such defects by: redundancy, repair or skipping of such defective elements.

FIGS. 22A to 24B illustrate a 3D system in which the X-Y horizontal interconnection fabrics 2204, 2426, 2434 are relatively at the upper level of the structure. In general the horizontal interconnection fabric could be engineered by artisan skilled in the art in the middle level of the 3D system or at any other level. Placing it in the center could be advantageous in some system by having compute structure on both sides (under it and overlying it) allows shorter vertical paths from computing structures to the X-Y horizontal interconnection fabric.

Similar to the concept of pretesting the optical waveguide structure so could be engineered to support pretesting of the RF transmission lines fabric. In general these waveguide whether optical or RF (transmission line) are far larger than advance semiconductors features. They are hundreds of nanometer wide rather than tens nanometer wide. There lithography process is far lower cost and their yield could be far higher. Yet defect could still accrue and pretesting could allow avoiding use of defected fabric. The pretesting could be assisted by dedicated test equipment or by on fabric self test structure. Those could be engineered by artisan skilled in the art. The test infrastructure could be design to use contacting probes or wireless. Combing wireless testing to RF base interconnection fabric could leverage wireless charging, wireless test pattern in and wireless test pattern out using technologies well known in the art. Pretesting could include special substrate with dedicated test utilities such as transmitters (Laser or RF) at the one end of the waveguides and receiver at the other end. The connection for providing power and initiating self-test and receiving self test result could use probes with physical contact to the tested wafer or wireless. The test elements could be embedded as part of the electromagnetic waves control electronic level, or a dedicated level dedicated for the testing. As a dedicated level it could be part of the substrate on which the wave guides are fabricated on with 'cut-layer' in between or brought over such as wafer bonding and de-bonding techniques. These choices could be engineered by artisan skilled in the art.

Wafer level 3D system as presented here could highly benefit with the ability to be configurable. Such flexibility could be used to support the continuous array concept such as has been presented in U.S. Pat. No. 8,395,191, incorporated by reference, in reference to FIG. 11A-11F in respect to array of programmable logic, and in respect to FIG. 84A-84G in respect to array of memory cells. In such concept the production is of a continuous fabric which could be "cut" to fit specific needs (Just is common with carpets). Another benefit of such configurability is the ability to accommodate some defect and to configure the system to function while the defect region is configured out of the system. The system could be designed to have controller design to configure the system the X-Y connectivity and/or the on chip network (NoC). The controlling program could be built in or loaded in at the system initialization process. Such concept has been presented to a programmable generic continuous array fabric in U.S. Pat. No. 8,115,511, incorporated herein by reference, as related to its FIG. 37-38. Other set up technique could be used including leveraging the RF circuits which could include communication link to a set up equipment, and use of wireless to communicate with the system various nodes, and using known technique configure the system and its network connectivity.

The 3D system could include in X-Y waveguides or transmission lines a configurable connectivity such as: Single Write Multiple Read (SWMR), Multiple Write Single Read (MWSR), or even Multiple Write Multiple Read (MWMR). Connectivity fabric which its waveguide/transmission line are design for MWMR, simplify the configuration of its resources by adapting who gets to 'write' into a specific waveguide and who gets to read base on consideration like yield and sizing (customization). Such has been presented by Brière, Alexandre, et al. "A dynamically reconfigurable rf noc for many-core." *Proceedings of the 25th edition on Great Lakes Symposium on VLSI*. ACM, 2015, and by Agyeman, Michael Opoku, et al. "A resilient 2-d waveguide communication fabric for hybrid wired-wireless noc design." *IEEE* Transactions on Parallel and Distributed Systems 28.2 (2017): 359-373, which suggest use of both wire and wireless RF base interconnect, Chang, M. Frank, et al. "CMP network-on-chip overlaid with multi-band RF-interconnect." *High Performance Computer Architecture*, 2008. HPCA 2008. IEEE 14th International Symposium on. Ieee, 2008, Vivet, Pascal, et al. "Interconnect challenges for 3D multi-cores: From 3D network-on-chip to cache interconnects." *VLSI (ISVLSI)*, 2015 *IEEE Computer Society Annual Symposium on*. IEEE, 2015, and in U.S. Pat. Nos. 8,885,689, 9,160,627, and 9,515,367, all are incorporated herein by reference.

As an alternative the configuring of the interconnect fabric during setup process as discussed here before could allow use of such waveguides resources for X-Y connectivity even in the simple mode of single input single output. These options could be engineered by artisan skilled in the art for the specific application for which the 3D system is being designed for.

The concept of wafer scale integration ("WSI") has been considered and at times explored over many years. It was never adopted due to the challenge of defects and due to the success of scaling. There is more interest these days as conventional scaling has slowed. And with the growing interest with Artificial Intelligence (AI) and brain inspired architectures. Such concepts have been presented by Kumar, Arvind, et al. "Toward Human-Scale Brain Computing Using 3D Wafer Scale Integration." *ACM Journal on Emerging Technologies in Computing Systems (JETC)* 13.3 (2017): 45, by Kumar, Arvind. "Nanotechnology requirements and challenges for large-scale brain computing." *Nanotechnology (IEEE-NANO)*, 2016 *IEEE 16th International Conference on*. IEEE, 2016, by Wan, Zhe. *Three-Dimensional Wafer Scale Integrationfor Ultra-Large-Scale Neuromorphic Systems*. Diss. UCLA, 2017, by Wan, Zhe, and Subramanian S. Iyer. "Three-dimensional wafer scale integration for ultra-large-scale cognitive systems." *SOI-3D-Subthreshold Microelectronics Technology Unified Conference (S3S)*, 2017*IEEE*. IEEE, 2017, by Uddin, Ashfaque, et al. "Wafer scale integration of CMOS chips for biomedical applications via self-aligned masking." *IEEE Transactions on Components, Packaging and Manufacturing Technology* 1.12 (2011): 1996-2004, and by Schmitt, Sebastian, et al. "Neuromorphic hardware in the loop: Training a deep spiking network on the brainscales wafer-scale system." Neural Networks (IJCNN), 2017 International Joint Conference on. IEEE, 2017, all are incorporated herein by reference.

Some of the recent work suggests the use of optical waveguides in 3D architecture for WSI such as by Settaluri, Krishna T., et al. "Demonstration of an optical chip-to-chip link in a 3D integrated electronic-photonic platform." *European Solid-State Circuits Conference (ESSCIRC), ESSCIRC 2015-41st*. IEEE, 2015, and by Stojanović, V., et al. "High-density 3D electronic-photonic integration." *Energy Efficient Electronic Systems (E3S)*, 2015 *Fourth Berkeley Symposium on*. IEEE, 2015, both are incorporated herein by reference. The concepts presented in here are advancing these ideas farther supports low cost and effective integration with the current industry infrastructure.

The concepts presented in here in respect to the X-Y connectivity fabric were initially developed and presented with respect to 3D IC through many of the patents assigned to MonolithIC 3D Inc. and incorporated by reference in here. As an example in U.S. Pat. No. 8,395,191, incorporated by reference, the concept of programmable interconnects structure is presented in respect to its FIG. 4A-4B and FIG. 7. The concept of continuous array which could be 'cut' to size for specific application is presented in reference to FIG. 11A-11F in respect to array of programmable logic, and in respect to FIG. 84A-84G in respect to array of memory cells. The concept of leveraging 3D integration for wafer scale integration, or for multi reticles or multi die integration was presented in conjunction with defect repair with respect to programmable array in FIG. 41 and with respect to logic circuits in FIG. 86A-86B and FIG. 114-FIG. 119. These concepts could be adapted to a 3D system leveraging the X-Y connectivity fabric presented here such as using waveguides transmitting optical signals, or waveguides or transmission lines transferring RF signals. These concepts are in good fit here leveraging the attribute of electromagnetic wave (light or RF) signal transmission at about speed of light which is about ins across 300 mm wafer. These interconnect technologies provide connectivity across wafer, in which the signal delays are not dominated by the length of the interconnects, but rather by the delays associate in conversion from voltage levels to electromagnetic wave and back. Accordingly the concept of redundancy could be applied not just with functions implemented directly above at tens of nanometer distance but also with function that are at tens of millimeters apart. Additional useful attributes is the larger size and the relatively simple structure of these waveguides (transmission lines) which could enable high yield across large device sizes (many tens of mm). And also very fitting are the type of 3D system for which such X-Y interconnection fabric could be used for. The growing popularity of logic systems that use an array of processors such as GPUs and multi-cores allow the use of a similar concept that was used in the past for arrays of memories and arrays of programmable logic.

These concepts could be illustrated in reference to FIG. 25A-25C, which illustrates an X-Z 2500 cut view of a region of 3D system of multi-cores continuous wafer fabric.

FIG. 25A illustrates multi-levels of memory, logic and support circuits 2504 with interconnection fabric 2506 over silicon wafer substrate 2502. The substrate thickness (Z direction) could be a conventional 700 microns or could be thinned down. The thickness of the structure on top 2504, 2506 could be of a few microns, tens of micron or even thicker.

FIG. 25B illustrates the structure of FIG. 25A after been processed as preparation for dicing ("cut") by etching 2510 of all sensitive structure such as metal strips and side walls sealing by protection layers 2512. The structure of FIG. 25A could include designated potential dice lanes such as rows and column in between cores. The locations of the etch trench 2510 could be along the selected dice lanes. FIG. 25C illustrates a 'cut' structure having 4 cores with selected dice line 2520 and unselected potential dice line 2521.

FIG. 25C illustrates such a cut section having processors 2522, 2524, 2526, 2528 with memory included in the structure. Interconnection control and wave forming level 2530, and waveguides/transmission lines (for the X directions) 2531, 2532, (Waveguides in Y direction are not shown) are on top of the processors 2522, 2524, 2526, 2528.

The waveguides could be shared resources having programmable ports 2534, 2536, 2538. If during the set-up process and self test operation it is determined that, for example, processor 2524 or associated memory/support circuits is faulty then the ports associated with it 2534, 2536 are disabled. These ports could be engineered so they do not interfere with the waveguide functionality once disabled. The size of such element like 2524 could be small like 200μ×200μ (unit), 7 mm×7 mm (die) or full reticle of about 25 mm×35 mm. Techniques for such configurable multi-in, multi-out using waveguide/transmission line are known in the art and presented in papers such as by Hu, Jianyun, et al. "A 25-Gbps 8-ps/mm transmission line based interconnect for on-chip communications in multi-core chips." *Microwave Symposium Digest (IMS), 2013 IEEE MTT-S International*. IEEE, 2013, and by Unlu, Eren, et al. "An OFDMA based RF interconnect for massive multi-core processors." *Networks-on-Chip (NoCS), 2014 Eighth IEEE/ACM International Symposium on*. IEEE, 2014, all are incorporated herein by reference.

FIG. 23E illustrates an X-Y interconnect fabric over small array of 2×2 cores. The number of cores and the shape of a specific device could be customized as appropriate for a specific application. FIG. 26 is a top view X-Y 2603 illustrating an interconnect fabric in what is called X architecture. Accordingly the interconnect fabric could include waveguides (transmission lines) arranged in a diagonal orientation. These could be on top of a conventional X-Y connectivity fabric. Such could help connecting circuits across the die, wafer, etc. not just along rows or columns but also diagonally. Many other variations could be engineered by an artisan skilled in the art.

This concept could be used in a similar way to the concept utilized in the memory business in which some memory cells (rows) are designated as redundancy to repair faulty memory cells, or as in agile design which can adapt to the number of functionally-yielding cores. These concepts could be engineered by an artisan skilled in the art to fit the choice of manufacturing and the required system characteristics.

Herein and in the related patents and applications fabrication process are presented using layer transfer. The electronics elements associated with the layer been transfer could be connected to the underline structure either by using hybrid bonding, having the appropriate connecting pads/pins, or by post process, etching via and depositing connection lines. In general hybrid bonding is shorter and simpler process, while etch and deposition could support higher precision and more connections. The choice between these connecting technologies and the related techniques to overcome bonding misalignments could be engineered by artisan skilled in the art to fit the specific application.

Herein and in the related patents and applications many 3D semiconductor devices and structures are presented. The reference to a device as 3D device indicates that the transistors included in the device are positioned at least on two overlaying planes (X-Y). In general these devices are fabricated on round disk wafers in X-Y plan with diameter of about 100, 150, 200, 300 mm or even larger as future plans were for 400 mm. These wafers are relatively thin at about 0.7-0.9 mm in Z direction. Herein the term horizontal is in X-Y direction while vertical is in Z direction. Accordingly overlay, overlaying, underlying and so forth are in respect to the vertical direction −Z. In 3D devices the transistors are in most cases being process first on the wafer substrate that in most cases is single crystal wafer. The term layer is used in most cases for such X-Y plane of a material with a functional structure such as isolation, connectivity strips, transistors and so forth. If such layer is combined with addition layers to form a plane of connected transistors it could be still called layer but often it is called stratum or level. Multiple stratums (strata) could be considered 3D structure or multilevel structure. The 3D structure could still be called wafer but it also could be called device. The wafer in most cases will be diced to many devices mostly with rectangular shape which than could be packaged and integrated with other devices to form a system. Yet 3D devices could also be considered in many cases as 3D systems on their own. These terms and names are common in the art and in combination with other terms which could have similar meaning and could have been used herein too. The descriptions herein are to teach technologies and various innovations to artisan skilled in the art. It is expected to teach the technological concept to engineers, who with the help of the accompanied drawings could make use of them to engineer better end products. The 3D system presented herein and the technologies suggested for the processing support the use of single crystal layer(s) and accordingly may include single crystal channel transistors. Such could be applied to the various levels of the 3D IC device starting from the base substrate. The use of single crystal materials are commonly and predominantly silicon; however, the use of single crystal materials described herein is not limited to silicon. As such, the use of poly crystalline or other form of materials, or types of material such as Germanium or alloys, for example, such as SiGe, could be integrated in the 3D system as presented herein or in the incorporated art. The concept of large scale integration such as multi dies, multi reticle, or wafer level could leverage the presented 3D technologies but could be also implemented in conventional 2D devices.

3D Systems, for example, such as those presented herein commonly generate heat while in operation, which should be managed to protect the system from heating up and affect the 3D system operation. The incorporated art herein suggest multiple techniques to provide heat removal for such a 3D system. These techniques include use of the through layers vias, the power grid, incorporating a heat spreader, absorbing and reflective layers, and so forth. In some systems additional techniques such as use of liquids combined with micro channel could be required. Such liquid based 3D device cooling are known in the art and have been presented such as in U.S. patent 7, 928,653, and as presented in the paper Bakir, Muhannad S., et al. "3D integrated circuits: liquid cooling and power delivery." *IETE Technical review* 26.6 (2009): 407-416, both are incorporated herein by reference. These cooling techniques could be incorporated in the silicon substrate of the 3D IC device or in the interposer used to carry the device or in the package of the device. Recently a DARPA program named ICECool has been established to develop such cooling technologies as been reported in publications such as by Bar-Cohen[1], Avram, Joseph J. Maurer, and Jonathan G. Felbinger. "DARPA's Intra/Interchip Embedded Cooling (ICECool) Program." and Bar-Cohen, A., J. J. Maurer, and D. H. Altman. "Gen3 embedded cooling for high power RF components." *Microwaves, Antennas, Communications and Electronic Systems (COMCAS), 2017 IEEE International Conference on*. IEEE, 2017. Other work was presented by Kandlikar, Satish G. "Review and projections of integrated cooling systems for three-dimensional integrated circuits." *Journal of Electronic Packaging* 136.2 (2014): 024001, by Chen, Gengjie, et al. "Minimizing thermal gradient and pumping power in 3D IC liquid cooling network design." *Proceedings of the 54th Annual Design Automation Conference* 2017. ACM, 2017, by Serafy, Caleb M. *Architectural-physical*

*co-design of 3D CPUs with micro-fluidic cooling*. Diss. 2016, by Drummond, Kevin P., et al. "A hierarchical manifold microchannel heat sink array for high-heat-flux two-phase cooling of electronics." *International Journal of Heat and Mass Transfer* 117 (2018): 319-330, by Green, Craig, et al. "A review of two-phase forced cooling in three-dimensional stacked electronics: technology integration." *Journal of Electronic Packaging* 137.4 (2015): 040802, by Zhang, Xuchen, et al. "3D IC with embedded microfluidic cooling: technology, thermal performance, and electrical implications." *ASME* 2015 *International Technical Conference and Exhibition on Packaging and Integration of Electronic and Photonic Microsystems collocated with the ASME* 2015 13*th International Conference on Nanochannels, Microchannels, and Minichannels*. American Society of Mechanical Engineers, 2015, and by Green, Craig, et al. "A review of two-phase forced cooling in three-dimensional stacked electronics: technology integration." *Journal of Electronic Packaging* 137.4 (2015): 040802, all of the forgoing in this paragraph are incorporated herein by reference. These fluid cooling technologies could be a good fit to the large scale integration technologies presented herein, for example, with reference to FIGS. 22A-FIG. 26, both due to the large scale of active device being integrated, and for the cost effectiveness of sharing the cost over a high level of device integration.

FIG. 27A illustrates an X-Z 2700 cut view of such high scale 3D device integration with a substrate constructed to support fluid cooling, cooled 3D device 2701. The top portion 2704 illustrates the large scale 3D integration structure of FIG. 25C. Cooled 3D device 2701 may include channeled silicon substrate 2702, top portion 2704 (processors 2522, 2524, 2526, 2528; wave forming level 2530, waveguides/transmission lines (for the X directions) 2531 & 2532; programmable ports 2534, 2536, 2538, selected dice line 2520, unselected potential dice line 2521), bonding interface 2710, fluid in-take 2712, fluid out-take 2714, micro-channels 2716 and micro-channel structure 2718. The channeled silicon substrate 2702 could include micro-channel 2716 designed with fluid in-take 2712 and out-take 2714. The substrate could be preprocessed to include the micro-channels at the wafer level, or bonded afterward to micro-channel structure 2718 with, for example, such as with silicon to silicon bonding 2710.

FIG. 27B is an X-Y 2730 cut of the cooled 3D device 2701 thru micro-channel structure 2718 through the micro-channels 2716. The micro-channels 2716 could be formed by etching trenches using conventional semiconductor processes into the micro-channel structure 2718 and then bonded to the wafer substrate 2702. Micro-channels 2716, micro-channel structure 2718, and a thinned wafer substrate 2702 could be slightly oxidized to enable a silicon dioxide to silicon dioxide bond if require by engineering and production constraints. The fluid in-take 2712 and out-take 2714 (there may be more than one on each system/device) may then be added in to fully prepare the device for fluid cooling. The wafer substrate could be thinned down by conventional techniques such as grinding and etch prior to the bonding. Thinning substrate post device processing down to 50 is common in the industry. Alternatively the base in which the micro-channels 2716 are formed in micro-channel structure 2718 could be made from other materials such as glass, and the interface between the micro-channel structure 2718 and the silicon wafer could be made of other materials which could have good adhesion to these substrates and good from being bond together. Use of materials that are good heat conductors, such as isotopically pure silicon for example, is an advantage but even poor heat conductors if they are thin enough could be engineered to support such fluid based micro-channel wafer level integration. The dicing could be done after the bonding of the micro-channel structure 2718. If the choice of material for the micro-channel structure 2718 is not a good fit for the common saw dicing than other dicing technologies could be used such as plasma etch or laser based dicing. Alternatively a silicon wafer could be used as a starting material for base element of the wafer substrate 2702 and micro-channel structure 2718, and another material could be deposited over the etched trenches for the micro-channel and the bonding interface 2710. Such deposition could be a conformal deposition such as ALD. The choice of the material could be made to support both the bonding and the micro-channel functionality. The microchannel cooling structures could be placed on top, underneath (illustrated in FIGS. 27A and 27B) or in some cases in-between the active device layers. As well, the microchannel cooling structures could be placed on top and underneath, or underneath and in-between, or any combination of the three regions of placement. The creation of a system with the capabilities attainable with this set of inventions may require a large cooling capacity and thus multiple layers of a cooling structure, such as, for example, the microchannel cooling presented just above.

While FIGS. 27A-27B illustrate a technique to form micro-channels for fluid cooling, many other techniques could be engineered by an artisan skilled in the art, including forming the micro-channel in interposer or in the package as presented in the incorporated by reference art.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. The material used could be silicon or other alternative materials effective for semiconductor devices. Rather, the scope of the invention includes combinations and sub-combinations of the various features described hereinabove as well as modifications and variations which would occur to such skilled persons upon reading the foregoing description. Thus the invention is to be limited only by any appended claims.

We claim:
1. A 3D semiconductor device, the device comprising:
a first level comprising a first single crystal layer and a memory control circuit, said memory control circuit comprising a plurality of first transistors;
a first metal layer overlaying said first single crystal layer;
a second metal layer overlaying said first metal layer;
a third metal layer overlaying said second metal layer;
a plurality of second transistors disposed atop said third metal layer;
a plurality of third transistors disposed atop said plurality of second transistors;
a fourth metal layer disposed atop said plurality of third transistors;
a memory array comprising word-lines,
  wherein said memory array comprises at least four memory mini arrays,
  wherein each of said memory mini arrays comprises at least four rows by four columns of memory cells,
  wherein at least one of said plurality of second transistors comprises a metal gate, and wherein each of said memory cells comprises at least one of said plurality of second transistors or at least one of said plurality of third transistors; and
a connection path from said fourth metal to said third metal,
wherein said connection path comprises a via disposed through said memory array, and
wherein said memory control circuit comprises at least one temperature sensor circuit.

2. The 3D semiconductor device according to claim 1, wherein said memory control circuit is configured to control each of said four memory mini arrays independently.

3. The 3D semiconductor device according to claim 1, wherein at least one of said plurality of second transistors is self-aligned to at least one of said plurality of third transistors, being processed following a same lithography step.

4. The 3D semiconductor device according to claim 1, wherein said memory control circuit comprises at least one power down control circuit.

5. The 3D semiconductor device according to claim 1, wherein said memory control circuit comprises configurations which utilize information from said at least one temperature sensor circuit to adjust at least a portion of memory control operations.

6. The 3D semiconductor device according to claim 1, further comprising:
an upper level disposed atop said fourth metal layer, wherein said upper level comprises a mono-crystalline silicon layer.

7. The 3D semiconductor device according to claim 1, further comprising:
oxide to oxide bond regions and metal to metal bond regions.

8. A 3D semiconductor device, the device comprising:
a first level comprising a first single crystal layer and a memory control circuit, said memory control circuit comprising a plurality of first transistors;
a first metal layer overlaying said first single crystal layer;
a second metal layer overlaying said first metal layer;
a third metal layer overlaying said second metal layer;
a plurality of second transistors disposed atop said third metal layer;
a plurality of third transistors disposed atop said plurality of second transistors;
a fourth metal layer disposed atop said plurality of third transistors;
a memory array comprising word-lines,
wherein said memory array comprises at least four memory mini arrays,
wherein each of said memory mini arrays comprises at least four rows by four columns of memory cells,
wherein at least one of said plurality of second transistors comprises a metal gate, and
wherein each of said memory cells comprises at least one of said plurality of second transistors or at least one of said plurality of third transistors; and
a connection path from said fourth metal to said third metal,
wherein said connection path comprises a via disposed through said memory array, and
wherein said first level comprises a plurality of differential signaling interconnect structures.

9. The 3D semiconductor device according to claim 8, wherein said memory control circuit is configured to control each of said four memory mini arrays independently.

10. The 3D semiconductor device according to claim 8, wherein at least one of said plurality of second transistors is self-aligned to at least one of said plurality of third transistors, being processed following a same lithography step.

11. The 3D semiconductor device according to claim 8, wherein said memory control circuit comprises at least one power down control circuit.

12. The 3D semiconductor device according to claim 8, wherein said memory control circuit comprises at least one temperature sensor circuit, and
wherein said memory control circuit comprises configurations which utilize information from said at least one temperature sensor circuit to adjust at least a portion of memory control operations.

13. The 3D semiconductor device according to claim 8, further comprising:
an upper level disposed atop said fourth metal layer, wherein said upper level comprises a mono-crystalline silicon layer.

14. The 3D semiconductor device according to claim 8, further comprising:
oxide to oxide bond regions and metal to metal bond regions.

15. A 3D semiconductor device, the device comprising:
a first level comprising a first single crystal layer and a memory control circuit, said memory control circuit comprising a plurality of first transistors;
a first metal layer overlaying said first single crystal layer;
a second metal layer overlaying said first metal layer;
a third metal layer overlaying said second metal layer;
a plurality of second transistors disposed atop said third metal layer;
a plurality of third transistors disposed atop said plurality of second transistors;
a fourth metal layer disposed atop said plurality of third transistors;
a memory array comprising word-lines,
wherein said memory array comprises at least four memory mini arrays,
wherein each of said memory mini arrays comprises at least four rows by four columns of memory cells,
wherein at least one of said plurality of second transistors comprises a metal gate, and
wherein each of said memory cells comprises at least one of said plurality of second transistors or at least one of said plurality of third transistors; and
a connection path from said fourth metal to said third metal,
wherein said connection path comprises a via disposed through said memory array, and
wherein said memory control circuit comprises a plurality of differential read circuits.

16. The 3D semiconductor device according to claim 15, wherein said memory control circuit is configured to control each of said four memory mini arrays independently.

17. The 3D semiconductor device according to claim 15, wherein said first level comprises a plurality of differential signaling interconnect structures.

18. The 3D semiconductor device according to claim 15, wherein said memory control circuit comprises at least one power down control circuit.

19. The 3D semiconductor device according to claim 15,
wherein said memory control circuit comprises at least one temperature sensor circuit, and
wherein said memory control circuit comprises configurations which utilize information from said at least one temperature sensor circuit to adjust at least a portion of memory control operations.

20. The 3D semiconductor device according to claim 15, further comprising:
oxide to oxide bond regions and metal to metal bond regions.

* * * * *